United States Patent
Kuroki

(10) Patent No.: US 9,543,546 B2
(45) Date of Patent: Jan. 10, 2017

(54) ORGANIC LIGHT-EMITTING ELEMENT

(71) Applicant: Konica Minolta, Inc., Tokyo (JP)

(72) Inventor: Takaaki Kuroki, Hachioji (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 14/898,645

(22) PCT Filed: Jun. 4, 2014

(86) PCT No.: PCT/JP2014/064832
§ 371 (c)(1),
(2) Date: Dec. 15, 2015

(87) PCT Pub. No.: WO2014/203729
PCT Pub. Date: Dec. 24, 2014

(65) Prior Publication Data
US 2016/0155988 A1    Jun. 2, 2016

(30) Foreign Application Priority Data
Jun. 18, 2013 (JP) ................. 2013-127430

(51) Int. Cl.
H01L 51/52 (2006.01)
H01L 51/00 (2006.01)
H05B 33/28 (2006.01)

(52) U.S. Cl.
CPC ....... *H01L 51/5268* (2013.01); *H01L 51/0097* (2013.01); *H01L 51/5275* (2013.01);
(Continued)

(58) Field of Classification Search
None
See application file for complete search history.

(56) References Cited

U.S. PATENT DOCUMENTS 8,530,916 B2    9/2013 Nakamura et al.
8,754,434 B1*   6/2014 Gollier ............... H01L 51/5268
                                                    257/434
(Continued)

FOREIGN PATENT DOCUMENTS

CN    101790899 A    7/2010
JP    2931211 B2     5/1999
(Continued)

OTHER PUBLICATIONS

Chang, Hong-Wei, Kun-Cheng Tien, Min-Hung Hsu, Yi-Hsiang Huang, Ming-Shiang Lin, Chih-Hung Tsai, Yu-Tang Tsai, and Chung-Chih Wu. "Organic Light-emitting Devices Integrated with Internal Scattering Layers for Enhancing Optical Out-coupling." J. Soc. Inf. Display Journal of the Society for Information Display 19.2 (2011): 196.*

(Continued)

*Primary Examiner* — Joseph Schoenholtz
(74) *Attorney, Agent, or Firm* — Lucas & Mercanti, LLP

(57) ABSTRACT

The purpose of the present invention is to provide an organic light-emitting element that comprises an internal light extraction layer on a flexible transparent substrate, that has high luminous efficiency by means of light extraction, and that prevents the breakage and partial or complete separation of electrodes when the organic light-emitting element is repeatedly bent. The organic light-emitting element according to the present invention has an internal light extraction layer, a transparent electrode, and an organic light-emitting layer in this order on the flexible transparent substrate, wherein the value of the ratio (D) represented by formula 1 between the elastic modulus ($EM_I$) of the surface of the internal light extraction layer and the elastic modulus ($EM_S$) of the surface of the transparent electrode side of the transparent substrate is within the range of 100±30%.

$D$ (%)=($EM_I$/$EM_S$)×100(%).    Formula 1

11 Claims, 7 Drawing Sheets

(52) U.S. Cl.
CPC ...... *H01L 2251/5338* (2013.01); *H05B 33/28* (2013.01); *Y02E 10/549* (2013.01)

(56) References Cited

U.S. PATENT DOCUMENTS

| | | | | |
|---|---|---|---|---|
| 2014/0264317 | A1* | 9/2014 | Uezawa | G02B 5/021 257/40 |
| 2016/0028032 | A1* | 1/2016 | Okada | H01L 51/0097 257/40 |

FOREIGN PATENT DOCUMENTS

| | | | |
|---|---|---|---|
| JP | 2003168556 | A | 6/2003 |
| JP | 2004020746 | A | 1/2004 |
| JP | 2004127942 | A | 4/2004 |
| JP | 2004335571 | A | 11/2004 |
| JP | 2005043749 | A | 2/2005 |
| JP | 2006255918 | A | 9/2006 |
| JP | 2007035313 | A | 2/2007 |
| JP | 2007035550 | A | 2/2007 |
| JP | 2011028940 | A | 2/2011 |
| WO | 2012014653 | A1 | 2/2012 |

OTHER PUBLICATIONS

JASCO M-550 Specifications downloaded from URL <http://www.jascoinc.com/material-science/ellipsometer> on Jun. 27, 2016.*

Pschenitzka, F, "Light Extraction Technologies in Organic Light Emitting Devices for Lighting Applications" downloaded from URL<http://apps1.eere.energy.gov/buildings/publications/pdfs/ssl/pschenitzka_technologies_2012rdworkshop.pdf> on Jun. 27, 2016.*

Chur-Hyun Shin, Eul Yong Shin, Min-Hoi Kim, Jae-Hyun Lee, and Yoonseuk Choi, "Nanoparticle scattering layer for improving light extraction efficiency of organic light emitting diodes," Opt. Express 23, A133-A139 (2015).*

Materials Data Book, 2003 Edition, Cambridge University Engineering Department downloaded from URL<http://www-mdp.eng.cam.ac.uk/web/library/enginfo/cueddatabooks/materials.pdf> on Jun. 27, 2016.*

Riedel, Daniel, Thomas Wehlus, Thilo C.g. Reusch, and Christoph J. Brabec. "Polymer-based Scattering Layers for Internal Light Extraction from Organic Light Emitting Diodes." Organic Electronics 32 (2016): 27-33.*

International Search Report; International Application No. PCT/JP2014/064832; International filing date: Jun. 4, 2014; Applicant: Konica Minolta, Inc.; total of 3 pages; English Translation of International Search Report; total of 4 pages; Grand total of 7 pages.

International Search Report dated Sep. 16, 2014 for Application No. PCT/JP2014/064832 and English translation.

Office Action dated Jul. 19, 2016 from corresponding Chinese Application; Application No. 201480034453.4; Applicant: Konica Minolta, Inc.; English translation of Office Action; Total of 14 pages.

* cited by examiner

| | |
|---|---|
| Average surface roughness(Ra) | :1.398E+00 nm |
| Maximum difference in height(P-V) | :1.669E+01 nm |
| Maximum mountain(Rp) | :7.200E+00 nm |
| Maximum valley(Rv) | :-9.494E+00 nm |
| Square average surface roughness(RMS) | :1.788E+00 nm |
| n point average roughness(Rz) | :1.023E+01 nm (10 Points) |
| surface area(S) | :9.972E+07 nm2 |
| Surface area ratio(S ratio) | :1.001E+00 |

ORGANIC LIGHT-EMITTING ELEMENT

CROSS REFERENCE TO RELATED APPLICATION

This Application is a 371 of PCT/JP2014/064832 filed on Jun. 4, 2014, which, in turn, claimed the priority of Japanese Patent Application No. JP2013-127430 filed on Jun. 18, 2013, both applications are incorporated herein by reference.

TECHNICAL FIELD

The present invention relates to an organic light-emitting element, in particular, it relates to a flexible organic light-emitting element provided with a flexible transparent substrate and an internal light extracting layer.

BACKGROUND

At the present time, an organic electroluminescent element is attracting attentions as a thin light-emitting material.

An organic light-emitting element makes use of electroluminescence (EL) of an organic material (hereafter, it is also called as "an organic EL element"). It is a fully solid element which is capable of emitting light with a low voltage such as about several V to several ten V. It has many excellent features of high luminance, high light-emission efficiency, thin and small weight. Accordingly, it has been attracted attentions in recent years used for: various display back-lights; a display board such as signboard and emergency lamp; and a surface light-emitting body for illumination source.

The organic light-emitting element has a structure in which a light-emitting layer containing an organic material is located between a pair of electrodes, and emitted light in the light-emitting layer is extracted to the outside through the electrode. Therefore, at least one of the pair of electrode is composed of a transparent electrode, and the emitted light is taken out from the transparent electrode side.

Further, an organic light-emitting element is characterized in doing a thin film surface light-emitting, which is different from the conventional light-emitting body. In order to make use of this feature, it is required to form an element on a flexible transparent substrate. In order to reply such request, it is required to realize an organic light-emitting element employing a widely used resin substrate such as polyethylene terephthalate (PET).

However, when a resin substrate such as polyethylene terephthalate (PET) is simply used for producing an organic light-emitting element, it was revealed that there may occur problem of the electrode which is made of indium tin oxide ($SnO_2$-$Inc_2O_3$: ITO), for example. The electrode may be cracked or be floated or be peeled off. In particular, this problem will occur when an internal light extracting layer described later is provided between a transparent substrate and an electrode.

The organic light-emitting element can generate light with high luminance at low electric power, and it is excellent in the points of visibility, response speed, lifetime and electric power consumption. Unfortunately, the use efficiency of the light generated in the organic light-emitting element is at most 20%, which indicates significant loss of the luminescent light inside the element. It is preferable to form an internal light extracting layer for the purpose of increasing light emission efficiency.

FIG. 1 is a schematic sectional view illustrating a constitution of a conventional organic light-emitting element and a propagation way of light.

An organic light-emitting element 100 includes a metal electrode 101, an organic light-emitting layer 102 having a refractive index of about 1.8, a transparent electrode 103 having a refractive index of about 1.8, and a transparent substrate 104 having a refractive index of about 1.6, which are sequentially laminated from a lower layer in the drawing. In the drawing, the arrows 110a to 110e indicate characteristic light components of the light generated in the organic light-emitting layer 102.

The light component 110a is perpendicular to the organic light-emitting layer 102 which is a light-emitting surface, and it is extracted through the transparent substrate 104 from a light extraction side (to the air).

The light component 110b is an incident light on the interface between the transparent substrate 104 and the air at the critical angle or less, and inflects at the interface between the transparent substrate 104 and the air to be extracted from a light extraction side. The light component 110c is an incident light on the interface between the transparent substrate 104 and the air at an angle larger than the critical angle.

The light component 110c is totally reflected at the interface between the transparent substrate 104 and the air, and cannot be extracted from the light-emitting side. This loss due to total reflection of the light is referred to as "substrate loss," which is typically about 20%.

The light component 110d is an incident light on the interface between the transparent electrode 103 and the transparent substrate 104 at an angle larger than the critical angle and satisfies the resonant condition. Such a light component 110d is totally reflected at the interface between the transparent electrode 103 and the transparent substrate 104 to generate a waveguide mode, in which the light component is confined within the organic light-emitting layer 102 and the transparent electrode 103. This loss due to the waveguide mode is referred to as "waveguide loss," which is typically about 20 to 25%.

The light component 110e is an incident light on the metal electrode 101, and reacts with free electrons in the metal electrode 101 to generate a plasmon mode, one of the waveguide modes, in which the light component is confined near the surface of the metal electrode 101. This loss due to the plasmon mode is referred to as "plasmon loss," which is typically about 30 to 40%.

As described above, the conventional organic light-emitting element 100 has substrate loss, waveguide loss, and plasmon loss; hence, light-emitting elements are faced with the task of extracting a larger amount of emitted light by reduced extraction loss.

To cope with this problem, Patent Document No. 1 discloses an organic electroluminescent (EL) device provided with a light scattering unit composed of a lens sheet and disposed adjacent to a light extraction surface side.

Patent Document No. 2 discloses a substrate for a light-emitting device disposed on the light-emitting surface of a light-emitting device, the substrate including an irregular layer having a high refractive index of 1.6 or more and an average surface roughness of 10 nm or more on at least one of surfaces of the substrate and one or more substrate layers having a refractive index of 1.55 or more, and a light-emitting device.

However, although these technologies are preferable embodiments from the viewpoint of light extraction, these are technologies of light extraction for a glass substrate having no flexibility. These technologies have not realized using a substrate having flexibility.

Further, Patent Document 3 discloses a light extracting layer composed of a single or a plurality of laminated layers and used for a light-emitting element. At least one of the constituting layers of the light extracting layer is a layer having a light scattering function, and it is characterized in that a surface hardness of the layer is 0.05 to 20 GPa measured with a nano-indentation method.

Patent Document 3 does not disclose the following object. By stipulating the surface hardness measured with a nano-indentation method, a strain in the layers or in the interfaces produced during a laminating process of an organic light-emitting element may be removed, and a minute breakage or peeling off of the transparent electrode may be decreased to result in improvement of dark spot resistivity and lifetime of an element. Patent Document 3 does not refer to a problem such as breakage or peeling off of the electrode cause by bending when an organic light-emitting element is produced using a flexible transparent substrate.

Therefore, it is expected an achievement of an organic light-emitting element provided with an internal light extraction layer on a widely used flexible transparent substrate. The organic light-emitting element exhibits high light-emitting efficiency by light extraction, and it does not produce breakage of the electrode, or float or peeling off of the electrode when it is repeatedly bent.

PRIOR ART DOCUMENTS

Patent Documents

Patent Document 1: Japanese Patent No. 2931211
Patent Document 2: Japanese Patent Application Publication (JP-A) No. 2004-20746
Patent Document 3: JP-A No. 2007-35313

SUMMARY OF THE INVENTION

Problems to be Solved by the Invention

The present invention has been made in view of the above-described problem and situation. An object of the present invention is to provide an organic light-emitting element containing a flexible transparent substrate having thereon an internal light extracting layer, with exhibiting high light-emitting efficiency by light extraction and preventing breakage, partial or complete separation (floating or peeling off) of the electrode when the organic light-emitting element is repeatedly bent.

Means to Solve the Problems

The present inventors have investigated the reasons of the above-described problems to solve the problems, and found out the following light-emitting element to result in achieving the present invention. The organic light-emitting element contains a flexible transparent substrate having thereon an internal light extracting layer, a transparent electrode, and an organic light-emitting layer in that order. A ratio of an elastic modulus of a surface of the internal light extracting layer to an elastic modulus of a surface of the transparent electrode side of the flexible transparent substrate is in the specific range.

This organic light-emitting element exhibits high light-emitting efficiency by light extraction, and it does not produce breakage of the electrode, or float or peeling off of the electrode when it is repeatedly bent.

Namely, the above-described problems relating to the present invention are solved by the following means.

1. An organic light-emitting element comprising a flexible transparent substrate having thereon an internal light extracting layer, a transparent electrode, and an organic light-emitting layer in that order, wherein a ratio D of an elastic modulus ($EM_I$) of a surface of the internal light extracting layer to an elastic modulus ($EM_s$) of a surface of the transparent electrode side of the flexible transparent substrate is in the range of 100±30%, the ratio D being defined by Scheme 1.

$$D\ (\%)=(EM_I/EM_s)\times 100(\%). \quad\quad \text{Scheme 1:}$$

2. The organic light-emitting element of the item 1,
wherein the flexible transparent substrate contains a film substrate and at least one gas barrier layer laminated in that order; and
the internal light extracting layer contains a light scattering layer and a smoothing layer.

3. The organic light-emitting element of the items 1 or 2, wherein the light scattering layer contains light scattering particles; an average particle size of the light scattering particles is in the range of 0.2 to 1 μm; and the light scattering layer has a refractive index in the range of 1.7 to 3.0 when measured at a wavelength of 550 nm.

4. The organic light-emitting element of any one of the items 1 to 3, wherein the internal light extracting layer has: a refractive index in the range of 1.7 to 2.5 when measured at a wavelength of 550 nm; an average transmittance of 50% or more in the wavelength range of 450 nm to 700 nm; and a haze value of 30% or more.

Effects of the Invention

By the above-described means of the present invention, a flexible organic light-emitting element can be provided. It contains a flexible transparent substrate having thereon an internal light extracting layer, with exhibiting high light-emitting efficiency by light extraction and preventing breakage, partial or complete separation of the electrode when the organic light-emitting element is repeatedly bent.

A formation mechanism or an action mechanism of the effects of the present invention is not clearly identified, but it is supposed as follows.

The present invention is done by adjusting an elastic modulus of a surface of an internal light extracting layer and an elastic modulus of a surface of a transparent electrode side of the flexible transparent substrate to have a ratio in a specific range of relationship and by combining these two. The present invention can extremely improve the resistance of breakage of the electrode, or float of peeling off of the electrode when the organic light-emitting element having a flexible transparent substrate and an internal light extracting layer is repeatedly bent. By this technology, it can provide a technology which realizes a flexible organic light-emitting element of high efficiency required in the market.

Generally, when a force is applied to a flexible substrate to make a curved surface, a stress is not given to the center portion of the substrate. The stress becomes larger in accordance with the distance in the thickness direction of the center portion. The extension force is given on the convex surface, and the compression force is given on the concave surface. In the present invention having an internal light extraction layer on a flexible substrate, an inner stress is given to the surface of the substrate, and at the same time, about the same stress is given to the internal light extraction layer.

At this moment, each layer may contain a different material, and the physical property of each layer is usually different. Even when the physical property of the surface of the substrate is different from that of the internal light extracting layer, it does not directly result in producing breakage or float. However, with respect to an internal light extracting layer composed of a light scattering layer and a smoothing layer, which is a preferable embodiment of the present invention, it is preferable that the surface of the substrate and the internal light extracting layer have a similar elastic modulus. Further, it is preferable that the adhesion strength of the two layers is high.

In addition, an organic light-emitting element is extremely sensitive to oxygen and water. An organic light-emitting element containing a generally known flexible substrate prepared thereon an internal light extraction layer will not be sufficient for practical use. For that reason, each company develops a variety of gas barrier technologies. A gas barrier technology provided on a flexible substrate has been approaching to a practical level.

These gas barrier technologies require very compact film since the targeted gas molecules to be prevented are very small. The gas barrier film has generally a high elastic modulus value near to that of metal oxide, specifically of glass. In relating to this gas barrier layer of high elastic modulus, the internal light extracting layer formed on the gas barrier layer is also required to have a high elastic modulus. In order to achieve this high elastic modulus body, the following methods are found to be preferable through the extensive investigation to relieve the stress: (1) one preferable method is to make both a light scattering layer and a smoothing layer to have a high elastic modulus; (2) particularly preferable method is to form a smoothing layer to have a high elastic modulus; and (3) another preferable method is to make a light scattering layer to have a ½ of the elastic modulus of a smoothing layer.

On the other hand, when a flexible organic light-emitting element is repeatedly bent, it is assumed that breakage, float or peeling off of the electrode will be produced by being applied the stress to the electrode. It was revealed that this problem will noticeably occur in an organic light-emitting element having a flexible internal light extracting layer. The present inventors investigated this phenomenon in detail. As a result, it was found the following. When an elastic modulus of the surface of the internal light extracting layer is smaller than an elastic modulus of a surface of the flexible transparent substrate having a gas barrier layer, or inversely, when it is larger, due to the difference of the elastic modulus of the two surfaces, there is produced a strain at an interface. The stress produced there will affect the thin film electrode formed on the internal light extraction layer to result in producing breakage, float or peeling off of the electrode.

As a consequence, by adjusting an elastic modulus of a surface of the flexible transparent substrate having a gas barrier layer and an elastic modulus of the surface of the internal light extracting layer in a specific range of relationship, it can decrease the stress caused by the strain. Thus, it can extremely improve the resistance of breakage, float or peeling off of the electrode when the organic light-emitting element is repeatedly bent.

EMBODIMENTS TO CARRY OUT THE INVENTION

Figure 1:
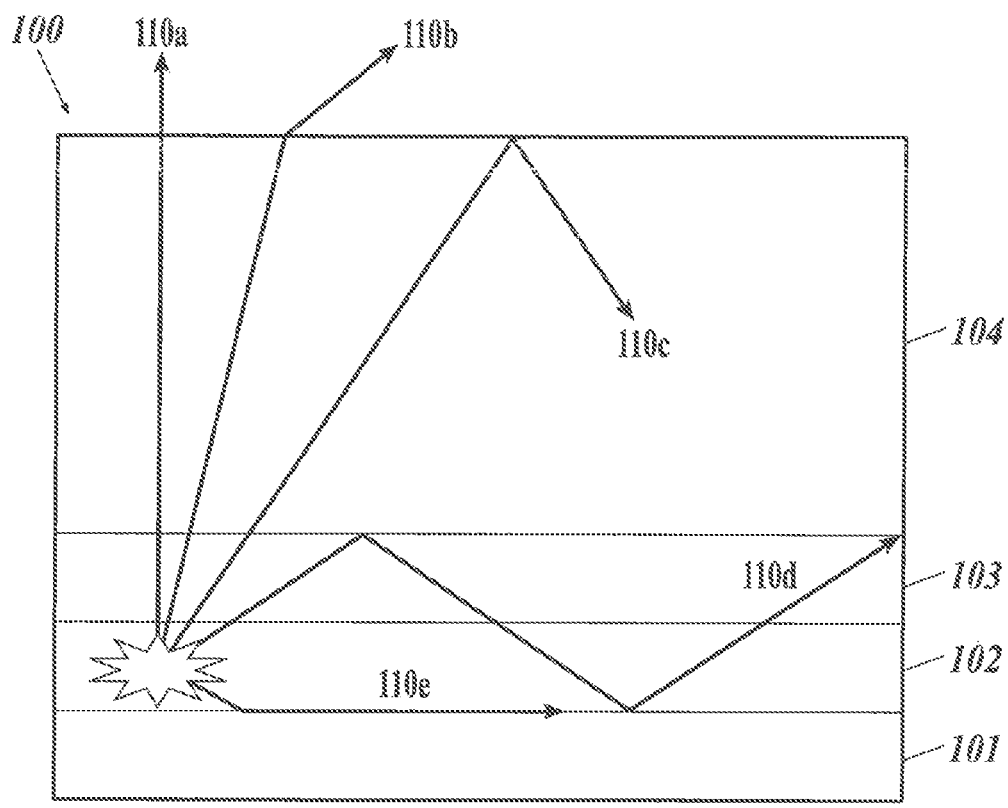
FIG. 1 is a sectional view schematically illustrating a constitution of a conventional organic light-emitting element and a propagation way of light.

An organic light-emitting element of the present invention is an organic light-emitting element comprising a flexible transparent substrate having thereon an internal light extracting layer, a transparent electrode, and an organic light-emitting layer in that order, wherein a ratio D of an elastic modulus ($EM_f$) of a surface of the internal light extracting layer to an elastic modulus ($EM_s$) of a surface of the transparent electrode side of the flexible transparent substrate is in the range of 100±30%, the ratio D being defined by the aforesaid Scheme 1. This feature is a common technical feature of the invention according to claim 1 to claim 4.

As one of embodiments of the present invention, from the viewpoint of obtaining the effects of the present invention, it is preferable that the flexible transparent substrate contains a film substrate and a gas barrier layer in that order; and the internal light extracting layer contains a light scattering layer and a smoothing layer for the purpose of suitably controlling the elastic modulus. In particular, when the internal light extracting layer is composed of the above-described two layers, the elasticity may be increased by the smoothing layer, and the stress may be removed by the light scattering layer. As a result, it can decrease the stress caused by the strain. Thus, it can extremely improve the resistance of breakage, float or peeling off of the electrode when the organic light-emitting element is repeatedly bent. This is a preferable embodiment.

Further, when the light scattering layer contains light scattering particles; an average particle size of the light scattering particles is in the range of 0.2 to 1 μm; and the light scattering layer has a refractive index in the range of 1.7 to 3.0 measured at a wavelength of 550 nm, the organic light-emitting element is preferable for achieving high light extraction efficiency and increasing light-emitting efficiency of the organic light-emitting element.

Further, when the internal light extracting layer has: a refractive index in the range of 1.7 to 2.5 measured at a wavelength of 550 nm; an average transmittance of 50% or more in the wavelength range of 450 nm to 700 nm; and a haze value of 30% or more, the organic light-emitting element is preferable for achieving high light extraction efficiency and increasing light-emitting efficiency of the organic light-emitting element.

The present invention and the constitution elements thereof, as well as configurations and embodiments, will be detailed in the following. In the present description, when two figures are used to indicate a range of value before and after "to", these figures are included in the range as a lowest limit value and an upper limit value.

<<General Outline of Organic Light-Emitting Element of the Present Invention>>

An organic light-emitting element of the present invention contains a flexible transparent substrate having thereon an internal light extracting layer, a transparent electrode, and an organic light-emitting layer in that order, wherein a ratio D of an elastic modulus ($EM_I$) of a surface of the internal light extracting layer to an elastic modulus ($EM_s$) of a surface of the transparent electrode side of the flexible transparent substrate is in the range of 100±30%, the ratio D being defined by Scheme 1.

$$D\ (\%) = (EM_I/EM_s) \times 100(\%). \qquad \text{Scheme 1:}$$

An elastic modulus of a surface of a flexible transparent substrate and an elastic modulus of a surface of an internal light extracting layer can be measured with a nano-indentation method.

The nano-indentation method is a method of measuring an elastic modulus (reduced modulus) and a hardness simultaneously from a load-displacement curve diagram obtained by loading an indenter to a sample with a ultra-micro weight, followed by removing the weight to obtain the load-displacement curve diagram.

<Measuring Principle of Nano-Indentation Method>

The nano-indentation method is a method enabling to measure an indentation hardness of a nano-level by using an atomic force microscope (AFM) added with a module for an indentation hardness measurement (composed of a transducer and an indentation tip). While applying a maximum load of 20 μN or less, a diamond indenter having an edge radius of 0.1 to 1 μm is applied to the sample to be measured, and an indentation depth is measured with a precision of a nanometer. A load-displacement curve diagram is obtained by this measurement, and a quantitative evaluation can be made for the properties relating to elastoplastic deformation of the material. When the sample is a thin film, it is required to push the indenter into a depth of ⅒ to ⅓ of the total thickness in order to measure with avoiding the effect of the substrate. This nano-indentation method enables to measure the sample having the displacement resolution of high precision of 0.01 nm by using a head assembly of ultra-micro load of, for example, a maximum load of 20 μN, and a load resolution of 1 nN.

Figure 2:
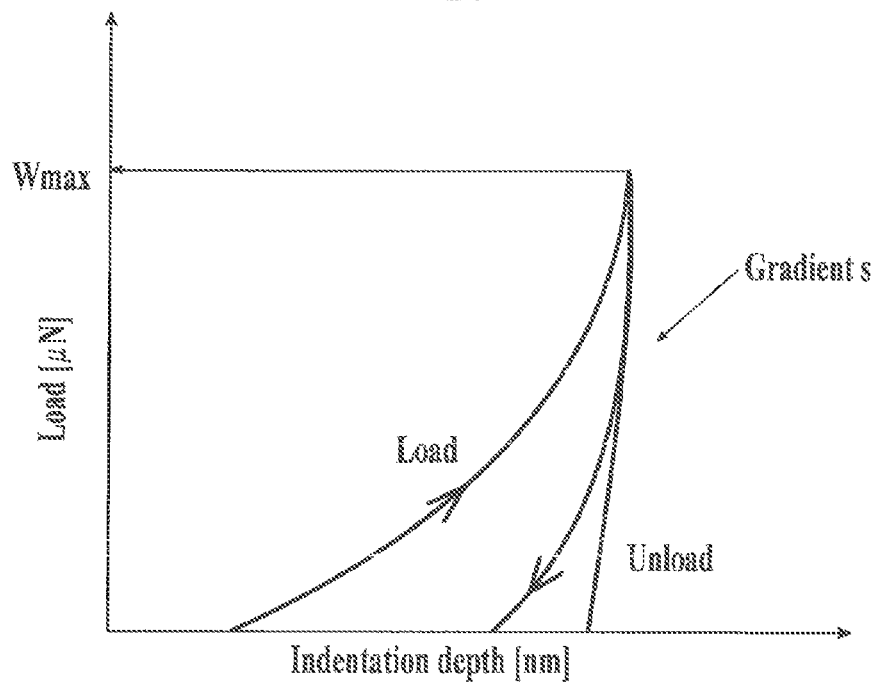
FIG. 2 is a drawing illustrating an example of a load-displacement curve obtained by a typical nano-indentation method.

FIG. 2 is a drawing illustrating an example of a load-displacement curve obtained by a typical nano-indentation method. Here, a gradient S in FIG. 2 indicates a gradient of an unloading curve (=dP/dh). Specifically, it is obtained using a gradient of an unloading curve at a maximum load $P_{max}$ by focusing on the initial stage of unloading which is considered to be a simple elasticity recovering.

Figure 3:
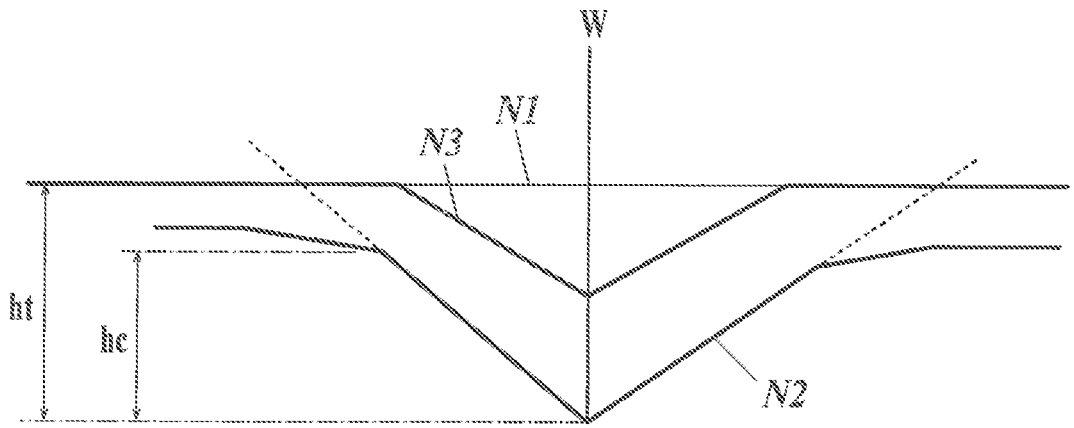
FIG. 3 is a drawing illustrating a contacting state of a diamond indenter with a sample in a measurement by a nano-indentation method.

FIG. 3 is a drawing illustrating a contacting state of a diamond indenter with a sample in a measurement by a nano-indentation method. In FIG. 3, N1 indicates an initial surface of a sample which is not contacted with the indenter, N2 indicates a profile of a sample surface which is applied a load via the indenter, and N3 indicates a profile of a sample surface after removal of the the indenter.

For example, a hardness H is usually obtained from the scheme of H=W/A (W: load; and A: contact area). However, in the nano-indentation method, since the load is very small, the value of A cannot be directly obtained by using an impression. In the present invention, specifically, the following method is employed.

As illustrate in FIG. 3, hc satisfies the scheme of hc=ht−∈·W/S (∈ is an inherent constant of an indenter; and S is a gradient described in FIG. 2). Here, ∈ is an inherent constant decided by the geometrical shape of the indenter. For a cone or a Berkovich indenter, and a triangular pyramid such as a cube corner indenter, ∈=0.726 is used, for a spherical indenter, ∈=0.75 is used, and for a cylinder indenter, ∈=1 is used.

In the case of the triangular pyramid, when the angle formed with a center axis of the triangular pyramid and the side face is indicated as α, "A" is represented by the following scheme from the geometrical shape.

$$\text{"}A\text{"} = C_1 hc^2, C_1 = 3 \times 3^{1/2} \tan^2 \alpha$$

For a Berkovich indenter, since α=65.27°, $C_1$ becomes 24.56, and A=24.56 $hc^2$. Further, for a cube corner indenter, α=45°, $C_1$ becomes 5.196, and A=5.196 $hc^2$. Therefore, when ht, W, and S are known, H can be obtained.

Moreover, an elastic modulus Er can be calculated from the scheme of Er=S·$\pi^{1/2}$/2/$A^{1/2}$. It is presumed that when Er is large, plastic deformation is easily done; and when Er is small, elastic deformation is easily done.

In the present invention, the elastic modulus and the hardness are measured using a nano-indenter made by MTS System Co. (Nano Indenter TMXP/DCM). The employed indenter is a cube corner tip (90°).

A maximum sample size is 20 mmΦ×10 mm. The sample is fixed on a sample table with an adhesive or others. Since the loading range of the present apparatus is very small such as about 10 mN, it is suitable to measure the elastic modulus and the hardness of the thin film in the range of about several 10 nm to 1 μm.

[Specific Method of Nano-Indentation Measurement]

The apparatus, method, and atmospheric conditions are as follows.

As a specific measurement method, the following method was used by using the following apparatus.

Measurement apparatus: TriboScope (made by HYSITRON Co.)

Used indenter: Cube Corner Tip

Maximum load: 20 μN, or 30 μN (1) The Measurement of the Sample Thickness

On a substrate was uniformly applied a sample, followed by dried (and cured) to produce a piece of sample. A portion of the sample was removed by a spatula and the substrate surface was exposed.

By using a stylus type roughness measuring apparatus Dektak XT (made by Bruker Co.), the coating thickness was determined by the difference between the coated surface and the exposed substrate surface. The measurement was done three times (N=3). The average value was obtained.

(2) Setting a Maximum Load

A maximum load was selected (20 to 30 μN) to indent the indenter into 10% of the thickness obtained by using Dektak.

(3) Adjustment of Sample

The sample for nano-indentation measurement was placed under an environment of a temperature of 23° C. and a humidity of 50% RH for 2 hours or more. Then, measurement was done.

(4) Measurement

By using the aforesaid TriboScope (made by HYSITRON Co.), the nano-indentation measurement was carried out.

The measurement was done five times (N=5). The maximum value and the minimum value were deleted. An average value of three data (N=3) was obtained.

(5) Data Processing

From the load-displacement curve of each sample obtained by the above-described measurement, data processing was performed to obtain a hardness (GPa) and an elastic modulus (GPa). It was used a cube corner tip having an edge angle of 90° as an indenter. The calibration was done by using a melt quartz standard sample beforehand. The indenter was put into each sample from zero to a maximum load of 20 μN for 5 seconds, then, the load was unloaded to zero by taking time of 5 seconds. From the obtained load-displacement curve, the hardness (H) can be obtained by Scheme (1), and the elastic modulus (Er) can be obtained by Scheme (2).

$$H = \frac{P_{max}}{A} \quad (1)$$

$$Er = \frac{1}{\beta} \frac{\sqrt{\pi}}{2} \frac{S}{\sqrt{A}} \quad (2)$$

$P_{max}$: Maximum load
A: Contact area
β: Inherent constant of indenter
S: Initial gradient of unload curve

[Elastic Modulus and Hardness of a Surface of a Transparent Substrate Formed with a Gas Barrier Layer and a Surface of an Internal Light Extracting Layer]

By using the measuring method as describe above, a surface elastic modulus and hardness of a surface of a transparent substrate (a side of forming an internal light extracting layer) and an internal light extracting layer after dried and cured were respectively measured.

The transparent substrate surface and the internal light extracting layer are basically adjacent layers with each other. However, it may be placed an adhesive layer/an optical coefficient (refractive index) adjusting layer/an absorption decreasing layer between these layers according to the purpose.

As one of embodiments of the present invention, it is preferable that the flexible transparent substrate contains a film substrate and at least one gas barrier layer in that order; and the internal light extracting layer has a laminated constitution composed of a light scattering layer and a smoothing layer.

Therefore, the measurement of the surface elastic modulus of the flexible transparent substrate and the internal light extracting layer of the present invention is done on the surface side of the gas barrier layer when the film substrate is formed with a gas barrier layer. In addition, when the internal light extracting layer is composed of the light scattering layer and the smoothing layer, the measurement is done on the surface side of the smoothing layer The flexible transparent substrate according to the present invention is preferably a gas barrier film composed of a film substrate and at least one gas barrier film laminated in this order, having properties of highly preventing oxygen and water and enabling to use for an organic light-emitting element.

A bas barrier layer or a gas barrier film of the present invention is one having a water vapor permeability of $1 \times 10^{-3}$ g/(m²·24 h) or less (at 25±0.5° C., relative humidity: 90±2% RH) determined by the method based on JIS K 7129-1992. More preferably, it is a gas barrier layer or a gas barrier film having an oxygen permeability of $1 \times 10^{-3}$ ml/(m²·24 h·atm) or less determined by the method based on JIS K 7126-1987, and a water vapor permeability of $1 \times 10^{-5}$ g/(m²·24 h) or less.

Here, "flexibility" is a property of the base material which will not produce breakages during the process of winding only the gas barrier film around a roll of 50 mm diameter (Φ) and rewinding with a predetermined tension. A base material which can be wound around a roll of 30 mm diameter (Φ) is more preferable, and a roll of 10 mm diameter (Φ) is still more preferable.

This gas barrier film preferably has a surface elastic modulus of 20 GPa or more, more preferably 25 GPa or more, and still more preferably 30 GPa.

On the other hand, the internal light extracting layer is preferably composed of the light scattering layer and the smoothing layer. The surface elastic modulus of the internal light extracting layer is preferably 15 GPa or more, more preferably 20 GPa or more, still more preferably 25 GPa or more, and further more preferably 30 GPa or more.

A ratio D of an elastic modulus ($EM_f$) of a surface of the internal light extracting layer to an elastic modulus ($EM_s$) of a surface of the organic light-emitting layer side of the flexible transparent substrate is required to be in the range of 100±30%, the ratio D being defined by Scheme 1, for obtaining the effect of the present invention. Preferably, it is in the range of 100±25%. Due to the fact that the two elastic moduli are within these range, the bending behavior of the two layers are similar, and it is prevented breakage, float and peeling off of the electrode, and further, it can largely improve production of lack, ablation, crack, and wrinkle of each constitution layer in the bending test of a sample in which an internal light extracting layer is formed on a transparent substrate provided with a gas barrier layer.

The surface elastic modulus of the sole smoothing layer is preferably 20 GPa or more, more preferably 25 GPa or more, and still more preferably 30 GPa or more. It is preferable that the light scattering layer has a smaller elastic modulus than the smoothing layer. The elastic modulus of the light scattering layer is preferably 0.5 to 25 PGa, more preferably 1 to 20 GPa, still more preferably 1.5 to 15 GPa, and particularly preferably 1.5 to 10 GPa. By making to have these values, the light scattering layer will act as a stress relieving layer, and it can prevent breakage, float and peeling off of the electrode. At the same time, it is advantageous from the viewpoint of production of lack, ablation, crack, and wrinkle of each constitution layer.

In addition, the surface hardness of the transparent substrate and the internal light extracting layer is not a requirement of the present invention. The value of the surface hardness is not specifically limited. In the present invention, the design and the control of the elastic modulus of the constitution layers of the organic light-emitting element are important.

As long as achieving the above-described physical properties, the materials for each layer are not specifically limited. It is preferable that the smoothing layer, which constitutes the transparent substrate and the internal light extraction layer, includes nanoparticles having a size of less than 50 nm and a binder containing inorganic polymer, in particular, a resin having a siloxane structure. Similarly, it is preferable that the gas barrier layer includes a binder containing inorganic polymer. The use of the similar constituting material for the gas barrier layer and for the internal light extraction layer is favorable from the viewpoint of adhesion of the two layers. A high adhesion strength of the two layer is naturally preferable along with having the physical properties as described above.

In the following, each constituting element of an organic light-emitting element of the present invention will be described in detail.

<Organic Light-Emitting Element 10>

Figure 4:
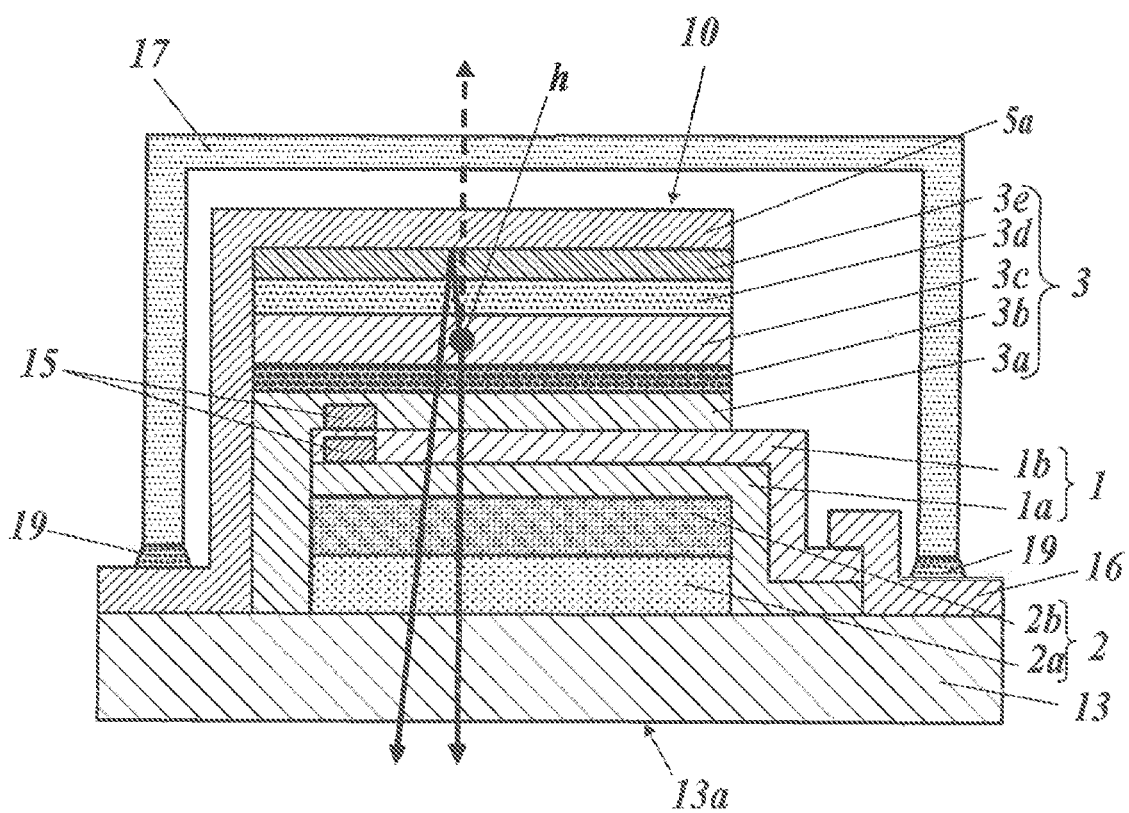
FIG. 4 is a sectional view illustrating a schematic constitution of an organic light-emitting element.

As illustrated in FIG. 4, the organic light-emitting element 10 according to the present invention is disposed on a transparent substrate 13. The organic light-emitting element 10 includes a transparent substrate 13, an internal light extracting layer 2, a transparent metal electrode 1, an organic light-emitting layer 3 composed of an organic material, and an opposite electrode 5a, disposed in this order. An extraction electrode 16 is provided at one end of the transparent metal electrode 1 (electrode layer 1b). The transparent metal electrode 1 is electrically connected to an external power supply (not illustrated in the figure) through the extraction electrode 16. The organic light-emitting element 10 is configured such that generated light (emitted light h) is extracted at least from the transparent substrate 13.

The organic light-emitting element 10 may have any layer structure, for example, a typical layer structure. Throughout the specification, the transparent metal electrode 1 functions as an anode and the opposite electrode 5a functions as a cathode. In this case, an exemplary configuration of the organic light-emitting layer 3 includes a hole injection layer 3a/a hole transport layer 3b/a light-emitting layer 3c/an electron transport layer 3d/and an electron injection layer 3e, sequentially disposed on the transparent metal electrode 1 as an anode. It is required that the organic light-emitting layer 3 have at least the light-emitting layer 3c composed of at least an organic material among these layers. The hole injection layer 3a and the hole transport layer 3b may be disposed as a hole transport-injecting layer. The electron transport layer 3d and the electron injection layer 3e may be disposed as an electron transport-injecting layer. In the organic light-emitting layer 3, for example, the electron injection layer 3e may be composed of an inorganic material.

The organic light-emitting layer 3 may include a hole blocking layer and an electron blocking layer disposed in required places if necessary. The light-emitting layer 3c may include luminous sublayers of different colors generating luminescent lights in the corresponding wavelength regions. These luminous sublayers of different colors and a non-luminous intermediate sublayer may be laminated with the non-luminous intermediate sublayer interposed between the luminous sublayers. The intermediate sublayer may function as a hole blocking layer or an electron blocking layer. The opposite electrode or the cathode 5a may have a laminate structure if necessary. In such a laminate configuration, only the organic light-emitting layer 3 interposed between the transparent metal electrode 1 and the opposite electrode 5a corresponds to the light emission region of the organic light-emitting element 10.

In the layer configuration as described above, an auxiliary electrode 15 may be disposed on the electrode layer 1b of the transparent metal electrode 1 to reduce the resistance of the transparent metal electrode 1.

The organic light-emitting element 10 having such a configuration is sealed with a sealing material 17 described later, which is disposed over the transparent substrate 13 to prevent degradation of the organic light-emitting layer 3 composed of an organic material, etc. The sealing material 17 is fixed to the transparent substrate 13 with an adhesive 19. The terminals of the transparent metal electrode 1 (extraction electrode 16) and the opposite electrode 5a are kept insulated on the transparent substrate 13 by the interposed organic light-emitting layer 3, and are exposed from the sealing material 17.

The main layers which form the organic light-emitting element 10 and the methods of manufacturing these layers will now be described.

(1) Transparent Substrate

An elastic modulus of a surface of a transparent substrate of the present invention is preferably 20 GPa or more, more preferably 25 GPa or more, and still more preferably 30 GPa or more, in order to exhibit preferable properties such a strength or flexibility used for a substrate. It is preferable to be in the range of 20 to 50 GPa.

The transparent substrate used in the present invention may be any known glass substrate or film substrate without specific limitation. The structure composed of a light scattering layer and a smoothing layer according to the present invention should act irrespective of the type of the substrate. A preferred transparent substrate used in the present invention preferably has gas barrier characteristics such as resistance to moisture and resistance to gas permeability required for the organic light-emitting element. Preferably, a film substrate includes a gas barrier layer for enhancing the barrier performance.

In that case, an elastic modulus of the surface is an elastic modulus of a gas barrier film surface which is formed a gas barrier layer.

Controlling the elastic modulus of the transparent substrate of the present invention within the above-described range may be done by selecting the kind of materials of the transparent resin substrate and the materials for forming the gas barrier layer.

The "transparent substrate" according to the present invention refers to a substrate having a transmittance of 70% or more. The transmittance is preferably 80% or more, more preferably 90% or more, particularly preferably 95% or more. The transmittance as described here can be measured with a method of "Plastic: Measurement way of total light transmittance and total light reflectance" defined in JIS K 7375: 2008.

The "transparent substrate" of the present invention has flexibility. Examples of the transparent substrates that can be wound around such a roll include known substrates, specifically include resin films composed of acrylic acid esters, methacrylic acid esters, poly(ethylene terephthalate) (PET), poly(butylene terephthalate), poly(ethylene naphthalate) (PEN), polycarbonates (PC), polyallates, poly(vinyl chloride) (PVC), polyethylene (PE), polypropylene (PP), polystyrene (PS), Nylon (Ny), aromatic polyamides, polyether ether ketones, polysulfone, polyether sulfones, polyimides, and polyether imides; a heat-resistant transparent film having a basic skeleton of silsesquioxane having an organic-inorganic hybrid structure (product name: Sila-DEC, made by Chisso Corporation); and resin films composed of laminates of two or more layers formed of these resins.

Poly(ethylene terephthalate) (PET), poly(butylene terephthalate), poly(ethylene naphthalate) (PEN), and polycarbonates (PC) are preferably used in view of material cost and commercial availability. A heat-resistant transparent film having a basic skeleton of silsesquioxane having an organic-inorganic hybrid structure may be preferably used in view of optical transparency, heat resistance, and adhesion to an inorganic layer and a gas barrier layer.

Especially, in view of transparency, heat resistance, handling characteristics, strength, and cost, preferred are biaxially stretched poly(ethylene terephthalate) films, biaxially stretched poly(ethylene naphthalate) films, polyether sulfone films, and polycarbonate films, and more preferred are biaxially stretched poly(ethylene terephthalate) films and biaxially stretched poly(ethylene naphthalate) films.

In order to minimize the shrinkage at the time of thermal expansion, most preferred are films subjected to a thermal shrinkage treatment at low temperature, such as annealing.

A thickness of the substrate is preferably 10 to 500 μm, more preferably, it is 20 to 250 μm, and still more preferably, it is 30 to 150 μm. By using the substrate having a thickness in the range of 10 to 500 μm, a stable gas barrier property may be obtained, and it becomes suitable for transportation in a roll-to-roll production method.

(2) Gas Barrier Layer (2.1) Properties and Method of Forming Barrier Layer

When the transparent substrate of the present invention is a film substrate, it is preferable to form one or more gas barrier layers in order to achieve a required elastic modulus of the present invention. As a material for the gas barrier layer, any known materials may be used without limitation. For example, the following materials may be preferably used.

The gas barrier layer of the present invention is required to have the oxygen permeability and water vapor permeability as described above. It is preferable that it contains an inorganic precursor compound, and composed of at least one layer formed by application of a coating solution containing an inorganic precursor compound onto a transparent substrate, then carrying out a reforming treatment thereto.

The coating solution may be applied by any appropriate processes.

Specific examples thereof include: a roll coating method, a flow coating method, an inkjet method, a spray coating method, a printing method, a dip coating method, a casting method, a bar coating method, and a gravure printing method.

The thickness of application may be appropriately determined according to the purpose. For example, the thickness can be determined such that the thickness of the dried coating solution is preferably about 1 nm to 10 μm, more preferably about 10 nm to 10 μm, most preferably about 30 nm to 1 μm.

(2.2) Inorganic Precursor Compound

An inorganic precursor compound used for the present invention is not specifically limited as long as it is a compound which forms a metal oxide, a metal nitride or a metal oxinitride by irradiation with vacuum ultraviolet light under a specific condition. However, as a compound suitable for the production method of the present invention, preferable is a compound which may be reformed at a relatively low temperature as described in JP-A No. 8-112879.

Specific examples of such compounds include: polysiloxane having a Si—O—Si bond (including polysilsesquioxane), polysilazane having a Si—N—Si bond, and polysiloxazane having both a Si—O—Si bond and a Si—N—Si bond. These may be used by mixing two or more. Further, it may be used by sequentially or simultaneously laminating different compounds.

(2.2.1) Polysiloxane

The polysiloxanes used in the present invention may include general structure units $[R_3SiO_{1/2}]$, $[R_2SiO]$, $[RSiO_{3/2}]$, and $[SiO_2]$. In the formulas, R is independently selected from the group consisting of a hydrogen atom, an alkyl group having 1 to 20 carbon atoms (such as methyl, ethyl, and propyl), an aryl group (such as phenyl), and an unsaturated alkyl group (such as vinyl). Specific examples of polysiloxane groups include $[PhSiO_{3/2}]$, $[MeSiO_{3/2}]$, $[HSiO_{3/2}]$, [MePhSiO], $[Ph_2SiO]$, [PhViSiO], $[ViSiO_{3/2}]$, [MeHSiO], [MeViSiO], $[Me_2SiO]$, and $[Me_3SiO_{1/2}]$. Mixtures or copolymers of different polysiloxanes may also be used.

(2.2.2) Polysilsesquioxane

Among the polysiloxanes described above, polysilsesquioxane is preferably used in the present invention. Polysilsesquioxane includes silsesquioxane in the structure unit. The compound "silsesquioxane" is one of polysiloxanes represented by $[RSiO_{3/2}]$, and is typically prepared through hydrolysis and polycondensation of a compound represented by $RSiX_3$ (where R is a hydrogen atom, an alkyl group, an alkenyl group, an aryl group, or an aralkyl group; X is a halogen or an alkoxy group). Molecules forming silsesquioxane typically have an amorphous structure, a ladder structure, a cage structure, or a partially open cage structure (cage structure from one silicon atom is removed or a cage structure in which silicon-oxygen bonds are partially cut).

Among these polysilsesquioxanes, the so-called hydrogen silsesquioxane polymers are preferably used. Examples of the hydrogen silsesquioxane polymers include hydride siloxane polymers represented by a formula $HSi(OH)_x(OR)_yO_{z/2}$ (where R's each represent an organic group or a substituted organic group; R forms a hydrolytic substituent if R bonded through an oxygen atom to silicon; x=0 to 2, y=0 to 2, z=1 to 3, and x+y+z=3). Examples of R include alkyl groups, such as methyl, ethyl, propyl and butyl; aryl groups, such as phenyl; alkenyl groups, such as allyl and vinyl. These resins defined as above may be completely condensed into $(HSiO_{3/2})_n$, or may be partially hydrolyzed (that is, partially containing Si—OR) and/or partially condensed (that is, partially containing Si—OH).

Examples of cage silsesquioxanes include silsesquioxane represented by Formula (1) $[RSiO_{3/2}]_8$, silsesquioxane represented by Formula (2) $[RSiO_{3/2}]_{10}$, silsesquioxane represented by Formula (3) $[RSiO_{3/2}]_{12}$, silsesquioxane represented by Formula (4) $[RSiO_{3/2}]_{14}$, and silsesquioxane represented by Formula (5) $[RSiO_{3/2}]_{16}$.

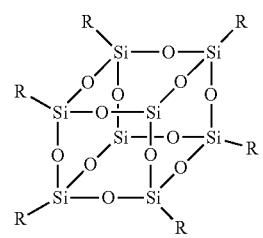

Formula (1)

-continued

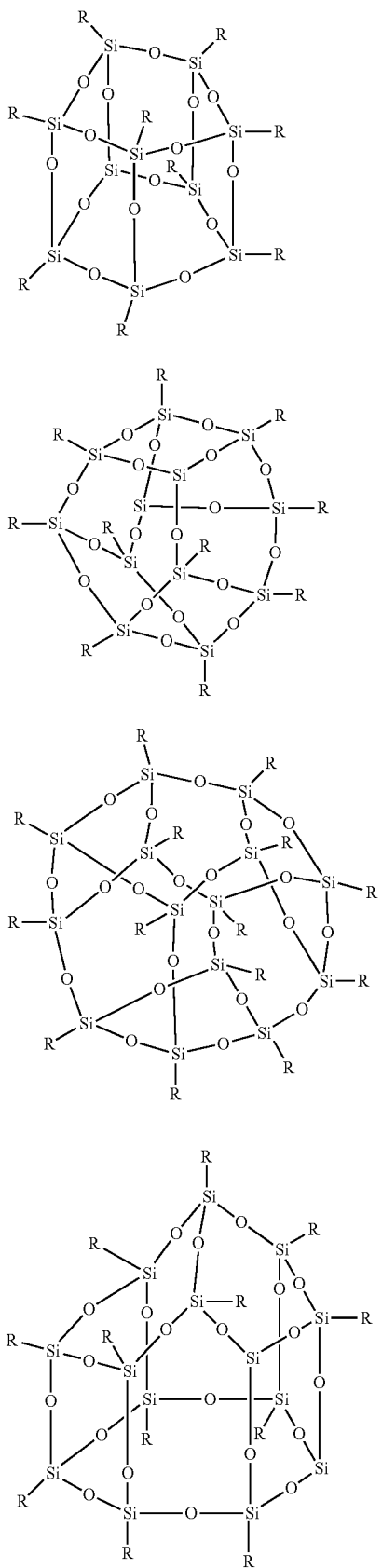

Formula (2)

Formula (3)

Formula (4)

Formula (5)

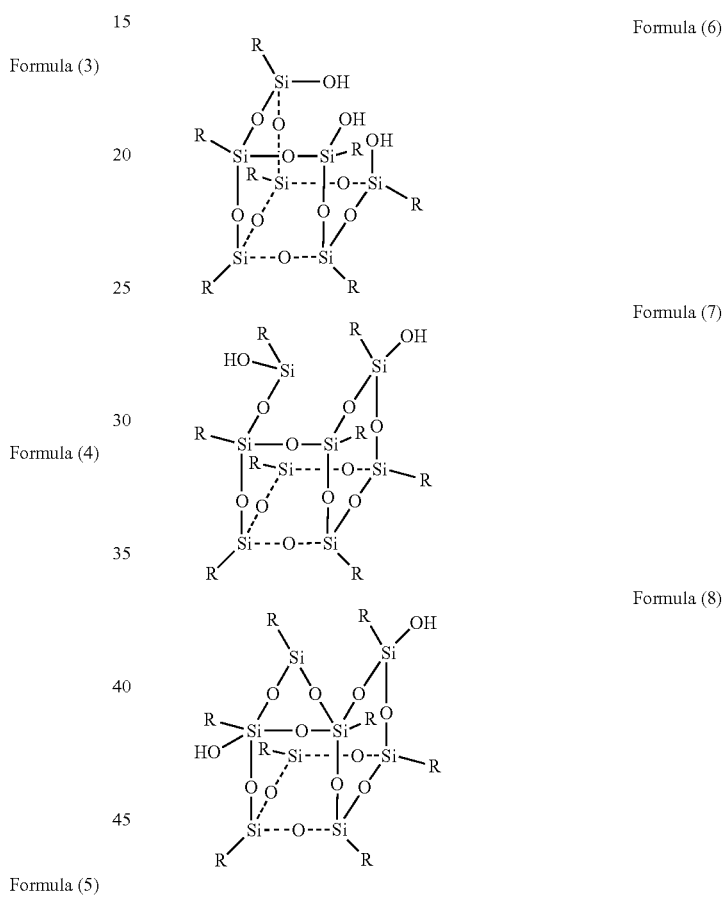

In the cage silsesquioxane represented by $[RSiO_{3/2}]_n$, n is an integer of 6 to 20, preferably 8, 10, or 12, particularly preferably 8. A mixture of cage silsesquioxanes at n=8, n=10, and n=12 is also particularly preferred. Preferred examples of cage silsesquioxane having partially open silicon-oxygen bonds $[RSiO_{3/2}]_{n-m}(O_{1/2}H)_{2+m}$ (where n is an integer of 6 to 20 and m is 0 or 1) include trisilanol having a partially open cage structure of a cage structure represented by Formula (1), silsesquioxane represented by Formula (6) $[RSiO_{3/2}]_7(O_{1/2}H)_3$, silsesquioxane represented by Formula (7) $[RSiO_{3/2}]_8(O_{1/2}H)_2$, and silsesquioxane represented by Formula (8) $[RSiO_{3/2}]_8 (O_{1/2}H)_2$.

Formula (6)

Formula (7)

Formula (8)

Examples of R in Formulas (1) to (8) include a hydrogen atom, saturated hydrocarbon groups having 1 to 20 carbon atoms, alkenyl groups having 2 to 20 carbon atoms, aralkyl groups having 7 to 20 carbon atoms, and aryl groups having 6 to 20 carbon atoms. Among these groups, R is preferably a polymerizable functional group which enables a polymerization reaction.

Examples of a saturated hydrocarbon group having 1 to 20 carbon atoms include methyl, ethyl, n-propyl, i-propyl, butyl (such as n-butyl, i-butyl, t-butyl, and sec-butyl), pentyl (such as n-pentyl, i-pentyl, neopentyl, and cyclopentyl), hexyl (such as n-hexyl, i-hexyl, and cyclohexyl), heptyl (such as n-heptyl and i-heptyl), octyl (such as n-octyl, i-octyl, and t-octyl), nonyl (such as n-nonyl and i-nonyl), decyl (such as n-decyl and i-decyl), undecyl (such as n-undecyl and i-undecyl), and dodecyl (such as n-dodecyl and i-dodecyl) groups. Preferred are saturated hydrocarbons having preferably 1 to 16 carbon atoms, particularly preferably 1 to 12 carbon atoms in consideration of the balance among melt fluidity, flame retardancy, and operation characteristics during formation of the barrier layer.

Examples of an alkenyl group having 2 to 20 carbon atoms include non-cyclic alkenyl and cyclic alkenyl groups. Examples thereof include vinyl, propenyl, butenyl, pentenyl, hexenyl, cyclohexenyl, cyclohexenylethyl, norbornenylethyl, heptenyl, octenyl, nonenyl, decenyl, undecenyl, and dodecenyl groups. Preferred are alkenyl groups having preferably 2 to 16 carbon atoms, particularly preferably 2 to 12 carbon atoms in consideration of the compatibility among melt fluidity, flame retardancy, and operation characteristics during formation of the barrier layer.

Examples of an aralkyl group having 7 to 20 carbon atoms include a benzyl group, a phenethyl group, and benzyl and phenethyl groups formed by mono- or multi-substituting alkyl groups having 1 to 13 carbon atoms, preferably 1 to 8 carbon atoms.

Examples of an aryl group having 6 to 20 carbon atoms include a phenyl group, a tolyl group, and phenyl, tolyl, and xylyl groups substituted by an alkyl group having 1 to 14 carbon atoms, preferably 1 to 8 carbon atoms.

For the cage silsesquioxanes, compounds commercially available from Sigma-Aldrich Corporation, Hybrid Plastics, Inc., Chisso Corporation, and AZmax Co., Ltd. may be used as they are, or compounds prepared by methods described in Journal of American Chemical Society, vol. 111, p. 1741 (1989) and others may be used.

The polysilsesquioxane having a partially open cage structure refers to a compound having a cage structure having three or less Si—OH bonds, which is derived from cleavage of Si—O—Si bonds in one cage unit represented by a formula $[RSiO_{3/2}]_8$, or a compound having a cage structure represented by $[RSiO_{3/2}]_8$ from which at most one Si atom is removed.

Use of hydrogen silsesquioxane such as $[HSiO_{3/2}]_8$ is also preferred in cage silsesquioxane.

(2.2.3) Polysilazane

The polysilazane used in the present invention refers to a polymer having a silicon-nitrogen bond, and is an inorganic precursor polymer for $SiO_2$, $Si_3N_4$ including Si—N, Si—H, or N—H, and an intermediate solid solution $SiO_xN_y$ (x: 0.1 to 1.9, y: 0.1 to 1.3) between $SiO_2$ and $Si_3N_4$.

The polysilazane preferably used in the present invention is represented by Formula (A).

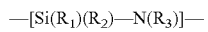

—[Si($R_1$)($R_2$)—N($R_3$)]—   Formula (A):

where $R_1$, $R_2$, $R_3$ each represent a hydrogen atom, an alkyl group, an alkenyl group, a cycloalkyl group, an aryl group, an alkylsilyl group, an alkylamino group, or an alkoxy group.

In the present invention, particularly preferred is perhydropolysilazane which all of $R_1$, $R_2$, and $R_3$ are hydrogen atoms, in view of the compactness of the barrier layer.

In organopolysilazane in which hydrogen moieties bonding to Si are partially replaced with an alkyl group, the alkyl group, such as a methyl group, contained in the organopolysilazane can enhance the adhesion to the substrate, and can impart toughness to ceramic layers formed of hard and fragile polysilazane, advantageously preventing cracking in thicker layers. These perhydropolysilazanes and organopolysilazanes may also be appropriately selected according to the application, and may be used in the form of a mixture.

It is presumed that perhydropolysilazanes have linear segments and cyclic segments composed of 6- and 8-membered rings. The perhydropolysilazane has a number average molecular weight (Mn) of about 600 to 2000 (in terms of polystyrene). The perhydropolysilazane is liquid or solid depending on the molecular weight. These perhydropolysilazanes are sold in the form of a solution in an organic solvent, and such commercially available products may be used without any treatment as coating solutions containing polysilazane.

Another examples of polysilazane which may be converted to ceramic at a low temperature are: silyl alkoxide added polysilazane, being produced by reacting silyl alkoxide with the above-described polysilazane (for example, refer to JP-A 5-238827); glycidol added polysilazane, being produced by reacting glycidol (for example, refer to JP-A 6-122852); alcohol added polysilazane, being produced by reacting alcohol (for example, refer to JP-A 6-240208); metal carboxylic acid salt added polysilazane, being produced by reacting metal carboxylate (for example, refer to JP-A 6-299118); acetyl acetonate complex added polysilazane, being produced by reacting acetyl acetonate complex containing a metal (for example, refer to JP-A 6-306329); and metal fine particle added polysilazane, being produced by adding metal fine particles (for example, refer to JP-A 7-196986).

Organic solvents readily reactive with polysilazane, such as alcohols and solvents having a moisture content, should be avoided in preparation of a liquid containing polysilazane. Usable organic solvents are specifically hydrocarbon solvents, such as aliphatic hydrocarbons, alicyclic hydrocarbons, and aromatic hydrocarbons, halogenated hydrocarbon solvents, and ethers, such as aliphatic ethers and alicyclic ethers. Specific examples thereof include hydrocarbons, such as pentane, hexane, cyclohexane, toluene, xylene, Solvesso, and turpentine; halogenated hydrocarbons, such as methylene chloride and trichloroethane; and ethers, such as dibutyl ether, dioxane, and tetrahydrofuran. These solvents may be selected according to the solubility of polysilazane and the evaporation rate of the solvent. These solvents may be used in combination.

The concentration of the polysilazane in the coating solution containing polysilazane depends on the thickness of silica or the pot life of the coating solution and ranges from about 0.2 to 35 mass %.

The organopolysilazane may be a derivative in which hydrogen moieties bonding to Si are partially replaced with an alkyl group. The organopolysilazane having an alkyl group, particularly a methyl group having the smallest molecular weight can enhance the adhesion to the substrate, and can give toughness to hard and fragile silica layers, preventing cracking in layers having larger thicknesses.

To promote reforming treatment of polysilazane into a silicon oxide compound, a catalyst, such as amine or metal, may also be added to the coating solution. Specific examples of such coating solutions include AQUAMICA NAX120-20, NN110, NN310, NN320, NL110A, NL120A, NL150A, NP110, NP140, and SP140 made by AZ Electronic Materials plc.

(2.2.4) Polysiloxazane

The polysiloxazane according to the present invention has main repeating units represented by —$[(SiH_2)_n(NH)_r]$— and —$[(SiH_2)_mO]$— (where n, m, and r are independently 1, 2, or 3).

(2.2.5) Catalyst

The solution containing an inorganic precursor according to the present invention (also referred to as coating solution) may contain a catalyst as needed.

Specific examples of a catalyst include N-heterocyclic compounds, such as 1-methylpiperazine, 1-methylpiperidine, 4,4'-trimethylenedipiperidine, 4,4'-trimethylene-bis(1-methylpiperidine), diazabicyclo-[2,2,2]octane, cis-2,6-dimethylpiperazine, 4-(4-methylpiperidine)pyridine, pyridine, dipyridine, α-picoline, β-picoline, γ-picoline, piperidine, lutidine, pyrimidine, pyridazin, 4,4'-trimethylenedipyridine, 2-(methylamino)pyridine, pyrazine, quinoline, quinoxaline, triazine, pyrrole, 3-pyrroline, imidazole, triazole, tetrazole, and 1-methylpyrrolidine; amines, such as methylamine, dimethylamine, trimethylamine, ethylamine, diethylamine, triethylamine, propylamine, dipropylamine, tripropylamine, butylamine, dibutylamine, tributylamine, pentylamine, dipentylamine, tripentylamine, hexylamine, dihexylamine, trihexylamine, heptylamine, diheptylamine, octylamine, dioctylamine, trioctylamine, phenylamine, diphenylamine, and triphenylamine; and other compounds, such as 1,8-diazabicyclo[5,4,0]-7-undecene (DBU), 1,5-diazabicyclo[4,3,0]-5-nonene (DBN), 1,5,9-triazacyclododecane, and 1,4,7-triazacyclononane.

Examples of preferred catalysts also include organic acids, inorganic acids, metal carboxylates, acetylacetonato complexes, and metal nanoparticles. Examples of the organic acids include acetic acid, propionic acid, butyric acid, valeric acid, maleic acid, and stearic acid. Examples of the inorganic acids include hydrochloric acid, nitric acid, sulfuric acid, phosphorus acid, hydrogen peroxide, chloric acid, and hypochlorous acid. The metal carboxylates refer to compounds represented by a formula $(RCOO)_nM$ [where R represents an aliphatic or alicyclic group having 1 to 22 carbon atoms; M represents at least one metal selected from the group consisting of Ni, Ti, Pt, Rh, Co, Fe, Ru, Os, Pd, Ir, and Al; n represents an atomic valence of M]. The metal carboxylates may be anhydrides or hydrates thereof. The acetylacetonato complex is composed of a metal atom coordinated with an anion $acac^-$ generated from acetylacetone (2,4-pentadione) by acidic dissociation, and is typically represented by a formula $(CH_3COCHCOCH_3)_nM$ [where M represents a metal having an ionic valency n]. Examples of a suitable metal M include nickel, platinum, palladium, aluminum, and rhodium. Metal nanoparticles of Au, Ag, Pd, and Ni are preferred, and particularly those of Ag are preferred. The metal nanoparticles have a particle size of preferably less than 0.5 μm, more preferably 0.1 μm or less, still more preferably less than 0.05 μm. Besides these metal nanoparticles, organic metal compounds, such as peroxides, metal chlorides, ferrocene, and zirconocene, can also be used. Platinum vinyl siloxane used as a curing agent for silicone polymers can also be used.

These catalysts may be compounded with the inorganic precursor compound in the range of preferably 0.01 to 10 mass %, more preferably in the range of 0.05 to 2 mass %.

(2.3) Reforming Treatment

As a method of reforming treatment of an inorganic precursor compound used for the present invention, when UV rays are used, it may use UV rays emitted by an ultra-high pressure mercury lamp, a high pressure mercury lamp, a low pressure mercury lamp, a carbon arc, a xenon arc, or a metal halide lamp. Preferably, vacuum UV rays (VUV) of an excimer lamp, which will be described later, is used. The detail of a vacuum ultraviolet light (VUV) irradiation process may be referred to the description of paragraphs [0150]-[0167] of JP-A No. 2014-083691.

When polysilazane is used as an inorganic precursor compound, the illuminance of the vacuum ultraviolet light which is received at a coated layer surface of a polysilazane coated layer is preferably in the range of 30 to 200 $mW/cm^2$, and more preferably, it is in the range of 50 to 160 $mW/cm^2$. When it is 30 $mW/cm^2$ or more, the reforming efficiency will not be decreased. When it is 200 $mW/cm^2$ or less, there will not occur concern of producing ablation in the coated layer or giving damage to the substrate.

An amount of irradiation energy of vacuum ultraviolet light at a polysilazane coated layer surface is preferably in the range of 200 to 10,000 $mJ/cm^2$, more preferably, it is in the range of 500 to 5,000 $mJ/cm^2$. When it is 200 $mJ/cm^2$ or more, sufficient reforming will be done. When it is 10,000 $mJ/cm^2$ or less, there will not occur concern of producing breakage due to over reforming or thermal deformation of the substrate.

(3) Internal Light Extracting Layer (3.1) Configuration and Properties

The internal light extracting layer 2 is interposed between the transparent substrate 13 and the transparent metal electrode 1, and includes a light scattering layer 2a and a smoothing layer 2b sequentially disposed on the transparent substrate 13 in this order. The smoothing layer is provided in order to mainly avoid the defects such as deterioration in storage under high temperature and high humidity, or electric short circuit (short) caused by unevenness of the surface of the gas barrier layer or the light scattering layer, when the transparent electrode and the organic light-emitting layer are provided on the gas barrier layer or the light scattering layer.

Consequently, the internal light extraction layer preferably contains the light scattering layer and the smoothing layer. The surface elastic modulus of the internal light extraction layer is preferably 15 GPa or more, more preferably 20 GPa or more, still more preferably 25 GPa or more, and particularly preferably 30 GPa or more. It is preferably in the range of 20 to 50 GPa.

The surface elastic modulus of the sole smoothing layer is preferably 20 GPa or more, more preferably 25 GPa or more, and still more preferably 30 GPa or more. It is preferable that the light scattering layer has a smaller elastic modulus than the smoothing layer. The elastic modulus of the light scattering layer is preferably 0.5 to 25 PGa, more preferably 1 to 20 GPa, still more preferably 1.5 to 15 GPa, and particularly preferably 1.5 to 10 GPa.

Controlling the elastic modulus of the surfaces of the internal light extracting layer, the light scattering layer, and the smoothing layer is done by suitable selection of the kinds and amount of the used binder, light scattering particles, and filling factor. The internal light extracting layer 2 has preferably a refractive index in the range of 1.7 to 2.5 at a wavelength of 550 nm.

The waveguide-mode light confined within the luminous layer of the organic light-emitting element and the plasmon-mode light reflected from the cathode are light components in specific optical modes. Extraction of these light components needs an internal light extracting layer having a refractive index of 1.7 or more. Substantially no light is present in a region having a refractive index of 2.5 or more even in the highest mode. An internal light extracting layer having a refractive index of 2.5 or more would not increase the amount to light to be extracted.

In practice, it is preferable that the light scattering layer 2a and the smoothing layer 2b both have an refractive index in the range of 1.7 to 2.5. Determination of individual refractive indices of these layers often has technical difficulties; hence, the overall internal light extracting layer 2 is required to have a refractive index within this range.

The refractive index of the internal light extracting layer 2 is determined as follows: the layer is irradiated at 25° C. with a light beam having the shortest local maximum wavelength among light beams emitted from a light-emitting unit, and the refractive index is measured with an Abbe refractometer (made by ATAGA Co., Ltd., DR-M2) (the refractive index of the light scattering layer and that of the smoothing layer are determined in the same manner).

The internal light extracting layer 2 has a haze value (proportion of the scattering transmittance to the total light transmittance) of 30% or more. A haze value of 30% or more can enhance luminescence efficiency.

The haze value refers to a physical property expressed by a numeric value calculated in consideration of (i) the effect of the difference in refractive index between the compositions in the layer and (ii) the effect of the shape of the surface of the layer. In the present invention, the haze value of the internal light extracting layer 2 including the light scattering layer 2a and the smoothing layer 2b laminated thereon is determined. Through control of the surface roughness of the layer in the range of less than a predetermined value, a haze value independent of the effect (ii) may be attained.

The haze value may be measured by Haze mater NDH-2000 (made by Nippon Denshoku Industries Co. Ltd.) based on JIS K 7136. The light source of the haze meter may be a halogen lamp of 5V9W, and the light receiving portion may be a silicon photo-cell (attached with a relative luminosity filter). The measurement of haze value may be done at 23° C. and 55% RH.

The internal light extracting layer 2 according to the present invention has an average transmittance at wavelength of 450 nm to 700 nm of preferably 50% or more, more preferably 55% or more, particularly preferably 60% or more. Here, and an average transmittance designates a total light transmittance, and it may be measured based on JIS K 7375: 2008.

Although a higher transmittance of the internal light extracting layer 2 is preferred, it is presumed that the actual transmittance is less than 80% of the determined transmittance. The transmittance of the internal light extracting layer 2 is more preferably less than 85%, particularly preferably less than 90%.

(3.2) Light Scattering Layer
(3.2.1) Refractive Index

The light scattering layer 2a preferably has a high refractive index layer within the range of 1.7 to 3.0 measured at wavelength of 550 nm. In this case, the light scattering layer 2a may be composed of a single material having a refractive index of 1.7 to 3.0. Alternatively, two or more compounds may be mixed to form a layer having a refractive index of 1.7 to 3.0. In a layer composed of a mixture of materials, the refractive index of the light scattering layer 2a can be defined as a calculated refractive index, that is, the sum of the refractive indices of the respective materials multiplied by the corresponding mixed proportions of the materials. In this case, the refractive indices of the respective materials may be less than 1.7 or 3.0 or more as long as the layer formed of a mixture thereof has a refractive index of 1.7 to 3.0.

The light scattering layer 2a according to the present invention is a mixed light scattering layer (scattering film) composed of a mixture of a layer matrix and light scattering particles, and utilizes the difference in refractive index between these materials.

The light scattering layer 2a is disposed on the outermost surface of the transparent substrate 13 on the transparent metal electrode 1 side to enhance outcoupling efficiency.

The light scattering layer 2a is composed of a layer matrix and light scattering particles contained in the layer matrix.

The difference in refractive index between the layer matrix, i.e., a resin material (monomer or binder) described later and the light scattering particles is 0.03 or more, preferably 0.1 or more, more preferably 0.2 or more, particularly preferably 0.3 or more. When the difference in refractive index between the layer matrix and the light scattering particles is 0.03 or more, a light scattering effect occurs at the interface of the layer matrix and the light scattering particles. A larger difference in refractive index preferably generates larger refraction at the interface to enhance the light scattering effect.

(3.2.2) Average Particle Size of Light Scattering Particles

The light scattering layer 2a scatters light utilizing the difference in refractive index between the layer matrix and the light scattering particles as described above. For this reason, the light scattering layer 2a preferably contains a transparent light scattering particle having a particle size equal to or more than a particle size enabling generation of Mie scattering in the visible light region. The average particle size is 0.2 μm or more.

On the other hand, the upper limit of the average particle size is less than 1 μm. When a larger particle size is used, it is required to increase a thickness of the smoothing layer 2b for smoothing the roughness of the light scattering layer 2a containing the light scattering particles. This is not preferable—in view of increasing a load on production steps and absorption of light in the layer.

The average particle size of the high-refractive index particle (light scattering particle) can be determined by a known method. For example, it may be used a method in which particle observation of the light scattering particles is done with a transmission electron microscope (TEM), and then, a number average particle is determined as a particle size distribution. Another method is a method using a particle size measuring apparatus based on a dynamic light scattering method, for example, "ZETASIZER Nano Series Nano-ZS" made by Malvern Co. In the present invention, it is preferable to use a method of converting to a circle after performing image processing of a transmission electron microscopic photograph (TEM cross-section), and the diameter of the converted circle is made as an average size.

(3.2.3) Types of Light Scattering Particles

Any type of light scattering particles may be appropriately selected according to the purpose, and may be organic or inorganic nanoparticles. Among these particles preferred are inorganic nanoparticles having high refractive indices.

Examples of organic nanoparticles having high refractive indices include beads of poly(methyl methacrylate), acrylic-styrene copolymers, melamines, polycarbonates, styrene, crosslinked polystyrene, poly(vinyl chloride), and benzoguanamine-melamine formaldehyde.

Examples of inorganic nanoparticles having high refractive indices include inorganic particles of at least one oxide selected from the group consisting of oxides of zirconium, titanium, indium, zinc, antimony, cerium, niobium, and tungsten. Specific examples of such inorganic oxide particles include $ZrO_2$, $TiO_2$, $BaTiO_3$, $In_2O_3$, $ZnO$, $Sb_2O_3$, ITO, $CeO_2$, $Nb_2O_5$, and $WO_3$. Among these particles, preferred are $TiO_2$, $BaTiO_3$, $ZrO_2$, $CeO_2$, and $Nb_2O_5$, and more preferred is $TiO_2$. Preferred $TiO_2$ is of a rutile type, which has a catalytic activity lower than an anatase type to enhance the weatherability of the high-refractive index layer or adjacent layers, and has a refractive index higher than that of the anatase type.

Since these particles are contained in a light scattering layer 2a with a high refractive index, surface treated particles or surface-untreated particles may be selected according to the dispersibility of the particles in a dispersion described later or the stability of the dispersion.

Specific examples of materials used in the surface treatment include different inorganic oxides, such as silicon oxide and zirconium oxide; metal hydroxides, such as aluminum hydroxide; and organic acids, such as organosiloxane and stearic acid. These surface treating materials may be used alone or in combination. Among these surface treating materials, preferred are different inorganic oxides and/or metal hydroxides, more preferred are metal hydroxides in view of stable dispersion. In particular, when $TiO_2$ particles are used, it is preferable to conduct a surface treatment. It is preferable that a catalytic activity of $TiO_2$ particles is fully prevented by the surface treatment.

In inorganic oxide particles coated with the surface treating material, the coating amount of the surface treating material (typically, the coating amount is represented by the proportion of the mass of the surface treating material applied to the surfaces of the particles to the mass of the particle) is preferably 0.01 to 99 mass %. A coating amount of the surface treating material of 0.01 mass % or more can sufficiently attain an effect of enhancing the dispersibility of particles and the stability of the dispersion due to the surface treatment. A coating amount of the surface treating material of 99 mass % or less can prevent a reduction in the refractive index of the light scattering layer 2a with a high refractive index.

Besides these high-refractive index materials, quantum dots described in WO 2009/014707 and U.S. Pat. No. 6,608,439 can also be suitable for use.

The high-refractive index particle has a refractive index of 1.7 or more, preferably 1.85 or more, particularly preferably 2.0 or more. A refractive index of 1.7 or more increases the difference in refractive index between the high-refractive index particle and a binder to increase the amount of light to be scattered, enhancing outcoupling efficiency.

On the other hand, the upper limit of the refractive index of the high-refractive index particle is less than 3.0. A larger difference in refractive index between the high-refractive index particle and a binder can attain a sufficient amount of light to be scattered to enhance outcoupling efficiency.

The high-refractive index particles are preferably disposed on or near the interface between the light scattering layer 2a and the smoothing layer 2b in a thickness substantially equal to the average particle size of the light scattering particle. The particles thus disposed can scatter evanescent light totally reflected within the smoothing layer 2b and leaked from the light scattering layer 2a, enhancing outcoupling efficiency.

The content of the high-refractive index particle in the light scattering layer 2a defined as a volume filling rate is within the range of preferably 1 to 70%, more preferably 5 to 50%. Such a content can generate inhomogeneous distribution of the refractive index on the interface between the light scattering layer 2a and the smoothing layer 2b to increase the amount of light to be scatted, enhancing outcoupling efficiency.

(3.2.4) Relationship Between Thickness and Average Particle Size of Particles

The ratio T/D is preferably 0.75 to 3.0, more preferably 1.0 to 2.5, still more preferably 1.25 to 2.0, when the thickness of the light scattering layer is defined as T and the average particle size of the light scattering particles contained in the light scattering layer is defined as D.

Figure 5:
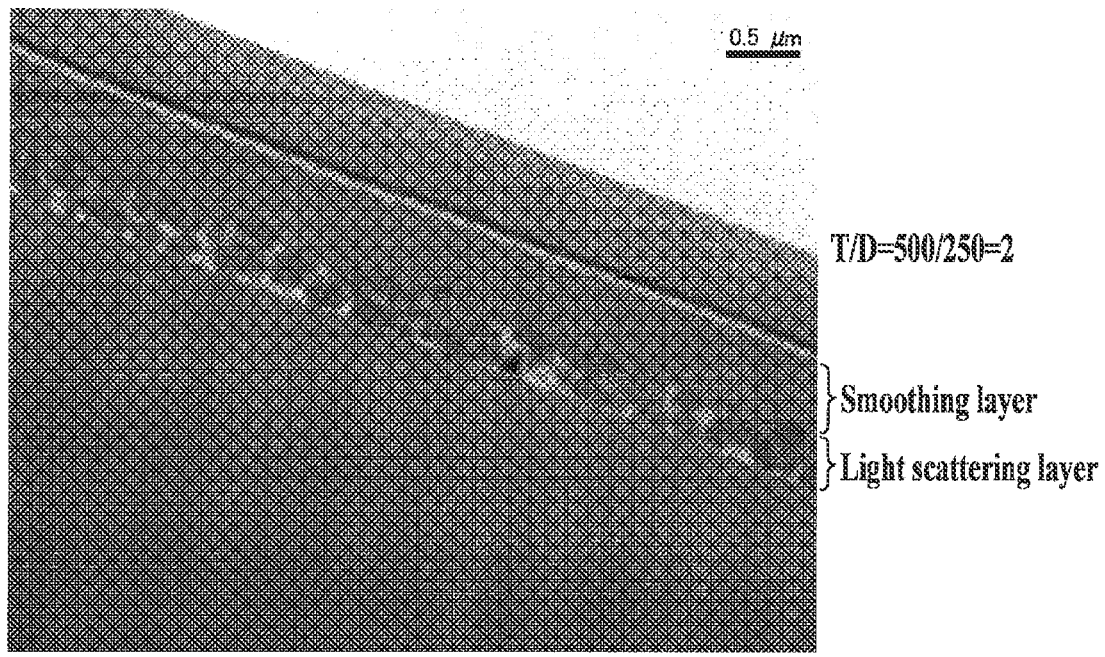
FIG. 5 is a microscopic photograph of a cross-section of an exemplary laminated body of a light scattering layer and a smoothing layer where the T/D, (the thickness of the light scattering layer)/(the average particle size of the light scattering particle), is 2.

FIG. 5 is a microscopic photograph of a cross-section of a laminated body of a light scattering layer (large particle portion) and a smoothing layer, and shows examples of the relationship between the thickness of the light scattering layer (large particle portion) and the average particle size of the light scattering particles.

When the T/D value is within the above-described range, the probability of collision of light to the light scattering particles becomes high, and it is preferable. In addition, the absorption by the light scattering particles is appropriate, and the light absorption loss is small, and it is preferable. In FIG. 5, the T/D value is 2.0, which is a preferable example.

(3.2.5) In-Plane Occupancy Rate of Light Scattering Particle in Light Scattering Layer The in-plane occupancy rate of the light scattering particle in the light scattering layer is typically 30% or more, preferably 50% or more, more preferably 70% or more.

The term "in-plane occupancy rate of the light scattering particle in the light scattering layer" refers to the area rate of the light scattering particles occupying in the light scattering layer in plan view observed by transmission.

Figure 6:
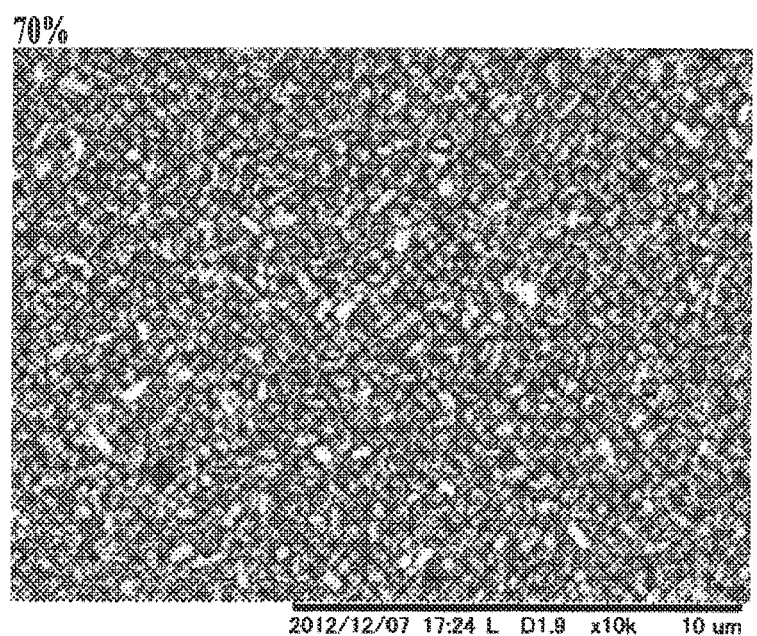
FIG. 6 is a transmission microscopic photograph of a light scattering layer in plan view where the in-plane occupancy rate of the light scattering particle in the light scattering layer is 70%.

FIG. 6 is a microscopic photograph of the light scattering layer taken at a magnification of 10,000 in plan view observed by transmission. It illustrates the state of varying the in-plane occupancy rate.

When an in-plane occupancy rate is less than 30%, there is a large amount of space between the light scattering particles. When an in-plane occupancy rate is 30% or more, or preferably, 70% or more, the density of particles is high, and the scattering of light by the light scattering layer becomes appropriate.

(3.3) Smoothing Layer

The smoothing layer 2b according to the present invention preferably has a high-refractive index layer having a refractive index of 1.7 to 2.5 measured at wavelength of 550 nm. The smoothing layer 2b may be composed of a single material or a mixture of materials as long as the refractive index is in the range of 1.7 to 2.5. The refractive index of a layer composed of a mixture of materials is defined as in the refractive index of the light scattering layer 2a.

Figure 7:
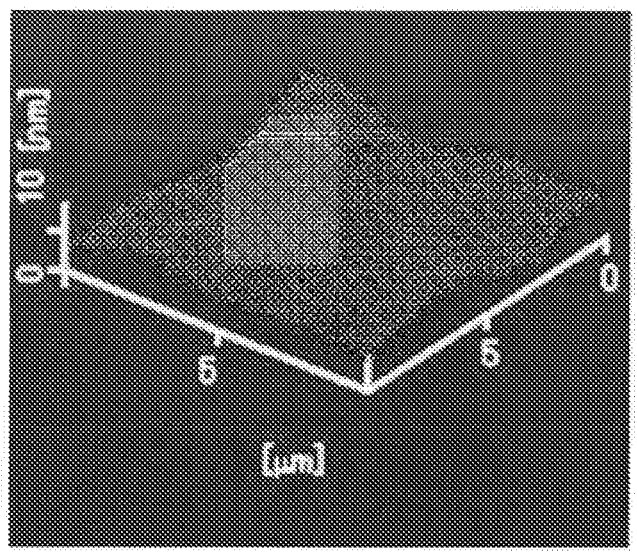
FIG. 7 illustrates exemplary results of the average roughness of a laminated body of a scattering layer and a smoothing layer determined with an atomic force microscope (AFM).

It is required that the smoothing layer 2b has flatness to desirably form a transparent metal electrode 1 thereon. The smoothing layer 2b has an average surface roughness Ra of typically less than 100 nm, preferably less than 30 nm, more preferably less than 10 nm, most preferably less than 5 nm. FIG. 7 illustrates exemplary results of the average surface roughness Ra of the smoothing layer 2b determined according to the present invention.

Throughout the specification, the term "average surface roughness Ra" refers to the arithmetic average roughness in accordance with JIS B0601-2001.

The average surface roughness Ra is determined by atomic force microscopy (AFM). The irregularity of a surface is continuously measured with a detector equipped with a stylus having a micro tip with an extremely small radius to calculate the roughness from the cross-sectional curve of the irregularity. The fine irregularity over a 10 μm section on the surface is measured three times with the stylus having a micro tip with an extremely small radius to average the three roughness values determined from fluctuations caused by the fine irregularity.

Examples of a resin (binder) used in the smoothing layer 2b include the same resins as in the light scattering layer 2a (see the description below).

The high-refractive index material contained in the smoothing layer 2b is preferably a nanoparticle sol, particularly preferably a metal oxide nanoparticle sol.

The lower limit of the refractive index of the metal oxide nanoparticle, in bulk, contained in the smoothing layer 2b with a high-refractive index is preferably 1.7 or more, preferably 1.85 or more, still more preferably 2.0 or more, particularly preferably 2.5 or more. The upper limit of the refractive index of the metal oxide nanoparticle is preferably 3.0 or less. The metal oxide nanoparticle having a refractive index of 1.7 or more preferably achieves the target advantageous effects of the invention. The metal oxide nanoparticle having a refractive index of 3.0 or less preferably reduces multiple scattering within the smoothing layer to enhance the transparency of the smoothing layer 2b.

The lower limit of the particle size of the metal oxide nanoparticles (inorganic particles) contained in the smoothing layer 2b with a high-refractive index is preferably 5 nm or more, more preferably 10 nm or more, still more preferably 15 nm or more. The upper limit of the particle size of the metal oxide nanoparticles is preferably 70 nm or less, more preferably 60 nm or less, still more preferably 50 nm or less. A particle size of 5 nm or more preferably prevents aggregation of the metal oxide nanoparticles to enhance the transparency of the smoothing layer. Preferably, a metal oxide nanoparticle having a larger particle size has a smaller surface area to reduce the catalytic activity, so that the degradation of the smoothing layer 2b and its adjacent layers may be delayed. A metal oxide nanoparticle having a particle size of 70 nm or less preferably enhances the transparency of the smoothing layer 2b. The particle size can have any distribution within the advantageous effects of the present invention. The distribution may be wide or narrow, or may have two or more distribution peaks.

The lower limit of the content of the metal oxide nanoparticle in the smoothing layer 2b is 70 mass % or more, preferably 80 mass % or more, more preferably 85 mass % or more of the total mass. The upper limit of the content of the metal oxide nanoparticle is preferably 97 mass % or less, preferably 95 mass % or less. A content of 70 mass % or more of the metal oxide nanoparticle in the smoothing layer 2b facilitates the control of the refractive index of the smoothing layer 2b within the range of 1.80 or more. A content of 95 mass % or less of the metal oxide nanoparticle in the smoothing layer 2b facilitates the formation of the smoothing layer 2b by a coating process and reduces the fragility of the dried layer, resulting in high flex resistance.

In view of stability, the metal oxide nanoparticle contained in the smoothing layer 2b according to the present invention is more preferably $TiO_2$ (titanium dioxide sol). Particularly preferred $TiO_2$ is of a rutile type, which has a catalytic activity lower than that of an anatase type to enhance the weatherability of the smoothing layer 2b and adjacent layers, and has a refractive index higher than that of the anatase type.

The titanium dioxide sol usable in the present invention may be prepared in accordance to JP-A Nos. S63-17221, H7-819, H9-165218, and H11-43327, for example.

A primary particle diameter of titanium dioxide nanoparticles is within the range of particularly preferably 5 to 15 nm, most preferably 6 to 10 nm.

(4) Light Scattering Layer/Smoothing Layer

The internal light extracting layer composed of the light scattering layer and the smoothing layer disposed thereon has preferably a refractive index of 1.7 to 2.5.

The internal light extracting layer has an absorbance of light having a wavelength of 450 to 700 nm, which is preferably less than 15%, more preferably less than 12%, still more preferably less than 10%, particularly preferably less than 8%. An absorbance of less than 15% is preferred in view of luminescence efficiency. The internal light extracting layer can have any lower limit of the absorbance. Preferably the internal light extracting layer is composed of an industrially available material with high transparency.

The absorbance of light having a wavelength of 450 to 700 nm preferably has a small variation between the maximum absorption value (max value) and the minimum absorption value (min value) at each wavelength from 450 to 700 nm. The ratio, min value/max value, is preferably 0.5 or more, more preferably 0.6 or more, still more preferably 0.7 or more, particularly preferably 0.8 or more. A ratio, min value/max value, of 0.5 or more can prevent the coloring of the internal light extracting layer, which causes light emission having a color different from the original light emission spectrum of the organic light-emitting element, and in extreme cases, unsuccessful extraction of white light. The ratio, min value/max value, is ideally 1, and is preferably closer to 1. Preferably the internal light extracting layer is composed of a material having industrially available transparency to visible light.

The internal light extracting layer, which is a laminated body of the light scattering layer and the smoothing layer formed as described above, preferably has a haze value of 30 to 90%. The haze value is more preferably 35 to 85%, still more preferably 40 to 80%, particularly preferably 45 to 75%. The haze value varies according to the shape of the surface. Throughout the specification, the term "haze value" refers to a value determined with a layer (thickness: 1 μm) having a surface roughness Ra of less than 5 nm determined with an atomic force microscope (AFM).

Figure 8:
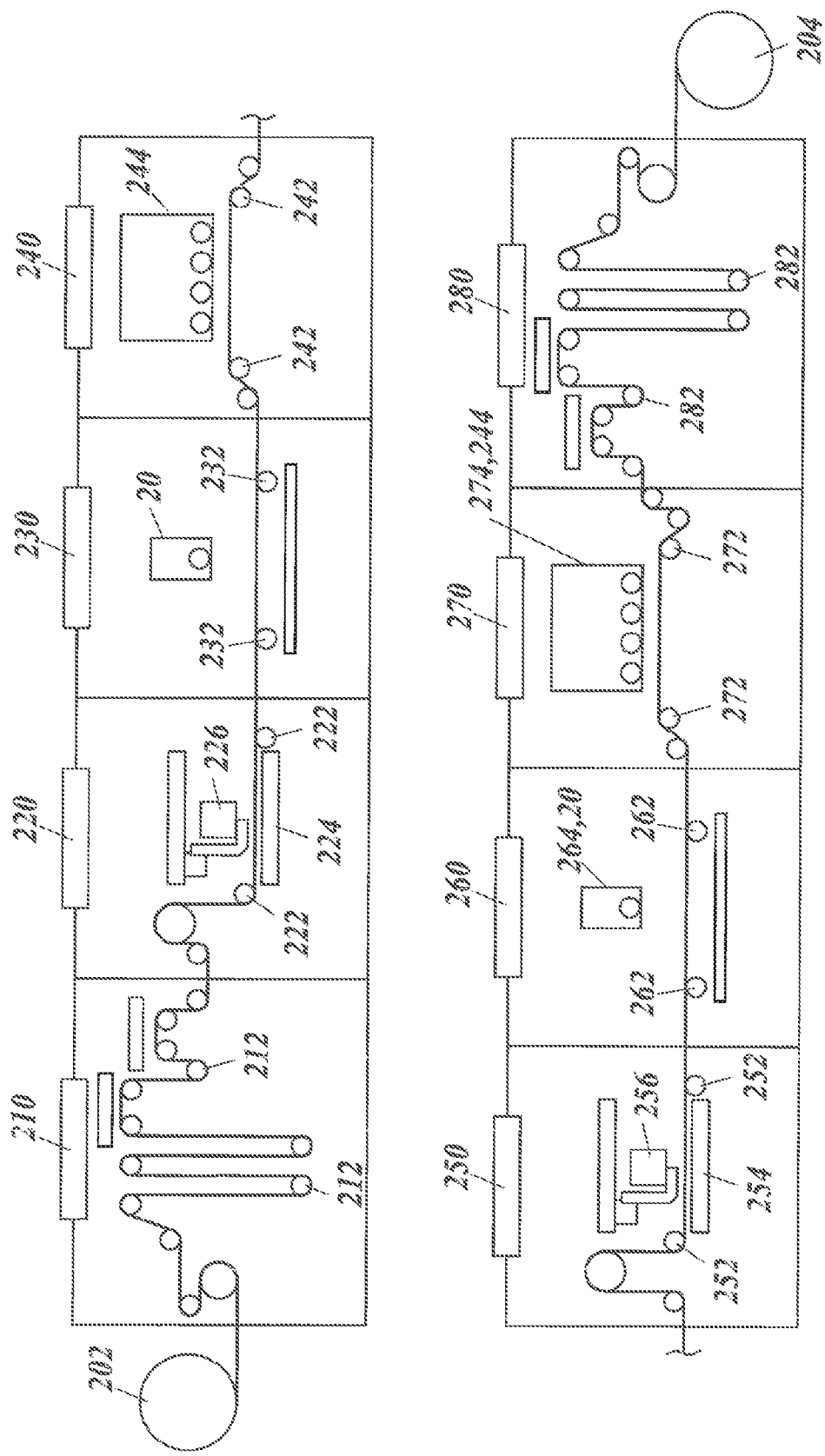
FIG. 8 is a drawing illustrating a schematic constitution of a manufacturing apparatus for forming an internal light extracting layer.

(3.5) Apparatus and Process of Manufacturing Internal Light Extracting Layer (3.5.1) Manufacturing Apparatus As illustrated in FIG. 8, by a roll-to-roll process, a manufacturing apparatus 200 forms an internal light extracting layer on a transparent substrate in the midway between a feed roll 202 and a take-up roll 204 while the transparent substrate unwound from the feed roll 202 is being wound around the take-up roll 204.

The manufacturing apparatus 200 mainly includes a transfer unit 210, an inkjet (abbreviated as IJ) coating unit 220, an IR drying unit 230, a photo-curing unit 240, an IJ coating unit 250, an IR drying unit 260, a photo-curing unit 270, and a transfer unit 280.

The transfer unit 210 includes a plurality of transfer rollers 212. In the transfer unit 210, the transparent substrate is unwound from the feed roll 202 through the transfer rollers 212 under an adjusted tension applied to the transparent substrate.

The transfer unit 210 may include an accumulator. As one preferred aspect, the accumulator disposed in the transfer unit 210 enables selection between continuous transfer and intermittent transfer. To place an accumulator in the transfer unit 210 is a preferable embodiment.

The inkjet coating unit 220 includes transfer rollers 222, a platen 224, and an inkjet head 226. In the inkjet coating unit 220, a coating solution from the inkjet head 226 is applied onto the transparent substrate supported on the platen 224 into a predetermined pattern in the midway while the transparent substrate is being transferred through the transfer rollers 222.

The IR drying unit 230 includes transfer rollers 232 and an infrared heater 20. In the IR drying unit 230, the applied patterned coating solution is irradiated with infrared light from the infrared heater 20 to be dried, in the midway while the transparent substrate is being transferred through transfer rollers 232.

Figure 9:
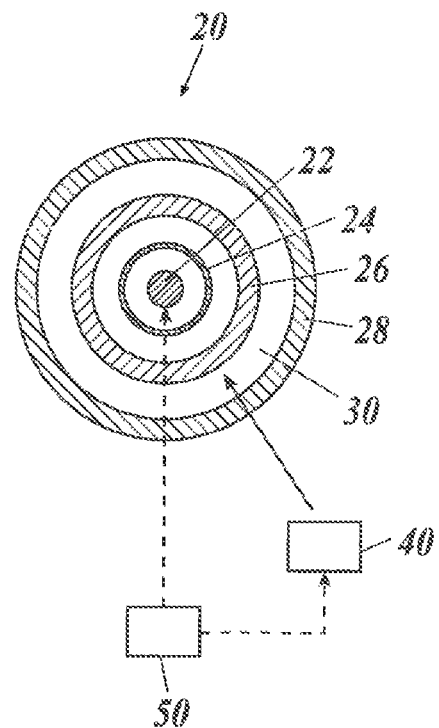
FIG. 9 is a sectional view showing a schematic constitution of a wavelength controlled infrared heater.

The wavelength controlled infrared heater 20 has an absorption function of radiating infrared light having a wavelength of 3.5 μm or more. It has a cylindrical shape, and mainly includes a filament 22, a protective tube 24, and filters 26 and 28 concentrically disposed in this order as illustrated in FIG. 9.

The wavelength controlled infrared heater 20 absorbs radiating infrared light having a wavelength of 3.5 µm or more. Here, "having a wavelength of 3.5 µm or more" means that an infrared light transmittance is 50% or less, preferably 40% or less, more preferably 30% or less, in the far-infrared light region of wavelength of 3.5 µm or more.

In detail, because the filters 26 and 28 themselves absorb radiating infrared light having a wavelength of 3.5 µm or more, the filters 26 and 28 are heated by the filament 22 to a high temperature to radiate infrared light having a wavelength longer than those of the infrared light emitted from the filament 22. The wavelength controlled infrared heater 20, however, includes a hollow portion 30 disposed between the filters 26 and 28 to circulate a coolant (such as cooling air) therein. The surface temperatures of the filters 26 and 28 are lowered by such a cooling function to reduce secondary radiation from the filters 26 and 28. As a result, infrared light having a wavelength of 3.5 µm or more, which is mainly absorbed by the transparent substrate, may be decreased. An object to be dried may be selectively irradiated with radiating infrared light having a wavelength 3.5 µm or less absorbed by the solvent to dry the coating solution without deformation of the transparent substrate.

As a material for the filters 26 and 28, there are quartz glass and borosilicate glass. In view of heat resistance and thermal shock resistance, quartz glass is preferable.

The thickness and the number of the filters 26 and 28 may be appropriately determined according to the infrared spectrum as required.

For the cooling function, as described above, two or more filters may be disposed spaced from each other to form one or more hollow portions, through which air is circulated. The filters may be thereby cooled.

The filters 26 and 28 may be concentrically disposed over the overall cylindrical filament 22. Alternatively, as illustrated in FIG. 14, three sides of the filament 22 (and the protective tube 24) may be covered with a reflective plate 32 and the filters 26 and 28 in the form of a plate may be disposed in parallel on the surface radiating infrared light.

In a multi-layer structure composed of the filters 26 and 28 and an additional filter, adjacent hollow portions between these filters preferably have opposite flows of cooling air to enhance the cooling efficiency. The cooling air on the outlet side may be discharged to the outside of the system, or may be used as part of hot air used in the drying step.

According to Wien's displacement law, when the temperature of the filament is increased, a main wavelength of an emitted infrared spectrum becomes 3.5 µm or less which corresponds to the absorption by the solvent. Therefore, the temperature of the filament 22 of the wavelength controlled infrared heater 20 is preferably 6000° C. or more, and 3000° C. or less in view of the heat resistance of the filament 22. The radiation energy in the wavelength region of the light absorbed by the solvent may be increased according to the temperature of the filament. The temperature of the filament may be appropriately determined according to desired application and drying conditions.

The surface temperature of the outermost filter 28 disposed close to the object to be dried is preferably 200° C. or less, more preferably 150° C. or less to reduce secondary radiation caused by absorption of infrared light by the filter itself. The surface temperature of the outermost filter may be controlled by flowing air between the two or more filters disposed.

In the IR drying unit 230, the drying region may be composed of (coated with) a material highly reflective to infrared light, efficiently utilizing the infrared light not absorbed by the object to be dried.

Figure 10:
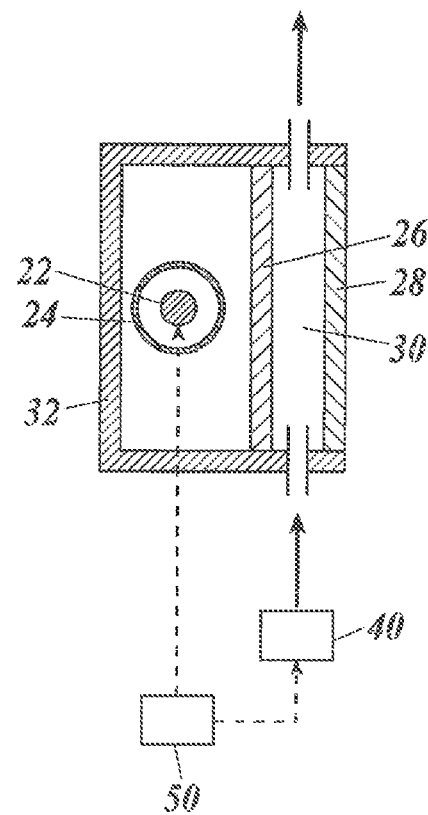
FIG. 10 is a sectional view showing a modification example of a wavelength controlled infrared heater.

As illustrated in FIGS. 9 and 10, the infrared heater 20 is connected to a cooling mechanism 40 to circulate the coolant through the hollow portion 30. The cooling mechanism 40 and the filament 22 are connected to a controller 50. In such a control circuit, the controller 50 controls the volume of the coolant to be fed to the hollow portion 30 from the cooling mechanism 40 and the temperature of the heat generated by the filament 22.

As illustrated in FIG. 8, the photo-curing unit 240 includes transfer rollers 242 and a UV applicator 244. In the photo-curing unit 240, the coating solution dried through irradiation with infrared light is irradiated with ultraviolet light from a UV applicator 244 to be cured, in the midway while the transparent substrate is being transferred through transfer rollers 242.

In the photo-curing unit 240, an electron beam irradiating apparatus may be preferably used instead of the UV applicator 244.

The "ultraviolet light" particularly preferably used is ultraviolet light (UV light) having a wavelength of 150 nm to 230 nm.

The intensity of the radiated ultraviolet light and/or the irradiation time are set in the range not damaging the substrate carrying the coating matter to be irradiated. In a substrate of a plastic film, preferably the distance between the substrate and a lamp is set such that the intensity on the surface of the substrate is 10 to 300 mW/cm$^2$ and the coating matter is irradiated for 0.1 seconds to 10 minutes, preferably 0.5 seconds to 3 minutes.

The UV applicator may be a commercially available lamp (made by Ushio Inc., for example).

The ultraviolet light may be preferably used because the ultraviolet light has larger energy than the interatomic bonding forces of most of the substances and can directly cut the atomic bonds by the action of only photons called photon processing. This action can efficiently reform compounds at low temperature without hydrolysis.

Specific examples of the ultraviolet light sources of the UV applicator 244 for performing the photon processing include noble gas excimer lamps emitting ultraviolet light having a wavelength in the range of 100 to 230 nm.

The atoms of noble gases, such as Xe, Kr, Ar, and Ne, do not form molecules via chemical bonding, and these gases are referred to as inert gases; however, the atoms (excited atoms) of the noble gases given energy by discharge may be bonded to other atoms to form molecules.

Excimer lamps particularly suitable for the present invention are a Xe lamp of 172 nm, and a KrCl lamp of 222 nm. However, the present invention is not limited to them.

In an example where the noble gas is xenon (Xe), excimer light at 172 nm is emitted when an excited excimer molecule Xe$_2$* transits to the ground state as shown in the following reaction formulas.

$$e + Xe \rightarrow Xe^*$$

$$Xe^* + 2Xe \rightarrow Xe_2^* + Xe$$

$$Xe_2^* \rightarrow Xe + Xe + h\nu(172\ nm)$$

The excimer lamp has high efficiency because the excimer lamp mainly radiates at a single wavelength while barely emitting unnecessary light having wavelengths other than the single wavelength. The excimer lamp can keep the target object at a relatively low temperature without emitting unnecessary light. The excimer lamp may be instantaneously turned on/off because it starts and restarts quickly.

Examples of the light sources for efficiently radiating excimer light include dielectric barrier discharge lamps.

The dielectric barrier discharge lamp generates electrical discharge between two electrodes separated by a dielectric substance, and typically includes a discharge container composed of a dielectric substance and at least one of the electrodes externally disposed on the discharge container. In an exemplary dielectric barrier discharge lamp, a double cylindrical discharge container is composed of inner and outer quartz tubes, and contains a noble gas, such as xenon. The discharge container includes a first net electrode externally disposed thereon and a second electrode disposed inside the inner tube. The dielectric barrier discharge lamp generates dielectric barrier discharge inside the discharge container in response to high frequency voltage applied between these electrodes, and generates excimer light during dissociation of the excimer molecules, such as xenon, generated by the discharge.

The excimer lamp can emit light at high efficiency and thus at low electric power. The excimer lamp radiates energy in the ultraviolet light region at a single wavelength without emission of long-wavelength light, which heats the target object; hence, the excimer lamp prevents the target object from being heated by the incident light.

Excimer light emission is attained by dielectric barrier discharge. The dielectric barrier discharge refers to thunder-like microdischarge generated in a gaseous space between electrodes separated by a dielectric substance (transparent quartz in the excimer lamp) through application of a high frequency voltage of tens of kilohertz to the electrodes. The microdischarge disappears if streamers of the microdischarge reach the wall of the tube (dielectric substance) to accumulate charges on the surface of the dielectric substance.

This micro-discharge spreads over the wall of the tube, and repeatedly appears and disappears. Such micro-discharge generates flickering of light visible to the naked eye. Streamers at very high temperatures locally and directly reach the wall of the tube, so that the wall of the tube may be quickly degraded.

Besides dielectric barrier discharge, excimer emission can also be efficiently attained by electrodeless discharge. The electrodeless discharge or radio-frequency (RF) discharge is caused by capacitive coupling. The electrodeless discharge may use the same configuration composed of the same lamp and the same electrodes used in the dielectric barrier discharge. The lamp is activated on in response to a high frequency of several megahertz applied between the electrodes. The electrodeless discharge attains such spatially and temporally homogenous discharge to ensure a prolonged service life of the lamp without flickering.

In dielectric barrier discharge, micro-discharge occurs only between the electrodes. To generate discharge in the overall discharging space, the outer surface of the discharge container should be completely covered with the outer electrode composed of a light transmissive material to extract light to the outside.

For this purpose, the electrode used in dielectric barrier discharge is in the form of a net composed of a thin metal wire. The metal wire of the net electrode should be as thin as possible not to block light. Such a net electrode is readily damaged by ozone generated by ultraviolet light in an oxygen atmosphere.

To prevent such damage, the surrounding region of the lamp, namely, the inside of the irradiation apparatus containing the lamp should be placed under an atmosphere of an inert gas, such as nitrogen, and a window composed of synthetic quartz should be provided to extract radiant light. The window composed of synthetic quartz is an expensive consumable part, and causes loss of light.

In a double cylindrical lamp having an outer diameter of about 25 mm, the difference in the traveling distance from the surface of the lamp to the target surface under the lamp is significantly large between the lights perpendicularly incident on the target surface and the lights obliquely incident on the target surface, causing a great difference in illuminance. No homogenous illuminance distribution is also attained even if the lamps are closely aligned. An irradiating apparatus equipped with a window composed of synthetic quartz can provide a fixed radiation distance of the lights in the oxygen atmosphere to attain a homogenous illuminance distribution.

No external net electrode is required in an electrodeless discharge mode. An external electrode may be disposed on part of the outer surface of the lamp to attain glow discharge spreading over the entire discharging space. Typically, the external electrode composed of an aluminum block and also serving as a light-reflecting plate is disposed on the back of the lamp. The lamp has a large outer diameter as in the lamp in the dielectric barrier discharge mode, and needs a synthetic-quartz window to attain a homogenous illuminance distribution.

A thin tubular excimer lamp has a simple structure. The thin tubular excimer lamp is composed of only a quartz tube having closed ends and a gas for excimer emission encapsulated inside the tube.

The thin tubular excimer lamp has an outer diameter of about 6 nm to 12 mm. A lamp having a significantly large outer diameter needs high starting voltage.

The thin tubular excimer lamp can discharge in a dielectric barrier discharge mode or an electrodeless discharge mode. The thin tubular excimer lamp may have an electrode having a flat surface in contact with the lamp. An electrode having a curved surface along the lamp can firmly fix the lamp, and be in tight contact with the lamp to continue stable discharge. A mirror electrode having a curved surface finished with aluminum also serves as a light-reflecting plate.

A xenon excimer lamp, which radiates ultraviolet light having a single short wavelength of 172 nm, has high luminescence efficiency. This ultraviolet light has a large absorption coefficient to oxygen, and can generate a high concentration of radical atomic oxygen species and ozone from a slight amount of oxygen.

The ultraviolet light having a short wavelength of 172 nm has high energy which can dissociate bonds of organic substances.

The activated oxygen or ozone and high energy of ultraviolet light radiation can achieve a reaction in a short time.

Accordingly, the ultraviolet light having a higher throughput than those of light of low pressure mercury lamps and plasma emitting light at wavelengths of 185 nm and 254 nm, respectively, can shorten the treatment time, can reduce the facility in size, and can be applied to irradiation of organic materials and plastic substrates susceptible to thermal degradation.

The excimer lamp can generate light at high efficiency and thus can be activated at low electricity. The excimer lamp radiates energy in the ultraviolet light region at a single wavelength without emitting long wavelength light, which heats the target object; hence, the excimer lamp prevents the target object from being heated by the light emitted onto the object. Such advantages of ultraviolet light are suitable for flexible film materials, such as PET.

Higher irradiation intensity can increase the probability of photon bombardment on chemical bonds of compounds in the coating solution to shorten the time for a reforming reaction. Higher irradiation intensity can also increase the number of photons intruding into the target layer to increase the modifiable thickness of the target layer to be reformed and/or enhance the quality (density) of the layer.

A significantly long irradiation time may damage the flatness of the target layer or other materials. The progress of the reaction is usually controlled based on the accumulated light amount expressed as a product of the irradiation intensity by the irradiation time; however, the absolute value of the irradiation intensity may be important in materials having the same composition but different structures, such as silicon oxide.

<Irradiation Intensity of Ultraviolet Light>

Accordingly, it is preferred in the photo-curing unit 240 that a reforming treatment with ultraviolet light be performed at least once at a maximum irradiation intensity of 100 to 200 mW/cm$^2$ to prevent damage of the substrate, the lamp, and lamp accessories.

<Irradiation Time of Ultraviolet Light>

Irradiation with ultraviolet light may be performed for any period of time. To prevent damage of the substrate and defects generated in one or more layers on the substrate, the time for the irradiation step at high illuminance is preferably 0.1 seconds to 3 minutes, more preferably 0.5 seconds to 1 minute.

<Oxygen Level During Irradiation with Ultraviolet Light>

The oxygen level during irradiation with vacuum ultraviolet light (VUV) is preferably 500 to 10000 ppm (1%), more preferably 1000 to 5000 ppm.

An oxygen level controlled within this range does not significantly prolong the time for replacement of an atmosphere in a vacuum ultraviolet light (VUV) irradiation chamber with the air. An oxygen level within this range can also prevent an increase in the amount of air (including oxygen) intruding into the vacuum ultraviolet light (VUV) irradiation chamber through web transfer in continuous production using a roll-to-roll process and the resulting unsuccessful control of the oxygen level.

The present inventor, who has conducted research, has found that oxygen and a slight amount of moisture are spontaneously mixed with the coating solution during application thereof, and the transparent substrate also has adsorbed oxygen and water. The inventor has concluded that the vacuum ultraviolet light (VUV) irradiation chamber already has a sufficient oxygen source essential for the reforming reaction without additional feed of oxygen.

In irradiation with VUV light in an atmosphere containing a large amount (several percent) of oxygen gas, the coating solution disadvantageously contains excess oxygen.

As described above, oxygen absorbs the vacuum ultraviolet light (VUV) at 172 nm to reduce the amount of the vacuum ultraviolet light (VUV) at 172 nm reaching the surface of the coating solution, and in turn the efficiency of the treatment.

Namely, the irradiation with vacuum ultraviolet light (VUV) is preferably performed in a minimum oxygen level so that VUV light is efficiently incident on the coating matter.

This control of the oxygen level is specific to the coating process under atmospheric pressure to form and reform a precursor layer, and significantly differs from an atomic deposition process to deposit a composition containing components in a preliminarily controlled proportion to form a layer, such as chemical vapor deposition (CVD).

In the irradiation with vacuum ultraviolet light (VUV), gases other than oxygen are preferably dry inert gases, in particular dry nitrogen gas in view of cost. The oxygen level may be controlled by measuring the flow rates of the oxygen gas and the inert gas to be introduced into the irradiation chamber and varying the ratio of these flow rates.

As illustrated in FIG. 8, the inkjet coating unit 250 has the same configuration and function as those of the inkjet coating unit 220. A coating solution from an inkjet head 256 is applied onto a transparent substrate supported on a platen 254 into a predetermined pattern in the midway while the transparent substrate is being transferred through transfer rollers 252.

The IR drying unit 260 has the same configuration and function as those of the IR drying unit 230. The applied patterned coating solution is irradiated with infrared light from an infrared heater 264 to be dried, in the midway while the transparent substrate is being transferred through transfer rollers 262. The infrared heater 264 is identical to the infrared heater 20.

The photo-curing unit 270 has the same configuration and function as those of the photo-curing unit 240. The coating solution dried through irradiation with infrared light is irradiated with ultraviolet light from an UV applicator 274 to be cured, in the midway while the transparent substrate is being transferred through transfer rollers 272. The UV applicator 274 is the same as the UV applicator 244.

The transfer unit 280 has the same configuration and function as those of the transfer unit 210. The transparent substrate is transferred through transfer rollers 282 under an adjusted tension applied to the transparent substrate, and is wound around the take-up roll 204.

(3.5.2) Manufacturing Method

A light scattering layer 2a is formed on a transparent substrate 13, and a smoothing layer 2b is then formed on the light scattering layer 2a.

(3.5.2.1) Light Scattering Layer

In the step of forming the light scattering layer 2a, the light scattering layer 2a is formed mainly through the following steps (i) to (iii):

Step (i): applying a predetermined coating solution onto the transparent substrate 13 into a predetermined pattern, Step (ii): drying the applied patterned coating solution, and Step (iii): curing the dried coating solution.

In Step (i) (application and pattering step), light scattering particles having an average particle size of 0.2 to 1 µm and a refractive index of 1.7 to 3.0 at wavelength 550 nm are dispersed in a hydroxy-containing solvent to prepare a resin material dispersion. This coating solution is applied onto the transparent substrate 13.

In this case, in the inkjet coating unit 220, the coating solution is applied by inkjet coating into a predetermined pattern.

<<Coating Solution>>

The light scattering particles are dispersed in a matrix resin (polymer) solution (the light scattering particles are insoluble in the solvent), and the resulting coating solution is used.

The light scattering particles are actually polydisperse particles, which are difficult to regularly arrange. Such light scattering particles are not regularly distributed and thus change the direction of light by scattering to enhance outcoupling efficiency irrespective of the local diffraction effect.

Any known resin (binder) may be used without specific limitation in the present invention. Examples of the binder include resin films, such as acrylic esters, methacrylic esters, poly(ethylene terephthalate) (PET), poly(butylene terephthalate), poly(ethylene naphthalate) (PEN), polycarbonates (PCs), polyarylates, poly(vinyl chloride) (PVC), polyethylene (PE), polypropylene (PP), polystyrene (PS), nylon (Ny), aromatic polyamides, polyether ether ketones, polysulfone, polyether sulfones, polyimides, and polyetherimides; a heat-resistant transparent film having a basic skeleton of silsesquioxane having an organic-inorganic hybrid structure (product name: Sila-DEC, made by Chisso Corporation); silane compounds containing a perfluoroalkyl group (such as (heptadecafluoro-1,1,2,2-tetradecyl)triethoxysilane); and fluorine-containing copolymers composed of fluorine-containing monomers and crosslinkable monomers. These resins may be used in combination. Among these resins, preferred are resins having organic-inorganic hybrid structures.

Hydrophilic resins may also be used. The hydrophilic resins include water-soluble resins, water-dispersible resins, colloidal dispersion resins, and mixtures thereof. Examples of the hydrophilic resins include acrylic, polyester, polyamide, polyurethane, and fluorinated resins, and specific examples include polymers, such as poly(vinyl alcohol), gelatin, poly(ethylene oxide), poly(vinyl pyrrolidone), casein, starch, agar, carrageenan, polyacrylic acid, polymethacrylic acid, polyacrylamide, polymethacrylamide, poly(styrenesulfonate), cellulose, hydroxylethyl cellulose, carboxylmethyl cellulose, hydroxylethyl cellulose, dextran, dextrin, pullulan, and water-soluble poly(vinyl butyral). Among these polymers, preferred is polyvinyl alcohol.

These polymers usable for the binder resins may be used alone or in combination.

Known resin particles (emulsions) may also be suitably used.

In addition, resins curable by ultraviolet light or electron beams (i.e., mixtures of ionizing radiation-curable resins, thermoplastic resins, and solvents) and thermosetting resins may also be suitably used as the binder.

Binder resins of this type are preferably polymers having saturated hydrocarbon or polyether in the main chain, and more preferably polymers having saturated hydrocarbon in the main chain.

The binder is preferably crosslinked. The polymers having saturated hydrocarbon in the main chain are preferably prepared through a polymerization reaction of ethylenically unsaturated monomers. The crosslinked binder is preferably prepared with a monomer having two or more ethylenically unsaturated groups.

In the present invention, compounds which can form metal oxides, metal nitrides, or metal oxide nitrides by irradiation with ultraviolet light under a specific atmosphere may be particularly suitably used. The compounds suitable for the present invention are preferably compounds that may be reformed at relatively low temperature, which are described in JP-A No. H8-112879.

Specific examples of such compounds include polysiloxanes having Si—O—Si bonds (including polysilsesquioxane), polysilazanes having Si—N—Si bonds, and polysiloxazanes having both Si—O—Si bonds and Si—N—Si bonds. These compounds may be used in combination. Two or more different compounds may be sequentially or simultaneously deposited.

These polysiloxanes (including polysilsesquioxane), polysilazanes, and polysiloxazanes are the same as described in the barrier layer of the transparent substrate.

It is should noted that the solvent used in the coating solution contains hydroxy groups (—OH groups).

A solvent containing —OH groups significantly enhances the dispersion of the light scattering particles (high-refractive index particles), enhances the adhesion of the coating solution to the transparent substrate, and facilitates the application of the coating solution. The outcoupling efficiency is also enhanced although the reason is unclear. In the present invention, a solvent efficiently absorbing light in the infrared wavelength region, which is barely absorbed by the flexible transparent substrate, can achieve high speed drying of the coating solution applied on to the flexible transparent substrate.

The present invention is characterized by a coating solution including a solvent containing —OH groups. The solvent containing —OH groups is contained in a proportion of preferably 10% or more, more preferably 50% or more, still more preferably 60% or more, particularly preferably 70% or more.

In the present invention, the coating solution preferably contains at least one solvent having a boiling point of preferably 120 to 250° C., more preferably 150 to 200° C. Among these solvents, particularly preferred are solvents having boiling points of 150 to 200° C. and containing —OH groups. Preferably, the coating solution does not contain any solvent having a boiling point of 150° C. or more but containing no —OH group. It should be noted that the proportion of such a solvent, if contained in the coating solution, is less than 30%, more preferably less than 20%, particularly preferably less than 10%.

Examples of the solvent containing —OH groups include water, methanol, ethanol, n-propanol, isopropanol, butanol, n-amyl alcohol, sec-amyl alcohol $CH_3CH_2CH_2CH(OH)CH_3$, 3-pentanol $CH_3CH_2CH(OH)CH_2CH_3$, 2-methyl-1-butanol $CH_3CH_2CH(CH_3)CH_2OH$, 3-methyl-1-butanol (isoamyl alcohol) $CH_3CH(CH_3)CH_2CH_2OH$, 2-methyl-2-butanol (tert-amyl alcohol) $CH_3CH_2C(CH_3)_2OH$, 3-methyl-2-butanol $CH_3CH(CH_3) CH(OH) CH_3$, and 2,2-dimethyl-1-propanol. Further examples of the solvents include polyhydric alcohol derivatives, such as ethylene glycol monomethyl ether (methyl cellosolve), ethylene glycol monoethyl ether (ethyl cellosolve), ethylene glycol monobutyl ether (butyl cellosolve), propylene glycol monomethyl ether, propylene glycol monoethyl ether, and propylene glycol monobutyl ether.

Examples of the usable solvent include ethylene glycol monoisopropyl ether, ethylene glycol dimethyl ether, ethylene glycol diethyl ether, ethylene glycol monomethoxymethyl ether, diethylene glycol, diethylene glycol monomethyl ether, diethylene glycol monoethyl ether, diethylene glycol monobutyl ether, triethylene glycol, triethylene glycol monomethyl ether, triethylene glycol monoethyl ether, triethylene glycol monobutyl ether, tetraethylene glycol, tetraethylene glycol monobutyl ether, propylene glycol, propylene glycol monomethyl ether, propylene glycol monoethyl ether, propylene glycol monopropyl ether, propylene glycol monobutyl ether, propylene glycol monomethyl ether acetate, dipropylene glycol, dipropylene glycol monomethyl ether, dipropylene glycol monoethyl ether, dipropylene glycol monopropyl ether, dipropylene glycol monobutyl ether, dipropylene glycol monomethyl ether acetate, tripropylene glycol, tripropylene glycol monomethyl ether, tripropylene glycol monoethyl ether, tripropylene glycol monobutyl ether, 1,3-propanediol, 2-methyl-1,3-propanediol, 2,2-dimethyl-1,3-propanediol, 2-amino-2-methyl-1,3-propanediol, 1,4-butanediol, 1,3-butanediol, 1,2-butanediol, 2,3-butanediol, 3-methyl-1,3-butanediol, 1,2-pentanediol, 1,5-pentanediol, 2-methyl-2,4-pentanediol, 3-methyl-1,5-pentanediol, 1,2-hexanediol, 1,6-hexanediol, 2-ethyl-1,3-hexanediol, 2,5-dimethyl-2,5-hexanediol, polypropylene glycol monomethyl ether, glycerol, monoacetin, trimethylolethane, trimethylol propane, and 2-phenoxyethanol.

Another examples of the solvent usable include 1-butanol, 2-butanol, isobutanol, t-butanol, 3-methoxy-1-butanol, 3-methyl-3-methoxybutanol, 1-pentanol, 1-octanol, 2-octanol, n-nonyl alcohol, tridecyl alcohol, n-undecyl alcohol, stearyl alcohol, oleyl alcohol, benzyl alcohol, 4-hydroxy-2-butanone, diacetone alcohol, monoethanolamine, 2-aminoethanol, N-methylethanolamine, dimethylethanolamine, diethylethanolamine, N-n-butylethanolamine, 2-dibutylaminoethanol, 2-diisopropylaminoethanol, N-methyl-diethanolamine, diethanolamine, 2,2'-(n-ethyl)iminodiethanol, 2,2'-(n-butyl)iminodiethanol, triethanolamine, 2-amino-2-methyl-1-propanol, and 3-amino-1-propanol.

In Step (i) (application and patterning step), the patterning may be performed by any known printing method. A variety of methods, such as gravure printing, flexo printing, screen printing, microcontact printing, and inkjet printing, may be suitably used. Most preferred is inkjet printing not using any printing plate.

In Step (ii) (drying step), in the IR drying unit 230, the applied patterned coating solution is dried with an infrared heater 20 which absorbs an infrared light having a wavelength of 30.5 μm or more by irradiation of infrared light.

It is irradiated with an infrared light having a center wavelength in the region of 1 to 3.5 μm and existing 70% or more of the output power of the integrated value in that region.

"An infrared light having a center wavelength in the region of 1 to 3.5 μm" indicates that the filament temperature is in the range of 450° C. to 2600° C. This range of temperature is derived by Wien's displacement law.

The drying step may be performed on any condition. The irradiation time may be controlled by varying the surface temperatures of the filament 22 and the filters 26 and 28. For example, the drying step may be performed for an irradiation time of 10 seconds to 30 minutes if the temperature of the filament 22 is 450 to 2600° C. (preferably 600 to 1200° C.) and the surface temperatures of the filters 26 and 28 is less than 200° C. (preferably less than 150° C.). Such a drying step achieves a light scattering layer 2a having high uniformity of the thickness distribution and high patterning accuracy.

In Step (iii) (curing step), in the photo-curing unit 240, the dried coating solution is irradiated with light to be cured.

The ionizing radiation-curable resin composition as a binder in the coating solution may be cured by a standard process of curing an ionizing radiation-curable resin composition, i.e., irradiation with electron beams or ultraviolet light.

Curing with electron beams is performed with electron beams having an energy of 10 to 1000 keV, preferably 30 to 300 keV emitted from a variety of electron beam accelerators, such as accelerators of a Cockcroft-Walton type, a Van de Graaff type, a resonant type, an insulating core transformer type, a linear type, a dynamitron type, and a high frequency type. Among these accelerators, particularly preferred are electron beams having weak intensity. An electron beam source "EB Engine" made by Hamamatsu Photonics K.K. may be particularly preferably used.

Curing with ultraviolet light may be performed with ultraviolet light emitted from ultra-high pressure mercury lamps, high pressure mercury lamps, low pressure mercury lamps, carbon arc lamps, xenon arc lamps, and metal halide lamps. Preferred is use of ultraviolet light from an excimer lamp as described above.

(3.5.2.2) Smoothing Layer

In the step of forming the smoothing layer 2b, the smoothing layer 2b is formed through Steps (iv) to (vi) similarly to the formation of the light scattering layer 2a.

Step (iv): applying a predetermined coating solution onto a transparent substrate 13 into a predetermined pattern in the inkjet coating unit 250, Step (v): drying the applied patterned coating solution in the IR drying unit 260, and Step (vi): curing the dried coating solution in the photo-curing unit 270.

Step (iv) (applying and patterning step) may be performed with the same coating solution as in Step (i) described above. A coating solution having the same composition may be used in Steps (i) and (iv), or a coating solution having different compositions may be used in Steps (i) and (iv).

In a preferable embodiment of the present invention, the elastic modulus of the smoothing layer is larger than that of the light scattering layer, and the elastic modulus of the smoothing layer is near to that of the gas barrier layer. Form this viewpoint, the smoothing layer is preferably made of an organic-inorganic hybrid material. It is preferable that the inorganic element ratio is 50% or more, more preferably 70% or more, and still more preferably 80% or more. Further, it is preferable that the used binder is also an organic-inorganic hybrid binder. Specific examples of such compounds include: polysiloxane (including polysilsesquioxane), polysilazane having a Si—N—Si bond, and polysiloxazane having both a Si—O—Si bond and a Si—N—Si bond. In particular, it is preferable that these structures are included in the molecule in an amount of 50% or more, more preferably 70% or more, and still more preferably 80% or more.

In the formation of the internal light extracting layer, Steps (iii) and (vi) (curing) are not always essential, and one or both of Steps (iii) and (vi) may be omitted.

(4) Transparent Metal Electrode

As an anode in an organic light-emitting element, it is preferably used a metal having a large work function (4 eV or more), an alloy, a electric conductive compound, and a mixture thereof.

The transparent metal electrode 1 illustrated in FIG. 4 has a two-layer structure of a laminate of an undercoat layer 1a and an electrode layer 1b sequentially disposed on the transparent substrate 13. Among these layers, the electrode layer 1b is composed of silver or an alloy mainly composed of silver, and the undercoat layer 1a is composed of a compound containing a nitrogen atom, for example.

The transparency of the transparent metal electrode 1 indicates that the transmittance of light at a wavelength of 550 nm is 50% or more.

(1) Undercoat Layer

The undercoat layer 1a is disposed on the transparent substrate 13 side of the electrode layer 1b. The undercoat layer 1a may be prepared with any material to inhibit aggregation of silver particles during formation of the electrode layer 1b composed of silver or an alloy mainly composed of silver. Examples of such a material include compounds containing a nitrogen atom.

In an undercoat layer 1a composed of a low-refractive index material (refractive index: less than 1.7), the upper limit of the thickness should be less than 50 nm, and it is preferably less than 30 nm, more preferably less than 10 nm, particularly preferably less than 5 nm. A thickness of less than 50 nm minimizes optical loss. The lower limit of the thickness should be 0.05 nm or more, and it is preferably 0.1 nm or more, particularly preferably 0.3 nm or more. A thickness of 0.05 nm or more can attain a homogenous undercoat layer 1a to uniformly inhibit aggregation of silver particles.

In an undercoat layer 1a composed of a high-refractive index material (refractive index: 1.7 or more), the thickness has any upper limit, and the lower limit of the thickness is the same as in the low-refractive index material.

Only one requirement for the undercoat layer 1a is that a selected thickness of the undercoat layer attains a homogenous layer.

In another preferred aspect, the undercoat layer 1a also serves as the smoothing layer 1b. In this case, two requirements for design of the undercoat layer 1a should be compatible, that is, a material for the undercoat layer can ensure the surface smoothness required for the smoothing layer 1b and simultaneously can demonstrate the function as the undercoat layer 1a of the electrode.

In this case, the configuration of the internal light extracting layer 2 and the transparent metal electrode 1 may be composed of the light scattering layer 2a, the undercoat layer 1a, and the electrode layer 1b sequentially disposed on the transparent substrate 13 (no smoothing layer 2b), or may be composed of the light scattering layer 2a, the smoothing layer 2b, the electrode layer 1b, and the undercoat layer 1a sequentially disposed on the transparent substrate 13 (not illustrated in the figure).

In the configuration composed of a monolayer of the undercoat layer 1a also functioning as the smoothing layer 1b, the undercoat layer 1a preferably has a thickness of the smoothing layer 1b.

Examples of the method of forming the undercoat layer 1a include wet processes, such as application, ink jetting, coating, and dipping, and dry processes, such as deposition processes (e.g., resistive heating deposition and electron beam (EB) deposition), sputtering, and chemical vapor deposition (CVD). Among these processes, preferably used are deposition processes.

The undercoat layer 1a may be prepared with any compound containing a nitrogen atom in the molecule. Preferred is a compound having a heterocycle containing a nitrogen heteroatom. Examples of the heterocycle containing a nitrogen heteroatom include aziridine, azirine, azetidine, azete, azolidine, azole, azinane, pyridine, azepane, azepine, imidazole, pyrazole, oxazole, thiazole, imidazoline, pyrazine, morpholine, thiazine, indole, isoindole, benzoimidazole, purine, quinoline, isoquinoline, quinoxaline, cinnoline, pteridin, acridine, carbazole, benzo-C-cinnoline, porphyrin, chlorin, and choline.

(4.2) Electrode Layer
(4.2.1) Constitution of Electrode Layer

All of the electrode materials which may be used for a usual organic light-emitting element may be used for the electrode layer. Specific examples are: aluminum, silver, magnesium, lithium, magnesium/copper mixture, magnesium/silver mixture, magnesium/aluminum mixture, magnesium/indium mixture, indium, lithium/aluminum mixture, rare earth metals, and oxide semiconductors such as ITO, ($SnO_2$-$Inc_2O_3$, indium tin oxide), ZnO, $TiO_2$, and $SnO_2$.

The electrode layer is preferably composed of silver or an alloy mainly composed of silver, and it is a layer disposed on the undercoat layer 1a. When it is the electrode composed of silver or an alloy mainly composed of silver, it may be made into a thin and flexible film, and cracking resistance of the electrode will be increased.

Examples of the method of forming such an electrode layer 1b include wet processes, such as application, ink jetting, coating, and dipping, and dry processes, such as deposition processes (e.g., resistive heating deposition and electron beam (EB) deposition), sputtering, and chemical vapor deposition (CVD). Among these processes, preferably used are deposition processes.

Although the electrode layer 1b deposited on the undercoat layer 1a has sufficient conductivity without annealing at high temperature after deposition, the deposited electrode layer 1b may be annealed at high temperature after deposition if necessary.

Examples of an alloy containing silver (Ag) as a main component and constituting the electrode layer 1b are: silver magnesium (AgMg), silver copper (AgCu), silver palladium (AgPd), silver palladium copper (AgPdCu), and silver indium (AgIn).

The above-described electrode layer 1b may have a constitution in which plural layers are laminated, each layer being made of silver or containing silver as a main component.

A thickness of the electrode layer 1b is preferably in the range of 4 to 9 nm. When the thickness is smaller than 9 nm, an absorbing component or a reflection component of the layer becomes small, and transmittance of the transparent metal electrode becomes large. When the thickness is larger than 4 nm, conductivity of the layer may be sufficiently secured.

The transparent metal electrode 1, which has a laminated structure made of the undercoat layer 1a formed thereon the electrode layer 1b, may be covered with a protective layer on the upper portion of the electrode layer 1b, or may be laminated with other electrode layer. In this case, it is preferable that the protective layer or the other electrode layer has a light transmitting property in order to avoid deterioration of light transmitting property of the transparent metal electrode 1.

(4.2.2) Effect of Transparent Metal Electrode

The transparent metal electrode 1 having a constitution as described above has a constitution in which an electrode layer 1b composed of silver or an alloy containing silver as a main component is provided on an undercoat layer 1a formed by using a nitrogen containing compound. By this constitution, silver atoms composing the electrode layer 1b will interact with the nitrogen containing compound composing the undercoat layer 1a. As a result, the silver atom will decrease its diffusion distance on a surface of the undercoat layer 1a, and aggregation of silver atoms will be prevented.

Here, in the film formation of the electrode layer 1b made of silver as a main component, increase of film formation is done with a nucleus growth type (Volumer-Weber: VM type). The silver grains tend to be isolated, and it is difficult to obtain conductivity when the thickens is small. The sheet resistivity will become high. Therefore, it is necessary to increase the thickness to secure the conductivity. When the thickness is increased, the light transmitting property will be decreased. This is not appropriate for the transparent metal electrode.

However, in the transparent metal electrode 1, aggregation of silver atoms will be prevented on the undercoat layer 1a as described above. As a result, increase of film formation is done with a mono-layer growth type (Frank-van der Merve: FM type) in the film formation of the electrode 1b composed of silver or an alloy containing silver as a main component.

Here, "transparency" of the transparent metal electrode 1 indicates a property that a light transmittance at a wavelength of 550 nm is 50% or more. The above-described materials used for the undercoat layer 1*a* is sufficiently transparent compared with the electrode layer 1*b* made of silver or an alloy containing silver as a main component, and forms a preferable film. On the other hand, the conductivity of the transparent metal electrode 1 is secured mainly by the electrode layer 1*b*. Consequently, the electrode layer 1*b* made of silver or an alloy containing silver as a main component secures conductivity with a thinner layer. Thus, it is possible to achieve improvement of both conductivity and light transmittance of the transparent metal electrode 1.

(5) Organic Light-Emitting Layer (5.1) Light-Emitting Layer

Organic light-emitting layer 103 includes at least a light-emitting layer 103*c*.

A light-emitting layer 103*c* used in the present invention preferably contains a phosphorescence emitting compound as a light-emitting material. It may contain a fluorescent material as a light-emitting material, or it may contain a combination of a phosphorescence emitting compound and a fluorescent material.

This light-emitting layer 103*c* is a layer in which electrons injected from the electrode or the electron transport layer 103*d* and holes injected from the hole transport layer 103*b* are recombined to emit light. The light-emitting portion may be inside of the light-emitting layer 103*c*, or may be at an interface between the light-emitting layer 103*c* and the adjacent layer thereto.

The constitution of the light-emitting layer 103*c* is not specifically limited as long as the contained light-emitting material satisfies the light-emitting requirement. It may be composed of a plurality of layers having the same light-emitting spectrum or the same maximum wavelength. In this case, it is preferable that a non-light-emitting intermediate layer (not shown in the figure) is contained between each light-emitting layer 103*c*.

A total thickness of the light-emitting layer 103*c* is preferably in the range of 1 to 100 nm, more preferably in the range of 1 to 30 nm in order to achieve a lower driving voltage.

Here, the total thickness of the light-emitting layer 103*c* indicates a thickness including the intermediate layer when there is a non-light emitting intermediate layer among the light-emitting layer 103*c*.

When the constitution of the light-emitting layer 103*c* is made by laminating plural layers, it is preferable that each light-emitting layer is adjusted to have a thickness in the range of 1 to 50 nm, more preferably, in the range of 1 to 20 nm. When the laminated plural light-emitting layers each correspond to an emitting light of blue, green and red, there is no specific limitation to the relationship of the thickness of each light-emitting layer of blue, green and red.

The above-described light-emitting layer 103*c* may be formed by using known light-emitting material or host compounds with known thin film forming methods such as: a vapor deposition method, a spin coating method a cast method, an LB method, and an inkjet method.

It will be described a light-emitting dopant (it is also called as a light-emitting dopant compound) and a host compound contained in the light-emitting layer.

(5.1.1) Host Compound (Also Referred to as a Light-Emitting Host)

"A host compound" as described in the present invention, is defined as a compound, incorporated in a light-emitting layer, which results in a weight ratio of at least 20% in the above layer and also results in a phosphorescent quantum yield of the phosphorescence emission of less than 0.1 at room temperature (25° C.). Preferably, the phosphorescent quantum yield is less than 0.01. Further, among the compounds incorporated in the light-emitting layer, it is preferable that the weight ratio of the host compound in the aforesaid layer is at least 20%.

It may be used a known host compound singly or it may be used in combination with a plurality of known host compounds. It is possible to control the transfer of charges by making use of a plurality of host compounds, which results in high efficiency of an organic light-emitting element. In addition, it is possible to mix a different emission lights by making use of a plurality of light-emitting dopants which will be described later. Any required emission color may be obtained thereby.

Further, a light-emitting host used in the present invention may be either a low molecular weight compound or a polymer compound having a repeating unit, in addition to a low molecular weight compound provided with a polymerizing group such as a vinyl group and an epoxy group (a polymerizable light-emitting host). These compounds may be used singly or in combination of two or more compounds.

As a known host compound which may be used together, preferable is a compound having properties of hole transport ability and electron transport ability, and at the same time, preventing longer wavelength of emitted light and having a high Tg (glass transition temperature).

As specific examples of a host compounds, the compounds described in the following documents are preferable.

For example, JP-A Nos. 2001-257076, 2002-308855, 2001-313179, 2002-319491-2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084 and 2002-308837.

A light-emitting dopant used in the present invention will be described.

From the viewpoint of obtaining an organic light-emitting element with a high emission efficiency, it is preferable that a light-emitting layer of an organic light-emitting element of the present invention contains the above-described host compound and, at the same time, a phosphorescent dopant.

(5.1.2) Phosphorescent Dopant

The phosphorescent dopant of the present invention is a compound, wherein emission from an excited triplet state thereof is observed, specifically, emitting phosphorescence at room temperature (25° C.) and exhibiting a phosphorescence quantum yield of at least 0.01 at 25° C. The phosphorescence quantum yield is preferably at least 0.1.

The phosphorescence quantum yield can be determined via a method described in page 398 of Bunko II of Dai 4 Han Jikken Kagaku Koza 7 (Spectroscopy II of 4th Edition Lecture of Experimental Chemistry 7) (1992, published by Maruzen Co., Ltd.). The phosphorescence quantum yield in a solution can be determined using appropriate solvents. However, it is only necessary for the phosphorescent dopant of the present invention to exhibit the above phosphorescence quantum yield (0.01 or more) using any of the appropriate solvents.

Two kinds of principles regarding emission of a phosphorescent dopant are cited. One is an energy transfer-type, wherein carriers recombine on a host compound on which the carriers are transferred to produce an excited state of the host compound, and then via transfer of this energy to a phosphorescent dopant, emission from the phosphorescence-emitting dopant is realized. The other is a carrier trap-type, wherein a phosphorescence-emitting dopant serves as a carrier trap and then carriers recombine on the phosphorescent dopant to generate emission from the phosphorescent dopant. In each case, the excited state energy level of the phosphorescent dopant is required to be lower than that of the host compound.

A phosphorescent dopant usable in the present invention may be selected from the known compounds used in the light-emitting layers of the organic light-emitting elements.

Examples of a phosphorescent dopant used in the present invention are metal complexes containing a metal belonging to groups 8 to 10 in the periodic table. Preferable are an iridium compound, an osmium compound, a platinum compound (platinum complex compound), or a rare earth complex. Among them, most preferable is an iridium compound.

Specific examples of a phosphorescent dopant are described in the following, however, the present invention is not limited to them.

D-1

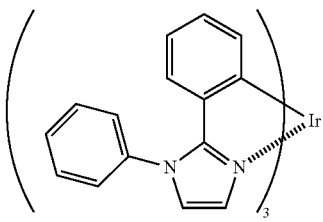

D-2

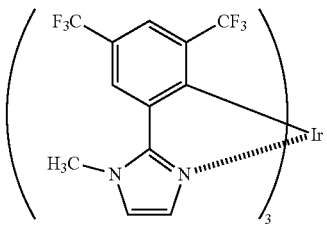

D-3

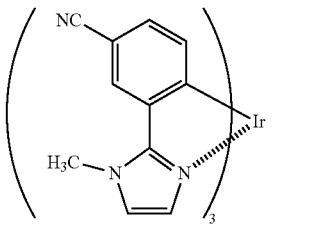

D-4

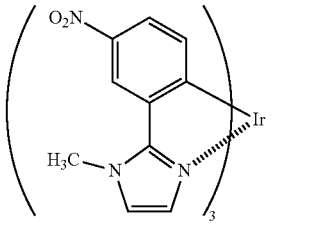

-continued

D-5

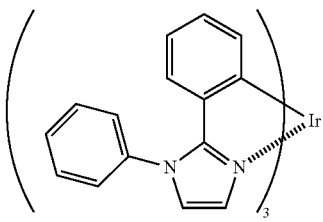

D-6

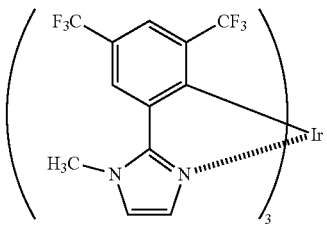

D-7

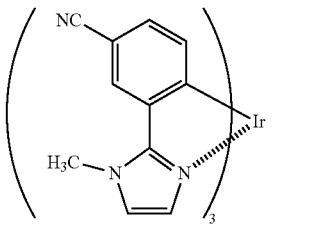

D-8

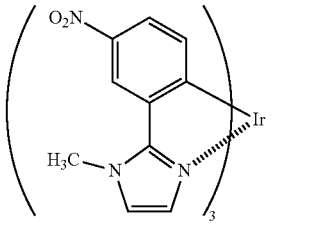

D-9

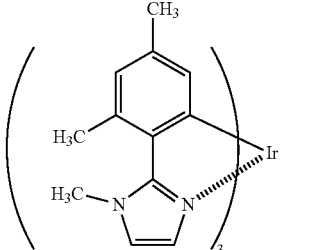

D-10

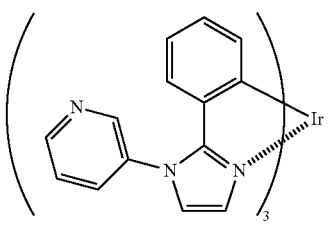

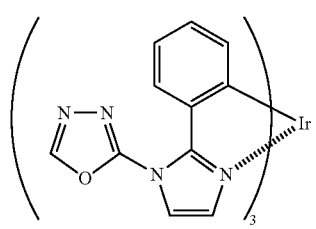 D-11
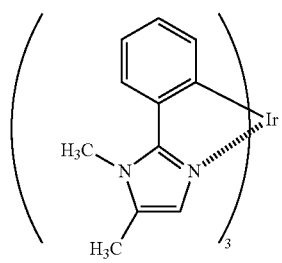 D-12
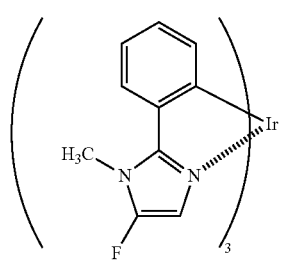 D-13
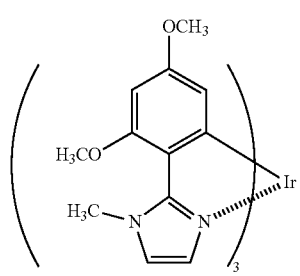 D-14
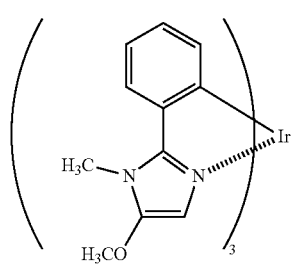 D-15
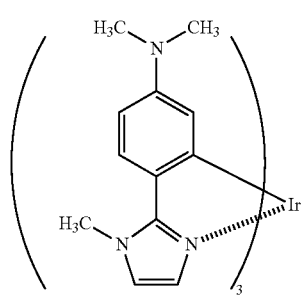 D-16
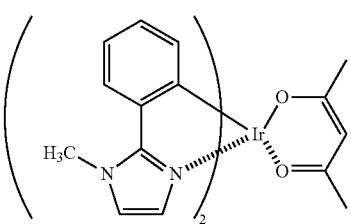 D-17
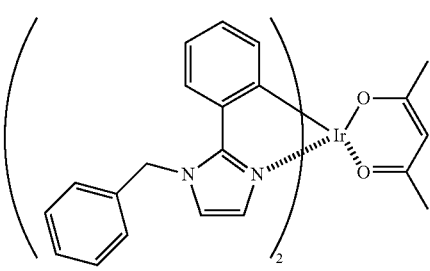 D-18
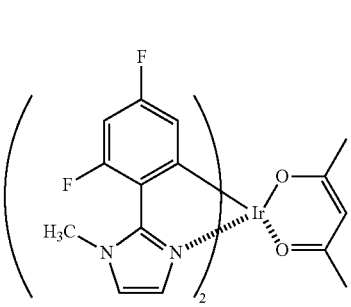 D-19
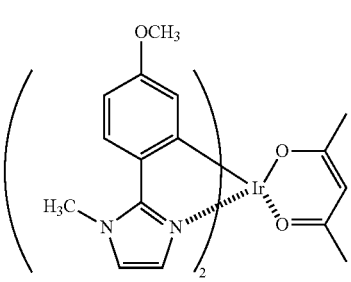 D-20
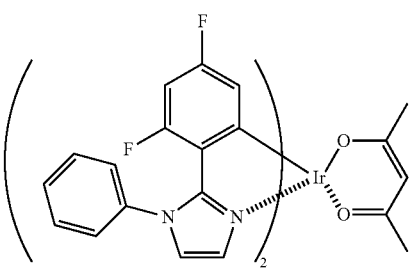 D-21
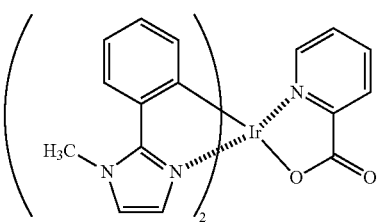 D-22

D-23 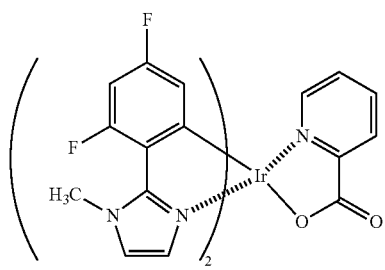
D-24 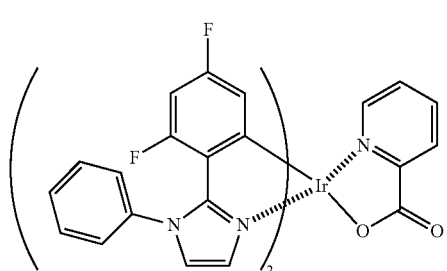
D-25 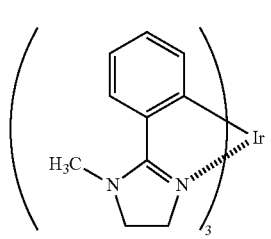
D-26 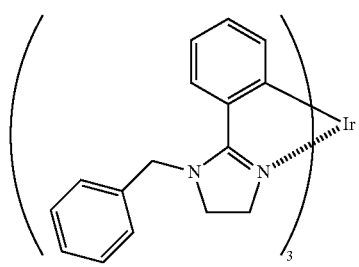
D-27 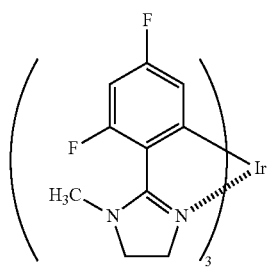
D-28 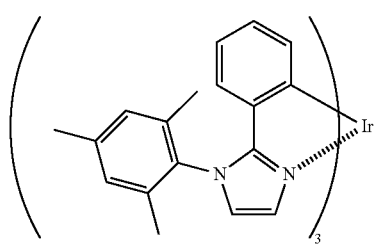
D-29 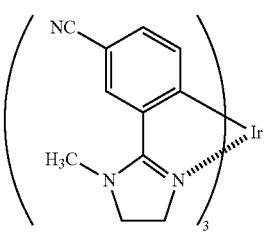
D-30 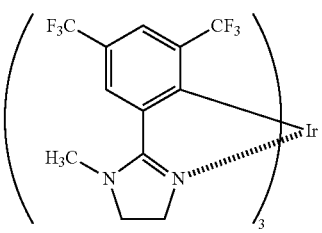
D-31 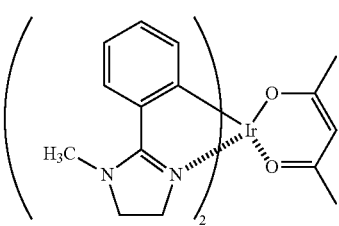
D-32 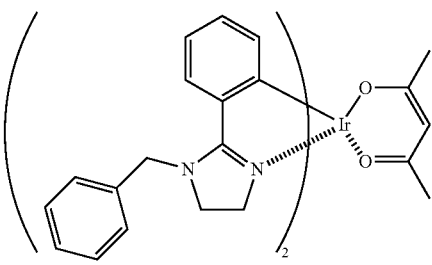
D-33 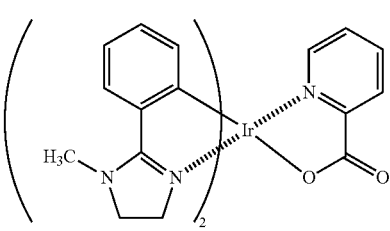
D-34 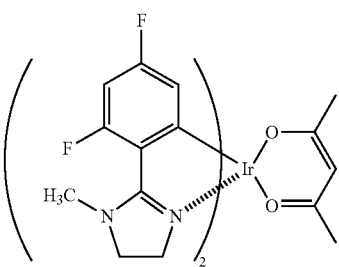

D-35 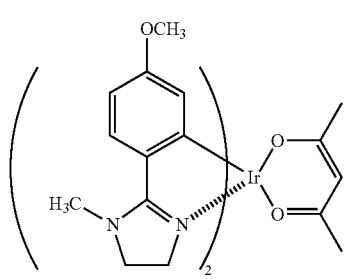
D-36 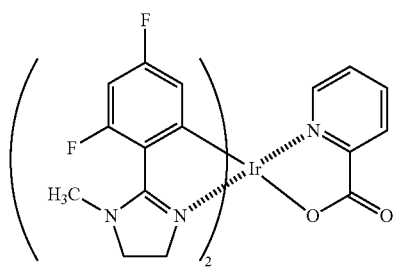
D-37 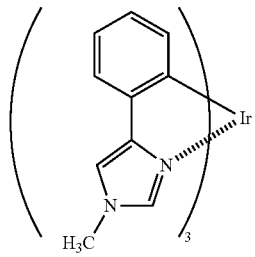
D-38 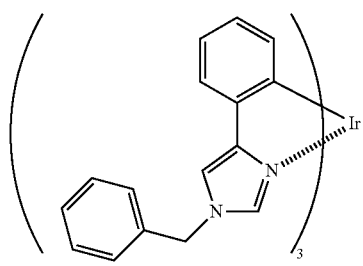
D-39 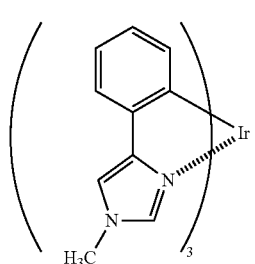
D-40 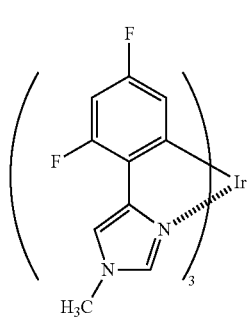
D-41 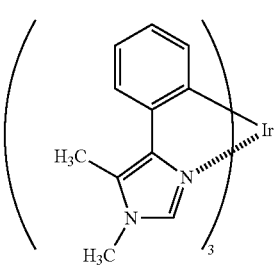
D-42 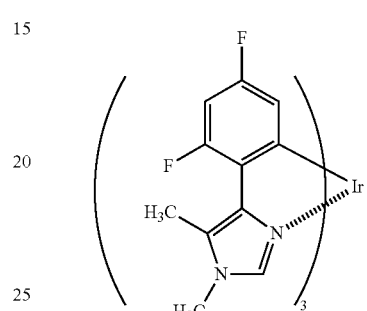
D-43 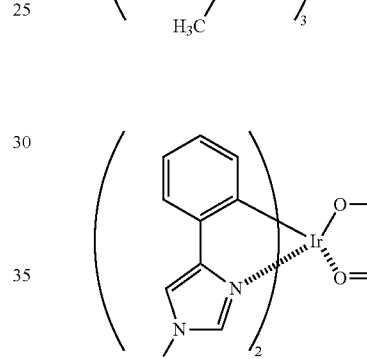
D-44 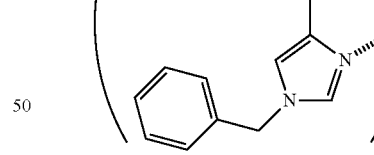
D-45 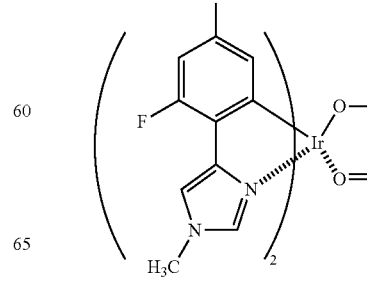

D-46 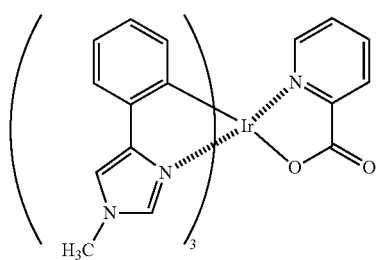
D-47 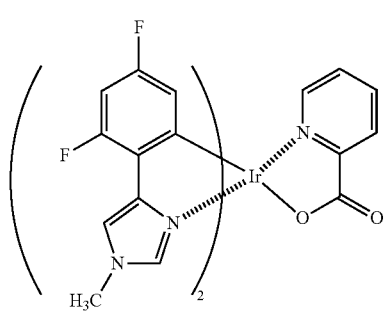
D-48 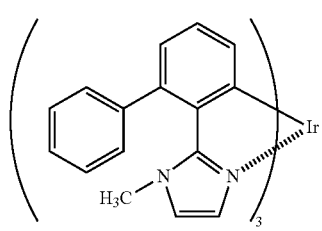
D-49 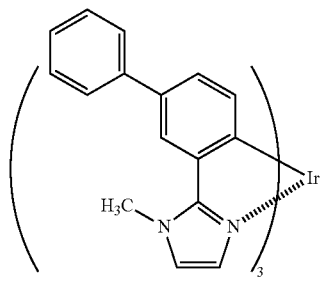
D-50 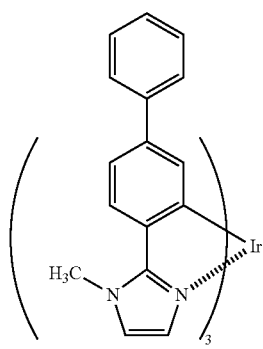
D-51 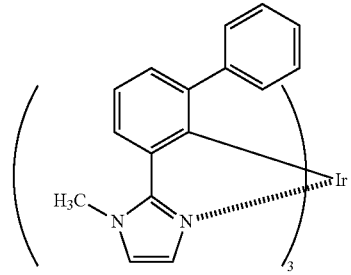
D-52 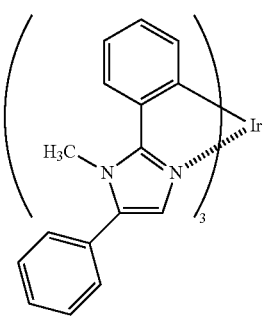
D-53 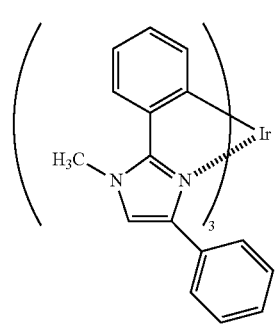
D-54 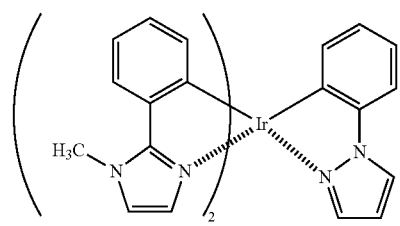
D-55 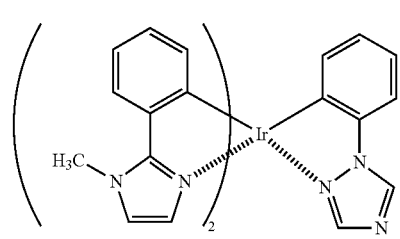
D-56 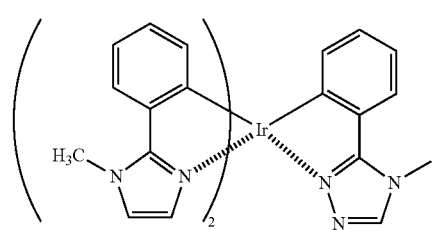

D-57 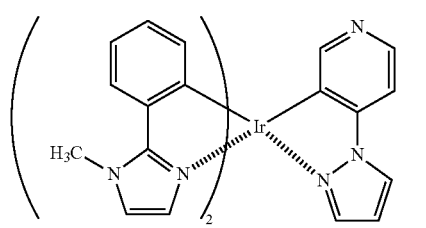
D-58 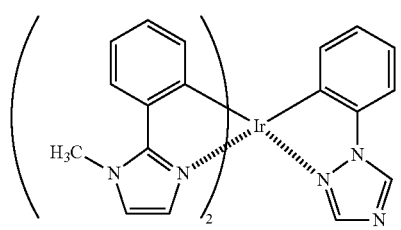
D-59 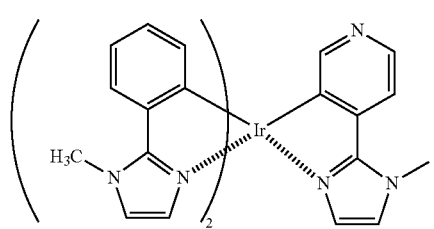
D-60 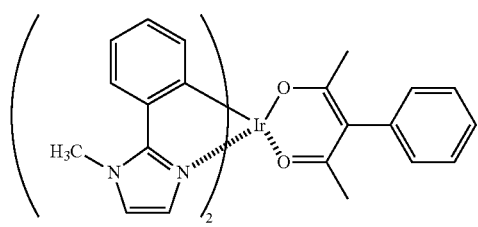
D-61 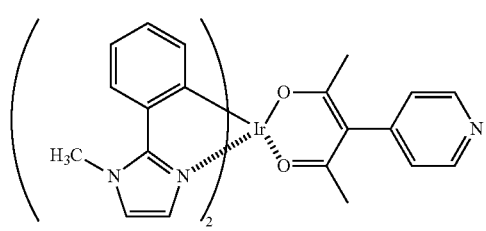
D-62 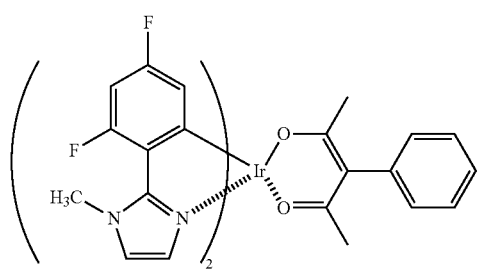
D-63 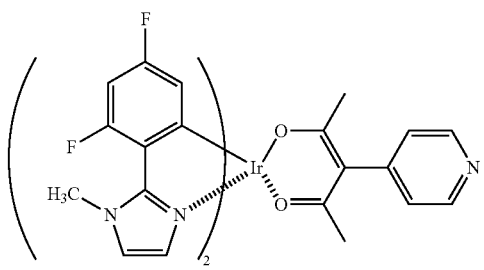
D-64 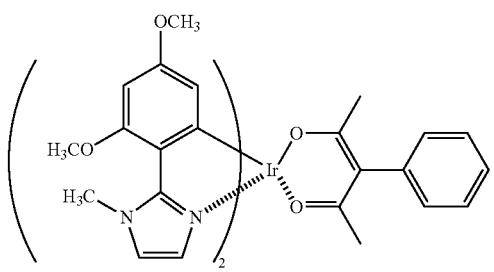
D-65 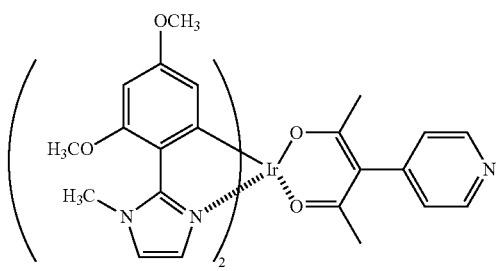
Ir-1 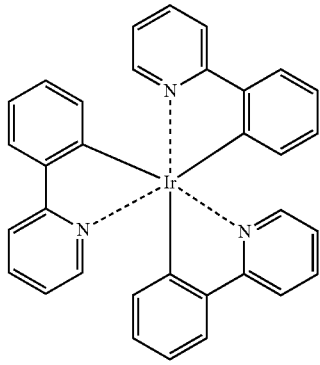
Ir-2 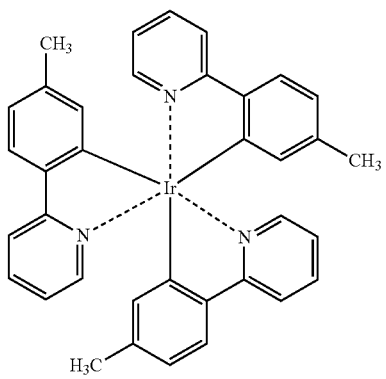

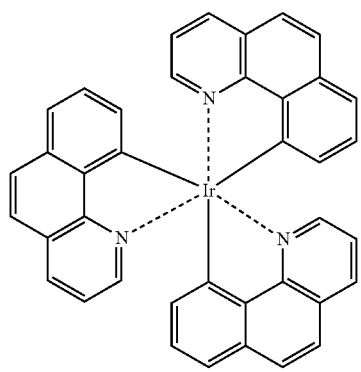
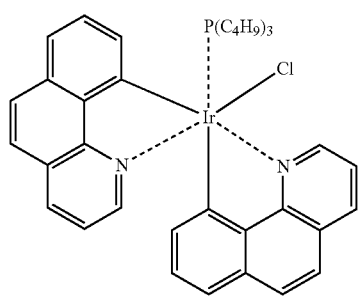
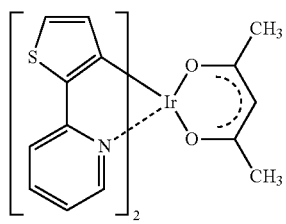
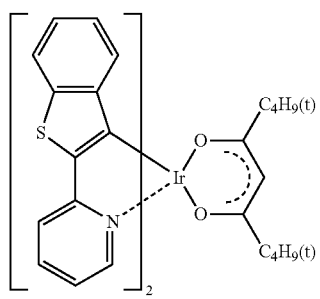
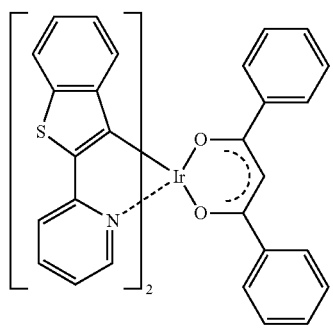
Ir-3
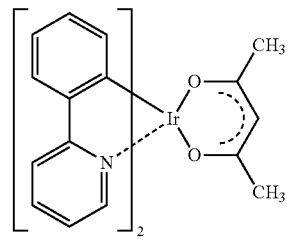
Ir-4
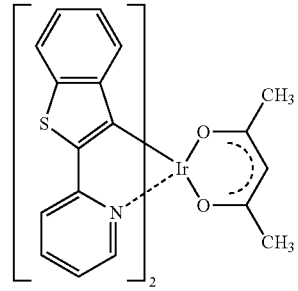
Ir-5
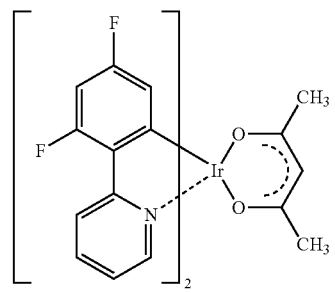
Ir-6
Ir-7
Ir-8
Ir-9
Ir-10
Ir-11
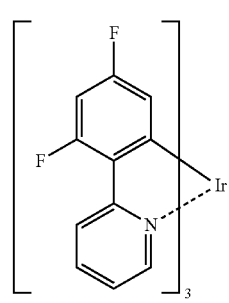
Ir-12
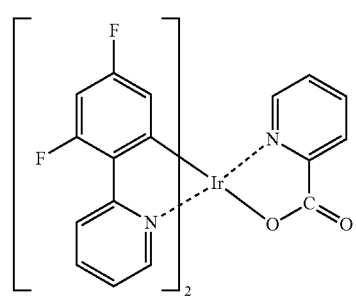

Ir-13 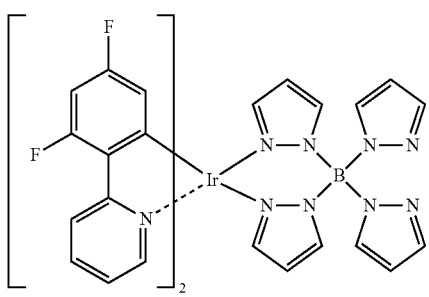
Ir-14 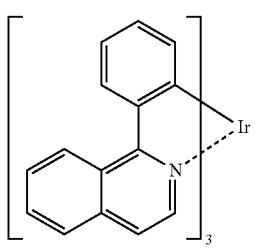
Ir-15 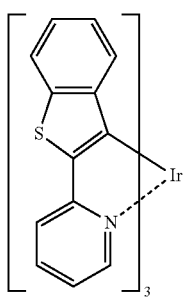
Ir-16 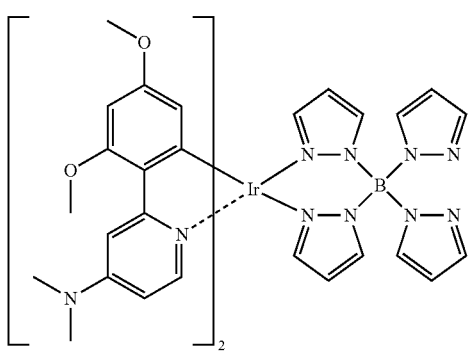
Pt-1 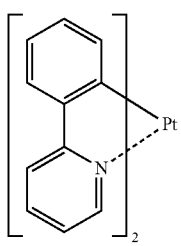
Pt-2 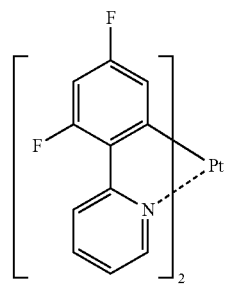
Pt-3 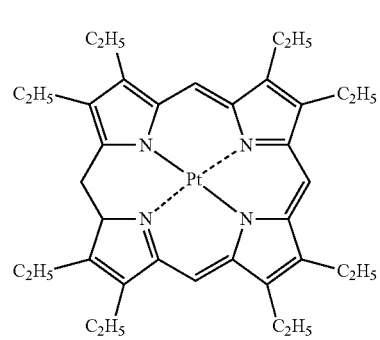
A-1 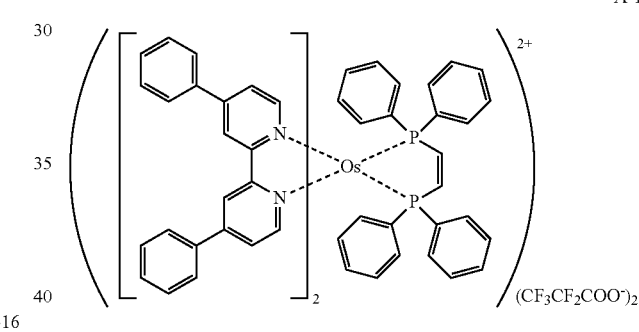
d-1 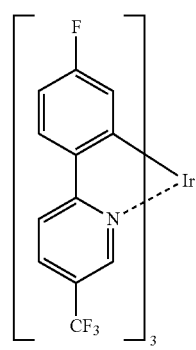
d-2 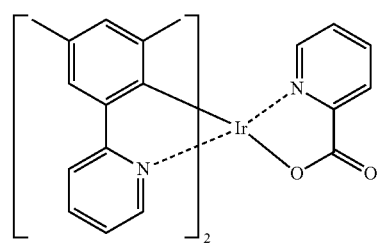

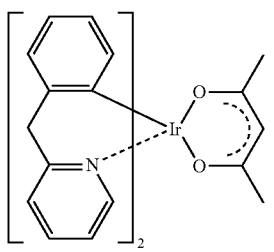
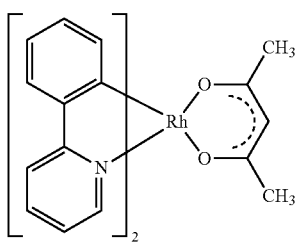
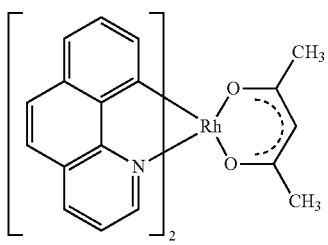
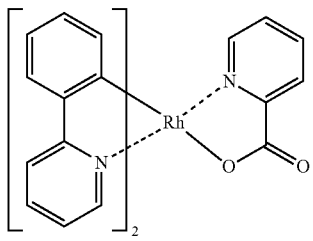
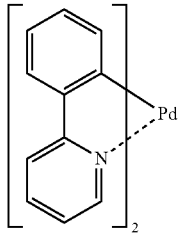
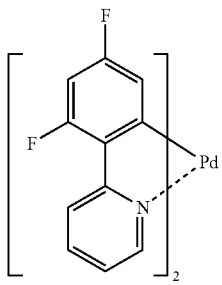
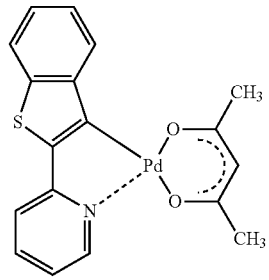
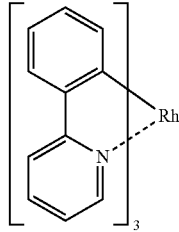
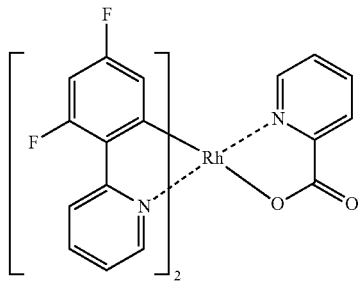
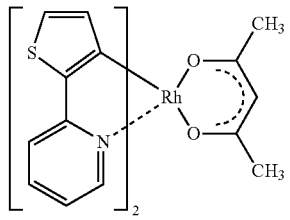

The above-described phosphorescence emitting compounds (it may be called as phosphorescence emitting metal complexes) may be synthesized by applying a method described in such as: Organic Letter, vol. 3, No. 16, pp. 2579-2581 (2001), Inorganic Chemistry vol. 30, No. 8, pp. 1685-1687 (1991), J. Am. Chem. Soc., vol. 123, p. 4304 (2001), Inorganic chemistry vol. 40, No. 7, pp. 1704-1711 (2001), Inorganic Chemistry vol. 41, No. 12, pp. 3055-3066 (2002), New Journal of Chemistry, vol. 26, p. 1171 (2002), European Journal of Organic Chemistry, vol. 4, pp. 695-709 (2004), and reference documents described in these documents.

(5.1.3) Fluorescent Compound

As fluorescent dopants, listed are compounds such as: coumarin based dyes, pyran based dyes, cyanine based dyes, croconium based dyes, squarylium based dyes, oxobenzanthracene based dyes, fluorescein based dyes, Rhodamine based dyes, pyrylium based dyes, perylene based dyes, stilbene based dyes, polythiophene based dyes, and rare earth complex based fluorescent materials.

(5.2) Injection Layer (Hole Injection Layer and Electron Injection Layer)

An injection layer is a layer which is arranged between an electrode and a light-emitting layer 103c to decrease a driving voltage and to improve an emission luminance, which is detailed in volume 2, chapter 2 (pp. 123-166) of "Organic EL Elements and Industrialization Front thereof (Nov. 30, 1998, published by N. T. S. Corp.)", and it includes a hole injection layer 103a and an electron injection layer 103e.

An injecting layer is provided when needed. A hole injection layer 103a may be provided: between an anode and a light-emitting layer 103c or a hole transport layer 103b. An electron injection layer 103e may be provided: between a cathode and a light-emitting layer 103c or an electron transport layer 103d.

A hole injection layer 103a is also detailed in publications such as JP-A Nos. 9-45479, 9-260062 and 8-288069. Specific examples thereof include: a phthalocyanine buffer layer containing such as copper phthalocyanine; an oxide buffer layer containing such as vanadium oxide; an amorphous carbon buffer layer; and a polymer buffer layer employing conductive polymer such as polyaniline (or called as emeraldine) or polythiophene.

An election injection layer 103e is detailed in JP-A Nos. 6-325871, 9-17574, and 10-74586. Examples thereof include: a metal layer made of such as strontium and aluminum; an alkaline metal halide layer made of such as potassium fluoride; an alkaline earth metal compound layer made of such as magnesium fluoride; and an oxide layer made of such molybdenum oxide. The above-described election injection layer 103e is preferably a very thin layer, and the layer thickness is preferably in the range of 1 nm to 10 μm, although it depends on a raw material.

(5.3) Hole Transport Layer

A hole transport layer 103b contains a hole transport material having a function of transporting a hole, and in a broad meaning, a hole injection layer 103a and an electron blocking layer are also included in a hole transport layer 103b. A hole transport layer 103b may be provided as a single layer or a plurality of layers.

A hole transport material is a material having any one of properties to inject or transport a hole or a barrier property to an electron, and it may be either an organic substance or an inorganic substance. For example, listed materials are a triazole derivative, an oxadiazole derivative, an imidazole derivative, a polyarylalkane derivative, a pyrazolone derivative, a phenylenediamine derivative, an arylamine derivative, an amino substituted chalcone derivative, an oxazole derivatives, a styrylanthracene none derivative, a hydrazone derivative, a stilbene derivative, a silazane derivative, an aniline type copolymer, or conductive polymer oligomer, and specifically preferably such as thiophene oligomer.

As a hole transport material, those described above may be utilized, however, it is preferable to utilized a porphyrin compound, an aromatic tertiary amine compound and a styrylamine compound, and specifically preferably an aromatic tertiary amine compound.

Representative examples of an aromatic tertiary amine compound and a styrylamine compound include: N,N,N',N'-tetraphenyl-4,4'-diaminophenyl; N,N'-diphenyl-N,N'-bis(3-methylphenyl)-(1,1'-biphenyl)-4,4'-diamine (TPD); 2,2-bis(4-di-p-tolylaminophenyl)propane; 1,1-bis(4-di-p-tolylaminophenyl)cyclohexane; N,N,N',N'-tetra-p-tolyl 4,4'-diaminobiphenyl; 1,1-bis(4-di-p-tolylaminophenyl)-4-phenylcyclohexane; bis(4-dimethylamino-2-metylphenyl) phenylmethane; bis(4-di-p-tolylaminophenyl) phenylmethane; N,N'-diphenyl-N,N'-di(4-methoxyphenyl)-4,4'-diaminobiphenyl; N,N,N',N'-tetraphenyl-4,4'-diaminophenylether; 4,4'-bis(diphenylamino)quadriphenyl; N,N,N-tri(p-tolyl)amine; 4-(di-p-tolylamino)-4'-[4-(di-p-tri- amino)styryl]stilbene; 4-N,N-diphenylamino-(2-diphenylvinyl)benzene; 3-methoxy-4'-N,N-diphenylaminostilbene; and N-phenylcarbazole. In addition, there are cited those having two condensed aromatic rings in the molecule described in U.S. Pat. No. 5,061,569, such as 4,4'-bis[N-(1-naphthyl)-N-phenylamino]biphenyl(NDP), and 4,4',4''-tris [N-(3-methylphenyl)-N-phenylamino]triphenylamine (MDTDATA), in which three of triphenyl amine units are bonded in a star burst form, as described in JP-A No. 4-308688.

Polymer materials, in which these materials are introduced in a polymer chain or in the main chain of polymer, may be also utilized. Further, an inorganic compound such as a p-type Si and a p-type SiC may be utilized as a hole injection material and a hole transport material.

Further, it is possible to employ so-called p-type hole transport materials, as described in JP-A No. 11-251067, and J. Huang et al., Applied Physics Letters 80(2002), p. 139. In the present invention, since a highly-efficient light-emitting element may be prepared, it is preferable to employ these materials.

The hole transport layer 103b may be prepared by forming a thin layer made of the above-described hole transport material according to a method well known in the art such as a vacuum evaporation method, a spin coating method, a cast method, a printing method including an inkjet method and a LB method. The layer thickness of a hole transport layer 103b is not specifically limited, however, it is generally 5 nm to 5 μm, and preferably 5 to 200 nm. This hole transport layer 103b may have a single layer structure composed of one or plural types of the above described materials.

Further, it is possible to increase p-property of a hole transport layer 103b by doping with an impurity. As examples thereof, listed are those described in JP-A Nos. 4-297076, 2000-196140, 2001-102175, as well as in J. Appl. Phys., 95, 5773 (2004).

It is preferable to employ a hole transport layer of such a high p-property, since it is possible to produce an element of lower electric power consumption.

(5.4) Electron Transport Layer

An electron transport layer 103d contains an electron transport material having a function of transporting an electron, and in a broad meaning, an electron injection layer 103e and a hole blocking layer (not illustrated in the figure) are also included in an electron transport layer 103d. An electron transport layer 103d may be provided as a single layer or a plurality of layers.

In a single layered electron transport layer 103d, and in a laminated layered electron transport layer 103d, the only requirement for an electron transport material (it may be used as a hole blocking material) is to have a function of transferring an electron injected from the cathode into the light-emitting layer 103c. Any compounds may be selected from the known compounds. Examples of such compound include: a nitro-substituted fluorene derivative, a diphenylquinone derivative, a thiopyradineoxide derivative, carbodiimide, a fluorenylidenemethane derivative, anthraquinonedimethane, an anthrone derivative, and an oxadiazole derivative. In addition, a thiadiazole derivative which has a structure of replacing an oxygen atom in the oxadiazole ring with a sulfur atom, and a quinoxaline derivative which has a quinoxaline ring known as an electron inductive group are also used for a material in an electron transport layer 103d. In addition, polymer materials, in which these materials are introduced in a polymer chain or in the main chain of polymer, may be also utilized.

Further, the following may be used as a material for an electron transport layer 103d: a metal complex of a 8-quinolinol derivative such as tris(8-quinolinol)aluminum (Alq$_3$), tris(5,7-dichloro-8-quinolinol)aluminum, tris(5,7-dibromo-8-quinolinol)aluminum, tris(2-methyl-8-quinolinol) aluminum, tris(5-methyl-8-quinolinol)aluminum and bis(8-quinolinol)zinc (Znq); and metal complexes in which a central metal of the aforesaid metal complexes is substituted by In, Mg, Cu, Ca, Sn, Ga or Pb.

Further, metal-free or metal phthalocyanine, or a compound whose terminal is substituted by an alkyl group or a sulfonic acid group, may be preferably utilized as a material for an electron transport layer 103d. In addition, a distyryl pyrazine derivative used as a material for a light-emitting layer 103c is also used as a material for an electron transport layer 103d. In the same manner as used for a hole injection layer 103a and a hole transport layer 103b, an inorganic semiconductor such as an n-type Si and an n-type SiC may be also utilized as a material for an electron transport layer 103d.

An electron transport layer 103d is preferably formed in a film with the above-described material by the following known methods, for example: a vacuum deposition method, a spin coating method, a cast method, a printing method including an ink-jet method, and a LB method. The layer thickness of the electron transport layer 103d is not specifically limited, however, it is generally about 5 nm to 5 μm, and preferably it is 5 to 200 nm. The electron transport layer 103d may be a single layer structure containing one or more types of the above-described materials.

Further, it is possible to increase an n-property of an electron transport layer 103d by doping with an impurity. As examples thereof, listed are those described in each of JP-A Nos. 4-297076, 10-270172, 2000-196140, 2001-102175, as well as in J. Appl. Phys., 95, 5773 (2004). Further, it is preferable to incorporate potassium or a potassium compound in the electron transport layer 103d. As a potassium compound, it may use potassium fluoride, for example. When the n-property of the electron transport layer 103d is made high, it is possible to produce an element of lower electric power consumption.

As a material for an electron transport layer 103d (an electron transport compound), it may use the same compound which constitutes an undercoat layer 101a as described above. This is the same for an electron transport layer 103d which serves also as an electron injection layer 103e. It may use the same compound which constitutes an undercoat layer 101a as described above.

(5.5) Blocking Layer (Hole Blocking Layer and Electron Blocking Layer)

A blocking layer is appropriately provided as an organic light-emitting layer 103, in addition to the above-described various functional layers. For example, there is a hole blocking (hole block) layer described in JP-A Nos. 11-204258 and 11-204359 and p. 237 of "Organic EL Elements and Industrialization Front thereof (Nov. 30 (1998), published by N. T. S. Corp.)".

A hole blocking layer, in a broad meaning, is provided with a function of an electron transport layer 103d. A hole blocking layer is composed of a material having a function of a transporting an electron but a very small ability of transporting a hole. It can improve the recombination probability of an electron and a hole by blocking a hole while transporting an electron. Further, a constitution of an electron transport layer 103d described later may be appropriately utilized as a hole blocking layer according to the present invention when needed. The hole blocking layer is preferably arranged adjacent to the light-emitting layer 103c.

On the other hand, an electron blocking layer has a function of a hole transport layer 103b. An electron blocking layer is composed of a material having a function of transporting a hole but a very small ability of transporting an electron. It can improve the recombination probability of an electron and a hole by blocking an electron while transporting a hole. Further, a constitution of a hole transport layer 103b described later may be appropriately utilized as an electron blocking layer when needed. The thickness of the hole blocking layer according to the present invention is preferably 3 to 100 nm, and more preferably, it is 5 to 30 nm.

These layers (hole injection layer 103a, hole transport layer 103b, light-emitting layer 103c, electron transport layer 103d, and electron injection layer 103e) each may be formed with a spin coating method, a casting method, an inkjet method, a vapor deposition method, and a printing method. From the viewpoint of obtaining a homogeneous layer and hardly producing pinholes, a vacuum vapor deposition method, or a spin coating method is particularly preferred. It may be applied a different formation method for each layer. When a vapor deposition method is employed for forming each of these layers, the deposition conditions may vary depending on the type of compound used. Usually, it is preferable to suitably select the conditions of: a boat heating temperature of 50 to 450° C., a vacuum level of $1 \times 10^{-6}$ to $1 \times 10^{-2}$ Pa, a deposition rate of 0.01 to 50 nm/sec, a substrate temperature of −50 to 300° C. and a thickness of 0.1 to 5 μm.

(6) Opposite Electrode

An opposite electrode 5a is an electrode film that functions as a cathode to supply electrons to the organic light-emitting layer 3. It is used a metal, an alloy, an organic or an inorganic conductive compound, and a mixture thereof. Specifically, it is cited: aluminum, silver, magnesium, lithium, magnesium/copper mixture, magnesium/silver mixture, magnesium/aluminum mixture, magnesium/indium mixture, indium, lithium/aluminum mixture, rare earth metals, and oxide semiconductors such as ITO, ZnO, TiO$_2$, and SnO$_2$.

The opposite electrode 5a may be produced by forming a thin film by using these conductive materials with a vapor deposition method or a sputtering method. A sheet resistivity of the second electrode 5a is preferably less than several hundred Ω/square, and a layer thickness thereof is usually, in the range of 5 nm to 5 μm, preferably in the range of 5 to 200 nm.

When emitted light h is intended to be taken out also from the side of the opposite electrode 5a of this organic light-emitting element 10, a good light transparent conductive material is selected among the above-described materials, and the opposite electrode 5a is suitably constituted.

(7) Extraction Electrode

An extraction electrode 16 electrically connects a transparent metal electrode 1 with an outer electric source. The materials thereof are not specifically limited, and known materials are suitably used. For example, it may use a metal film composed of a three-layered structure of MAM electrode (Mo/Al—Nd alloy/Mo).

(8) Auxiliary Electrode

An auxiliary electrode 15 is provided in order to decrease the resistivity of the transparent metal electrode 1. It is placed in contact with the electrode layer 1b of the transparent metal electrode 1. Materials used for forming the auxiliary electrode 15 are preferably low resistive metals such as gold, platinum, silver, copper, and aluminum. Since these metals have a low light transmitting property, it is formed in a pattern within the region that will not affect the taking-out of emitted light h from the light taking-out surface 13a.

As a forming method of the auxiliary electrode 15, it may be cited: a vapor deposition method, a sputtering method, a printing method, an inkjet method and an aerosol jet method. A line width of the auxiliary electrode 15 is preferably 50 μm or less from the viewpoint of opening ratio of the light taking-out. A thickness of the auxiliary electrode 15 is preferably 1 μm or more from the viewpoint of conductivity.

(9) Sealing Material

A sealing material 17 covers the organic light-emitting element 10. It may be a plate type (a film type) sealing material that is fixed to the side of the transparent substrate 13 through an adhesive 19, or it may be a sealing film. The sealing material 17 is placed in a condition of covering at least the organic light-emitting layer 3, with exposing edge portions of the transparent metal electrode 1 and the opposite electrode 5a of the organic light-emitting element 10. It may be constituted that an electrode is provided to the sealing material 17 so that this electrode and edge portions of the transparent metal electrode 1 and the opposite electrode 5a of the organic light-emitting element 10 are made in a conduction state.

As a plate type (or film type) sealing material 17, it is preferable to be provided with flexibility as the transparent substrate 13. Specifically listed are a flexible glass substrate, a polymer substrate, and a metal substrate. These substrates may be used in a thinner film shape. Examples of a glass substrate include: soda-lime glass, barium-strontium containing glass, lead glass, aluminosilicate glass, borosilicate glass, barium borosilicate glass, and quartz. Further, examples of a polymer substrate include: polycarbonate, acryl, polyethylene terephthalate, polyether sulfide, and polysulfone. A metal substrate includes one made of a metal selecting from the group consisting of stainless steel, iron, copper, aluminum, magnesium, nickel, zinc, chromium, titanium, molybdenum, silicon, germanium, and tantalum, or an alloy thereof.

Among them, since it is possible to make an element in a thin film, a polymer substrate or a metal substrate in a thin film state is preferably used as a sealing material 17.

Further, an oxygen permeability of the film state polymer substrate is preferably $1 \times 10^{-3}$ ml/(m²·24 h·atm) or less determined by the method based on JIS K 7126-1987, and a water vapor permeability thereof is preferably $1 \times 10^{-3}$ g/(m²·24 h) or less (at 25±0.5° C., relative humidity: 90±2% RH) determined by the method based on JIS K 7129-1992.

The above-described substrate materials may be used for the sealing material 17 after converting them into a concave shape. Conversion of the sealing material into a concave shape is carried out employing a sand blast process or a chemical etching process.

An adhesive 19 used for fixing the plate type sealing material 17 to the transparent substrate 13 is employed as a sealing agent to seal the organic light-emitting element 10 that is interposed between sealing material 17 and the transparent substrate 13. Specific examples of an adhesive 19 are: a photo-curing and heat-curing type adhesive having a reactive vinyl group such as an acrylic acid based oligomer and a methacrylic acid based oligomer; a moisture curing type adhesive such as 2-cyanoacrylates.

A further example of an adhesive 19 is a thermal and chemical curing type (two liquid mixing type) such as an epoxy based adhesive. Further, it may be listed hot-melt type polyamide, polyester, and polyolefin. Moreover, it may be listed a cationically curable type UV curable epoxy resin adhesive.

In addition, since the organic materials constituting the organic light-emitting element 10 are occasionally deteriorated via a thermal process, the adhesive 19 is preferably a material which enables adhesion and curing between room temperature and 80° C. Further, a desiccating agent may be dispersed into the adhesive.

The adhesive 19 may be applied onto a sealing portion of the plate type sealing material 17 and the transparent substrate 13 via a commercial dispenser, or may be printed thereon in the same manner as a screen printing.

When a space is formed between the sealing material 17, the transparent substrate 13, and adhesive 19, it is preferable to inject an inert gas such as nitrogen or argon, or an inert liquid such as a fluorinated hydrocarbon or a silicon oil in the space. It may be made to a vacuum state. Further, a hygroscopic compound may be enclosed in the space Examples of a hygroscopic compound include: metal oxides (for example, sodium oxide, potassium oxide, calcium oxide, barium oxide, magnesium oxide, and aluminum oxide); sulfates (for example, sodium sulfate, calcium sulfate, magnesium sulfate, and cobalt sulfate); metal halides (for example, calcium chloride, magnesium chloride, cesium fluoride, tantalum fluoride, cerium bromide, magnesium bromide, barium iodide, and magnesium iodide); perchlorates (for example, barium perchlorate and magnesium perchlorate). In sulfates, metal halides, and perchlorates, suitably employed are anhydrides.

On the other hand, when a sealing film is used as a sealing material 17, the sealing film is used for fully covering the organic light-emitting layer 3 of the organic light-emitting element 10, and at the same time, it covers the transparent substrate 13 with a condition that the edge portions of the transparent metal electrode 1 and the opposite electrode 5a of the organic light-emitting element 10 are exposed.

The sealing film is composed of an inorganic material or an organic material. In particular, it is composed of a material having a function of preventing the penetration of the substance which induces deterioration of the organic light-emitting layer 3 of the organic light-emitting element 10. Examples of the material are inorganic materials such as silicon oxide, silicon dioxide, and silicon nitride. Further, in order to improve brittleness of the sealing film, it may be formed a laminated structure by using a film made of an organic material in addition to the film made of an inorganic material.

The forming methods of these film are not particularly limited, and examples of employable methods include a vacuum deposition method, a sputtering method, a reactive sputtering method, a molecular beam epitaxy method, a cluster ion beam method, an ion plating method, a plasma polymerization method, a plasma CVD method, a laser CVD method, a thermal CVD method, and a coating method.

(10) Protective Film and Protective Plate

A protective film or a protective plate (not illustrated in the figure) may be provided by interposing the transparent substrate 13, the organic light-emitting element 10, and the sealing material 17. This protective film or protective plate may be arranged to enhance the mechanical strength of the organic light-emitting element 10. Specifically, when the sealing material 17 is achieved via the sealing film, the resulting mechanical strength of the organic light-emitting element 10 is not always high enough. In this case, it is preferable to arrange the protective film or the protective plate.

Usable materials for the protective film or the protective plate include: a glass plate, a polymer plate, a polymer film thinner than the polymer plate, a metal plate, a metal film thinner than the metal plate, a polymer material film, or a metal material film. Among these, in terms of light weight and a decrease in thickness of the element, it is preferable to employ a polymer film.

<<Production Method of Organic Light-Emitting Element>>

Here, a production method of an organic light-emitting element 10 illustrated in FIG. 4 is described as an example.

First, it is prepared a transparent substrate 13 formed with an internal light extracting layer 2 thereon. On the internal light extracting layer (a smoothing layer 2$b$) is formed an undercoat layer 1$a$ composed of a nitrogen containing compound so as to have a thickness of 1 μm or less, preferably in the range of 10 to 100 nm with a suitable method such as a vapor deposition method.

Subsequently, an electrode layer 1$b$ composed of silver (or an alloy mainly composed of silver) is formed on the undercoat layer 1$a$ so as to have a thickness of 12 nm or less, preferably in the range of 4 to 9 nm with a suitable method such as a vapor deposition method. Thus, it is formed a transparent metal electrode 1 to become an anode. At the same time, an extraction electrode 16 is formed with a suitable method such as a vapor deposition method on the edge of the transparent metal electrode 1 to be connected to the outer electric source.

Subsequently, on this is formed an organic light-emitting layer 3 by laminating: a hole injection layer 3$a$, a hole transport layer 3$b$, a light-emitting layer 3$c$, an electron transport layer 3$d$, and an electron injection layer 3$e$ in this order.

These layers each may be formed with a spin coating method, a casting method, an inkjet method, a vapor deposition method, and a printing method. From the viewpoint of obtaining a homogeneous layer and hardly producing pinholes, a vacuum vapor deposition method, or a spin coating method is particularly preferred. It may be applied a different formation method for each layer. When a vapor deposition method is employed for forming each of these layers, the deposition conditions may vary depending on the type of compound used. Usually, it is preferable to suitably select the conditions of: a boat heating temperature of 50 to 450° C., a vacuum level of $1\times10^{-6}$ to $1\times10^{-2}$ Pa, a deposition rate of 0.01 to 50 nm/sec, a substrate temperature of −50 to 300° C. and a thickness of 0.1 to 5 μm.

The formation of the organic light-emitting layer 3 is preferably done in such a manner that the formed region thereof is completely superposed to the position (region) where the internal light extracting layer 2 is formed when its cross-section is viewed, and the emitted light h produced in the organic light-emitting layer 3 is efficiently extracted via the internal light extracting layer 2.

After forming the organic light-emitting layer 3 as described above, an opposite electrode 5$a$ to become a cathode is formed with a suitable method such as a vapor deposition method on the upper position of the organic light-emitting layer 3. At this moment, the opposite electrode 5$a$ is formed having a pattern in a shape drawing the terminal portion to the periphery of the transparent substrate from above the organic light-emitting layer 3, while keeping the insulating condition with the transparent electrode 1 by the organic light-emitting layer 3. By this, an organic light-emitting element 10 may be obtained. Further, a sealing material 17 is placed to cover at least the organic light-emitting layer 3, while keeping the state of exposing the terminal portions of the transparent metal electrode 1 (the extraction electrode 16) of the organic light-emitting element 10 and the opposite electrode 5$a$.

By the steps described above, an organic light-emitting element 10 having a required light-emitting pattern may be produced on the transparent substrate 13. In the production of the organic light-emitting element 10, it is preferable that the production from the organic light-emitting layer 3 to the opposite electrode 5$a$ is done with one time vacuuming operation. However, it may employ a different production method by taking out the transparent substrate 13 from the vacuum atmosphere on the way. In that case, it is required to conduct the operations under a dry inert gas atmosphere.

When a direct-current voltage is applied to the produced organic light-emitting element 10, the first electrode 1 as an anode is made to have a plus (+) polarity, and the second electrode 5$a$ as a cathode is made to have a minus (−) polarity. By applying voltage of 2 to 40 v, light emission may be observed. Further, an alternating-current voltage may be applied. In addition, an arbitrary wave shape may be used for the applying alternating-current.

<Advantageous Effects of Organic Light-Emitting Element>

The organic light-emitting element 10 according to the present invention includes the transparent metal electrode 1 having both conductivity and light transmittance, the transparent substrate 13, and the internal light extracting layer 2 disposed therebetween. Such a configuration can reduce optical loss caused by total reflection between the transparent metal electrode 1 and the transparent substrate 13 to enhance the luminescence efficiency of the organic light emitting element 10.

The organic light-emitting element 10 includes the transparent metal electrode 1 as an anode, on which the organic light-emitting layer 3 and the opposite electrode or cathode 5$a$ are disposed. Such a configuration can attain light emission at high luminance of the organic light emitting element 10 by a sufficient voltage applied between the transparent metal electrode 1 and the opposite electrode 5$a$, and can enhance the outcoupling efficiency of the emitted light h from the transparent metal electrode 1 to attain high luminance. This configuration can also reduce the driving voltage for providing a predetermined luminance to prolong the service life.

<<Application of Organic Light-Emitting Element>>

An organic light-emitting element of the present invention may be used for a various types of illumination light sources, since it is a surface-emitting body. Examples of an illumination light source include: illumination devices of a home use illumination and a car room illumination, a backlight of a watch or a liquid crystal, a panel advertisement, a light source for a signal, a light source for an optical memory medium, a light source for an electrophotographic copier, a light source for an optical telecommunication processor and a light source for a photo-sensor. These are applications which make use of the features of a surface-emitting body.

Further, an organic light-emitting element of the present invention may be utilized as one type of lamp for an illumination and an exposure light, and it may be also utilized for a projector of an image projecting type, or for a display device (a display) which is used for directly viewing still images and moving images. In this case, in accordance with a large size illumination device and display recently developed, it may be used as a tiling form in which a plurality of light-emitting panels provided with an organic light-emitting element are bonded together to achieve an enlarged light-emitting surface.

An operating mode in the case of being utilized as a display device for playback of moving images may be either a simple matrix (a passive matrix) mode or an active matrix mode. In addition, a color or a full-color display device may be prepared by utilizing at least two types of organic light-emitting elements of the present invention which emit different emitting colors.

EXAMPLES

The present invention will now be described with reference to examples, however, the present invention is not limited thereto. In addition, an indication of "portion" or "%" is used in examples. This represents "mass portion" or "mass %", if it is not particularly mentioned.

Production of Organic Light-Emitting Element No. 1

Comparative Example (1) Preparation of Transparent Substrate

By referring to the description of Example 1 of JP-A No. 2012-116101, a gas barrier layer was formed on a commercially available polyethylene terephthalate film (PET film) substrate (thickness: 125 μm).

Specifically, an UV-curable organic/inorganic hybrid hard coat material OPSTAR Z7535 made by JSR Corporation was applied to one of easy-to-bond surfaces of a polyester film (made by Teijin DuPont Films Japan Limited, ultra-low-heat shrinkable PET Q83, width: 500 mm, thickness: 125 μm) to obtain a coated layer with a dry thickness of 4 μm. Then, the layer was dried and cured at 80° C. for 3 minutes, with a high pressure mercury lamp at 1.0 J/cm$^2$ under an air atmosphere, to form a bleed-out blocking layer.

In the subsequent step, an UV-curable organic/inorganic hybrid hard coat material OPSTAR Z7501 made by JSR Corporation was applied to the other surface of the resin substrate to obtain a coated layer with a dry thickness of 4 μm. Then, the layer was dried at 80° C. for three minutes, and was cured with a high pressure mercury lamp at 1.0 J/cm$^2$ under an air atmosphere to form a flat layer.

The maximum cross-sectional height Rt(p) of the flat layer was 16 nm in terms of the surface roughness specified in JIS B 0601.

The surface roughness was determined with an atomic force microscope (AFM) SPI3800 DFM made by SII Nano-Technology Inc. Three different regions (10 μm×10 μm) of the flat layer were measured, and the average of the three values for Rt was defined as the surface roughness.

The thickness of the resin substrate was 133 μm.

Next, a coating solution containing an inorganic precursor compound was applied to the surface of the flat layer on the resin substrate with a depressurized extrusion coater such that the thickness of the dried layer was 150 nm. A first gas barrier layer was thus formed.

The coating solution containing an inorganic precursor compound was prepared with a mixture of a solution of 20 mass % catalyst-free perhydropolysilazane (AQUAMICA NN120-20 made by AZ Electronic Materials plc) in dibutyl ether and a 20 mass % perhydropolysilazane (AQUAMICA NAX120-20 made by AZ Electronic Materials plc) containing 5 mass % (solid content) amine catalyst in dibutyl ether. The mixture was adjusted such that the content of the amine catalyst was 1 mass % of the solid content, and was diluted with dibutyl ether to prepare a solution of 5 mass % perhydropolysilazane in dibutyl ether.

After the coating solution was applied, the coated layer was dried at 80° C. for 300 seconds under a drying atmosphere (dew point: 5° C.).

After drying, the resin substrate was gradually cooled to 25° C. A reforming treatment was done to the coated surface by irradiating with vacuum ultra violet light in a vacuum UV applicator. As a light source for the vacuum UV applicator, it was employed a Xe excimer lamp having a double-tube structure and irradiating vacuum ultra violet light of 172 nm.

<Reforming Treatment Device>

Excimer applicator made by M.D.COM. Inc. (MODEL: MECL-M-1-200, wavelength: 172 nm, gas sealed in the lamp: Xe)

<Conditions on Reforming Treatment>

Intensity of excimer light: 3 J/cm$^2$ (172 nm)

Heating temperature of the stage: 100° C.

Oxygen level in the applicator: 1,000 ppm

After the coated layer was reformed, the substrate having the first gas barrier layer was dried as above, and was reformed under the same conditions again to adjust the dry thickness of the first gas barrier layer to 150 nm.

In the subsequent step, a second gas barrier layer was formed on the first gas barrier layer as described in the first gas barrier layer to form a PET film having gas barrier layers.

The above-described PET film having gas barrier layers was cut in a size of 60×80 mm. It was fixed to a frame of Teflon™ (with a tension corresponding to 100 N/m), and the following operation was conducted.

(2) Preparation of Internal Light Extracting Layer

An internal light extracting layer was not formed in an organic light-emitting element No. 1, the following transparent electrode and an organic light-emitting layer were formed directly on the aforesaid PET substrate.

(3) Preparation of Transparent Metal Electrode

A PET substrate having an internal light extracting layer disposed thereon was fixed with a substrate holder of a commercially available vacuum deposition apparatus. Exemplary compound 10 was placed in a tantalum resistive heating boat. The substrate holder and the heating boat were mounted on a first vacuum chamber of the vacuum deposition apparatus. Silver (Ag) was placed in another tungsten resistive heating boat, and was mounted on a second vacuum chamber.

In this state, the pressure of the first vacuum chamber was reduced to 4×10$^{-4}$ Pa, and the heating boat containing the following Exemplary compound 10 was heated by electrical conduction to deposit an undercoat layer of Exemplary compound 10 (thickness: 25 nm) on the substrate (smoothing layer) at a deposition rate of 0.1 to 0.2 nm/sec.

Subsequently, the substrate having the undercoat layer deposited thereon was placed into the second vacuum chamber under vacuum. The pressure of the second vacuum chamber was reduced to 4×10$^{-4}$ Pa, and the heating boat containing silver was heated by electrical conduction to deposit an electrode layer composed of silver (thickness: 8 nm) on the substrate (undercoat layer) at a deposition rate of 0.1 to 0.2 nm/sec. A transparent metal electrode having a laminate structure composed of the undercoat layer and the electrode layer was prepared.

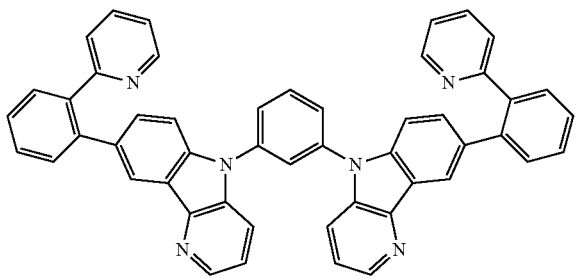

(4) Formation of Organic Light-Emitting Layer

The transparent substrate provided with the transparent metal electrode deposited thereon was overlaid with a mask having an opening (30 mm×30 mm) in the center, and it was fixed to a substrate holder of a commercially available vacuum deposition chamber. The materials constituting the organic light-emitting layer were each placed on respective heating boats inside the vacuum deposition apparatus. The amounts of the respective materials were optimized to form the corresponding layers.

The heating boats used were composed of a tungsten material for resistive heating.

Subsequently, the inner pressure of the deposition chamber of the vacuum deposition apparatus was reduced to a degree of vacuum of $4×10^{-4}$ Pa, and the respective heating boats containing the materials were sequentially heated by electrical conduction to deposit the respective layers as follows.

First, the heating boat containing a hole transporting injecting material α-NPD represented by a structural formula shown below was heated by electrical conduction to deposit a hole transporting injection layer composed of α-NPD on the electrode layer forming the transparent metal electrode. The hole transporting injecting layer served as a hole injection layer and a hole transport layer. The deposition rate was 0.1 to 0.2 nm/sec, and the thickness was 140 nm.

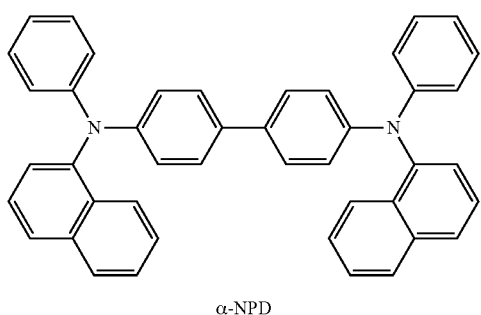 [SMILES: c1ccc(N(c2ccc(-c3ccc(N(c4ccccc4)c4cccc5ccccc45)cc3)cc2)c2cccc3ccccc23)cc1]

α-NPD

Next, a heating boat containing Host material H4 represented by a structural formula shown below and another heating boat containing Phosphorescent compound Ir-4 represented by a structural formula shown below were each independently electrically conducted to deposit a light-emitting layer composed of Host material H4 and Phosphorescent compound Ir-4 on the hole transporting injection layer. The electrical conduction of the heating boats was controlled such that the ratio of the deposition rates was Host material H4:Phosphorescent compound Ir-4=100:6. The thickness was 30 nm.

Subsequently, a heating boat containing a hole blocking material BAlq represented by the following structural formula was then heated by electrical conduction to deposit a hole blocking layer composed of BAlq on the light-emitting layer. The deposition rate was 0.1 to 0.2 nm/sec, and the thickness was 10 nm.

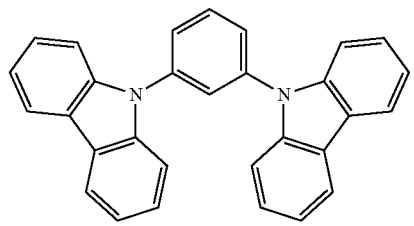

H4

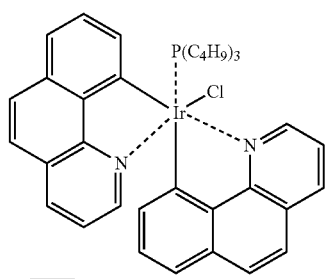

Ir-4

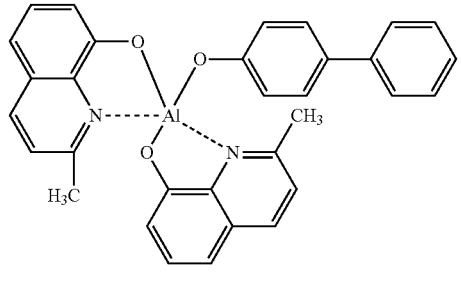

Balq

Subsequently, a heating boat containing tris(8-quinolinol) aluminum ($Alq_3$) as an electron transport material and a heating boat containing potassium fluoride were each independently electrically conducted to deposit an electron transport layer composed of $Alq_3$ and potassium fluoride on the hole blocking layer. The electrical conduction of the heating boats was controlled such that the ratio of the deposition rates was $Alq_3$:potassium fluoride=75:25. The thickness was made to be 30 nm.

Another heating boat containing potassium fluoride as an electron injecting material was heated by electrical conduction to deposit an electron injection layer composed of potassium fluoride on the electron transport layer. The deposition rate was 0.01 to 0.02 nm/sec, and the thickness was made to be 1 nm.

(5) Formation of Opposite Electrode and Sealing (5.1) Opposite Electrode

The transparent substrate provided with the electron injection layer deposited thereon was transferred into the second vacuum chamber under vacuum. The second vacuum chamber was equipped with a tungsten resistive heating boat containing aluminum (Al). The workpiece was overlaid with a mask having an opening (20 mm×50 mm). The mask was disposed perpendicular to the anode. Then, a reflective opposite electrode was formed as a cathode made of Al having a thickness of 100 nm inside the vacuum chamber at a film forming rate of 0.3 to 0.5 nm/sec.

<Preparation of Adhesive Composition>

The following compositions were dissolved in toluene to prepare adhesive composition having a solid content of 25 mass %:

| | |
|---|---|
| Polyisobutylene resin (A) (Opanol B50, made by BASF Ltd., Mw: 340,000) | 100 mass parts |
| Polybutene resin (B) (Nisseki polybutene, Grade HV-1900, made by Nippon Oil Corporation, Ltd., Mw: 1900) | 30 mass parts |
| Hindered amine light stabilizer (C) (TINUVIN 765, made by BASF Japan Ltd.; containing a tertiary hindered amino group) | 0.5 mass parts |
| Hindered phenol anti-oxidant (D) ((IRGANOX 1010, BASF Japan Ltd.; containing two tertiary butyl groups at two β positions of a phenol) | 0.5 mass parts |
| Cyclic olefin polymer (E) (Eastotac H-100L resin, made by Eastman Chemical Co.) | 50 mass parts |

(5.2) Sealing

<Preparation of Adhesive Sheet for Sealing>

As a sealing material, it was used a polyethylene terephthalate having vapor-deposited aluminum (Al) (Alpet 12/34, made by Asia Aluminum Co. Ltd.) for a sealing film. The above-prepared adhesive composition solution was coated on the aluminum side (the gas barrier side) so that the dried adhesive layer thickness became 20 μm. Then it was dries at 120° C. for 2 minutes to form the adhesive layer. Subsequently, a polyethylene terephthalate having a thickness of 38 μm and subjected to a peeling off treatment was pasted as a peeling-off sheet to the surface of the formed adhesive layer facing the peeling off treatment. Thus, it was prepared an adhesive sheet for sealing.

The prepared adhesive sheet for sealing as described above was cut to a size of 45×60 mm. The peeling-off sheet was removed under a nitrogen atmosphere, then, it was dried on the hot plate heated at 120° C. for 10 minutes. After confirming that the sheet was cooled to room temperature, it was used to completely laminate a cathode of an organic light-emitting element. Then, it was heated at 90° C. for 10 minutes to obtain a sealed organic light-emitting element.

The transparent metal electrode (anode) and the opposite electrode (cathode) were insulated by the organic light-emitting layer containing from the hole transport-injecting layer to the electron transport layer. The terminals of these electrodes were drawn to the periphery of the transparent substrate.

An organic light-emitting element No. 1 (comparative example) was produced by the above-described processes.

Production of Organic Light-Emitting Element No. 2

Comparative Example

The internal light extracting layer as described in the following item (2) was formed on a PET substrate formed with a gas barrier layer used for the organic light-emitting element No. 1. In the same manner as preparation of the organic light-emitting element No. 1, there were formed a transparent electrode, an organic light-emitting layer, and an opposite electrode on the formed internal light extracting layer. Then, it was sealed to prepare an organic light-emitting element No. 2 (Comparative example).

(2) Formation of Internal Light Extracting Layer (Light Scattering Layer and Smoothing Layer)

(2.1) Formation of Light Scattering Layer

A preparation liquid for a light scattering layer was made as follows. $TiO_2$ particles having an average particle size of 0.25 μm and a refractive index of 2.4 (JR600A, made by Tayca Co.) were used, and PGM solution was used as a resin solution (MMA/MAA=8/2, Mw=20,000) with a solid content to the co-polymer of 70 volume %/30 volume %, a solvent ratio of n-propyl acetate to cyclohexanone being 10 mass %/90 mass %, and the solid content density being made to be 15 mass %. It was formulated a preparation liquid in an amount of 10 ml.

(The above-described MMA indicates "methyl methacrylate, and MAA indicates "methyl acrylate.)

Specifically, the $TiO_2$ particles and the solvent were mixed. While cooling the mixture to the normal temperature, it was prepared a $TiO_2$ dispersion liquid by using an ultrasonic dispersion apparatus (UH-50, made by SMT Co.) with a standard condition of using a micro tip step (MS-3, 3 mmΦ, made by SMT Co.) for 10 minutes.

Subsequently, while stirring the $TiO_2$ dispersion liquid at 100 rpm, the resin was added by bits. After completing the addition, the stirring rate was raised to 500 rpm, and mixed for 10 minute to obtain a light scattering layer coating liquid.

Afterward, the mixture was filtered with a hydrophobic PVDF filter (0.45 μm) (made by Whatman Co.) to obtain a targeted light scattering layer coating liquid.

The prepared coating liquid was applied on a rotated substrate with a spin coating method (500 rpm, 30 seconds). Then, it was temporally dried (80° C., 2 minutes), further, it was dried with the following wavelength controlled IR (infrared ray) under the output condition of the substrate temperature of less than 80° C. for 5 minutes to obtain a light scattering layer having a thickness of 0.3 μm. The elastic modulus of the light scattering layer was 0.5 GPa.

<Wavelength Controlled IR: Radiation Heat Transfer Drying with a Wavelength Controlled IR Heater>

It was used an IR radiation apparatus (Ultimate heater/carbon, made by Meimei Industry Co.) provided with two pieces of quartz glass plates which absorb infrared rays having a wavelength of 3.5 μm or more, and a cooling air was passed through the glass plates (refer to FIG. 10).

The cooling air was given at 200 L/min, and the temperature of the tube quartz glass was kept under 120° C.

Figure 11:
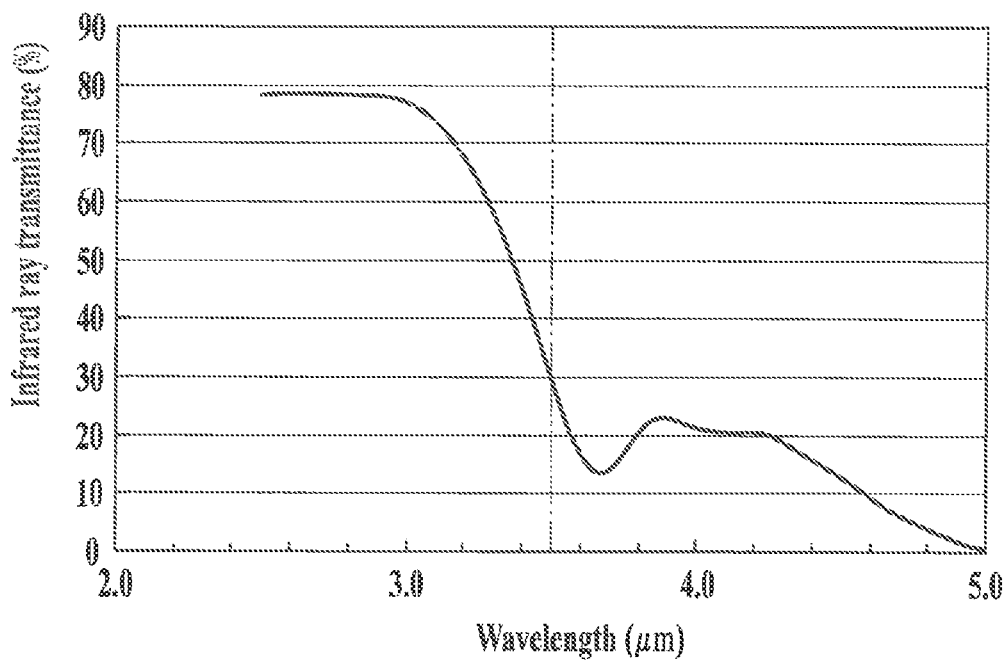
FIG. 11 is a graph illustrating an infrared light transmittance of a quartz glass filter.

An infrared light transmittance of a quartz glass filter is illustrated in FIG. 11.

Figure 12:
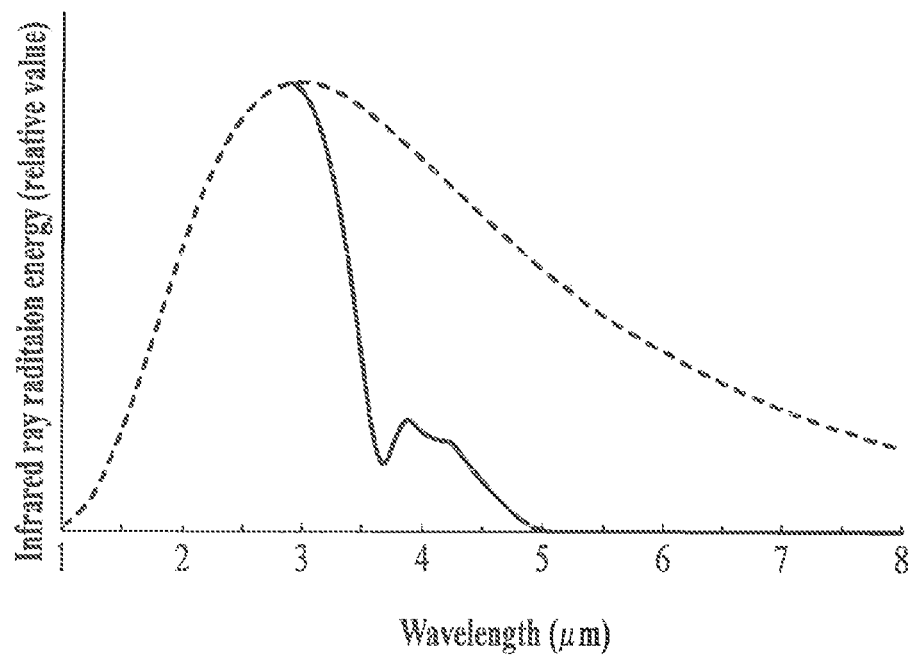
FIG. 12 is a graph schematically illustrating a radiation spectrum of a wavelength controlled infrared heater. The dotted line indicates a spectrum without a filter, and the solid line indicates a spectrum with a filter.

An infrared light spectrum with and without a quartz glass filter is illustrated in FIG. 12.

In FIG. 12, the dotted line indicates a spectrum without a filter, and the solid line indicates a spectrum with a filter. The part of the spectrum of each spectrum in the range of a wavelength of 1 μm to about 3 μm is overlapped.

(2.2) Formation of Smoothing Layer

A smoothing layer was formed on the above-prepared light scattering layer.

A preparation liquid for a smoothing layer was made as follows. A nano $TiO_2$ particle dispersion having an average particle size of 0.02 μm and a refractive index of 2.4 (HDT-760T, made by Tayca Co.) was used, and PGM solution was used as a resin solution (MMA/MAA=8/2, Mw=20,000) with a solid content ratio to the solution of 45 volume %/55 volume %, a solvent ratio of n-propyl acetate, cyclohexanone, and toluene being 20 mass %/30 mass %/50 mass %, and the solid content density being made to be 15 mass %. It was formulated a preparation liquid in an amount of 10 ml.

Specifically, the nano $TiO_2$ particle dispersion liquid and the solvent were mixed. While stirring the mixture at 100 rpm, the resin was added by bits. After completing the addition, the stirring rate was raised to 500 rpm, and mixed for 10 minute to obtain a smoothing layer coating liquid.

Afterward, the mixture was filtered with a hydrophobic PVDF filter (0.45 μm) (made by Whatman Co.) to obtain a targeted smoothing layer coating liquid.

The prepared coating liquid was applied on a rotated light scattering layer with a spin coating method (500 rpm, 30 seconds). Then, it was temporally dried (80° C., 2 minutes), further, it was dried with the above-described wavelength controlled IR (infrared ray) under the output condition of the substrate temperature of less than 80° C. for 5 minutes to obtain a shooting layer having a thickness of 0.7 μm. Thus, an internal light extracting layer was prepared.

A refractive index of the sole smoothing layer was 1.85.

The above-prepared internal light extracting layer had a transmittance T of 67%, and a haze value (Hz) of 50%. The haze value was measured by Haze mater NDH-2000 (made by Nippon Denshoku Industries Co. Ltd.) at 23° C. and 55% RH based on JIS K 7136.

A refractive index of the internal light extracting layer at a wavelength of 550 nm was measured by using Elipsometer made by Sopra Co. based on D542. It was 1.85.

Production of Organic Light-Emitting Element No. 3

Comparative Example

The internal light extracting layer as described in the following item (2) was formed on a PET substrate formed with a gas barrier layer used for the organic light-emitting element No. 1. In the same manner as preparation of the organic light-emitting element No. 1, there were formed a transparent electrode, an organic light-emitting layer, and an opposite electrode on the formed internal light extracting layer. Then, it was sealed to prepare an organic light-emitting element No. 3 (Comparative example).
(2) Formation of Internal Light Extracting Layer (Light Scattering Layer and Smoothing Layer)
(2.1) Formation of Light Scattering Layer A light scattering layer was formed in the same manner as preparation of the organic light-emitting element No. 2.
(2.2) Formation of Smoothing Layer The following smoothing layer having a thickness of 600 nm was formed on the above-prepared light scattering layer.

A coating solution containing an inorganic precursor compound described below was applied to the above-prepared light scattering layer with a depressurized extrusion coater such that the thickness of the dried layer was 150 nm. A first smoothing layer was thus formed.

The coating solution containing an inorganic precursor compound was prepared with a mixture of a solution of 20 mass % catalyst-free perhydropolysilazane (AQUAMICA NN120-20 made by AZ Electronic Materials plc) in dibutyl ether and a 20 mass % perhydropolysilazane (AQUAMICA NAX120-20 made by AZ Electronic Materials plc) containing 5 mass % (solid content) amine catalyst in dibutyl ether. The mixture was adjusted such that the content of the amine catalyst was 1 mass % of the solid content, and was diluted with dibutyl ether to prepare a solution of 5 mass % perhydropolysilazane in dibutyl ether.

After coating, it was dried with the wavelength controlled IR under the conditions of: substrate temperature of 80° C., drying time of 5 minutes and dew point of 5° C. in a dry atmosphere.

After drying, the resin substrate was gradually cooled to 25° C. A reforming treatment was done to the coated surface by irradiating with vacuum ultra violet light in a vacuum UV applicator. As a light source for the vacuum UV applicator, it was employed a Xe excimer lamp having a double-tube structure and irradiating vacuum ultra violet light of 172 nm.
<Reforming Treatment Device>

Excimer applicator made by M.D.COM. Inc. (MODEL: MECL-M-1-200, wavelength: 172 nm, gas sealed in the lamp: Xe)
<Conditions on Reforming Treatment>

Intensity of excimer light: 3 $J/cm^2$ (172 nm)

Heating temperature of the stage: 100° C.

Oxygen level in the applicator: 1,000 ppm

After the reforming treatment, the second, the third, and the fourth layers were laminated in the same manner. The laminated layers were dried at 80° C. dry condition left for 1 month to advance the polysilazane forming reaction. Thus, a smoothing layer was prepared.

Production of Organic Light-Emitting Element No. 4

Inventive Example

The internal light extracting layer as described in the following item (2) was formed on a PET substrate formed with a gas barrier layer used for the organic light-emitting element No. 1. In the same manner as preparation of the organic light-emitting element No. 1, there were formed a transparent electrode, an organic light-emitting layer, and an opposite electrode on the formed internal light extracting layer. Then, it was sealed to prepare an organic light-emitting element No. 4 (Inventive example).
(2) Formation of Internal Light Extracting Layer (Light Scattering Layer and Smoothing Layer)
(2.1) Formation of Light Scattering Layer A preparation liquid for a light scattering layer was made as follows. $TiO_2$ particles having an average particle size of 0.25 μm and a refractive index of 2.4 (JR600A, made by Tayca Co.) were used, and a resin solution was used (ED 230A: organic-inorganic hybrid resin, made by APM Co.) with a solid content ratio to the resin solution of 70 volume %/30 volume %, by using propylene glycol monomethyl ether, and the solid content density being made to be 15 mass %. It was formulated a preparation liquid in an amount of 10 ml.

Specifically, the $TiO_2$ particles and the solvent were mixed. While cooling the mixture to the normal temperature, it was prepared a $TiO_2$ dispersion liquid by using an ultrasonic dispersion apparatus (UH-50, made by SMT Co.) with a standard condition of using a micro tip step (MS-3, 3 mmΦ, made by SMT Co.) for 10 minutes.

Subsequently, while stirring the $TiO_2$ dispersion liquid at 100 rpm, the resin was added by bits. After completing the addition, the stirring rate was raised to 500 rpm, and mixed for 10 minute to obtain a light scattering layer coating liquid.

Afterward, the mixture was filtered with a hydrophobic PVDF filter (0.45 μm) (made by Whatman Co.) to obtain a targeted light scattering layer coating liquid.

The prepared coating liquid was applied on a rotated substrate with a spin coating method (500 rpm, 30 seconds). Then, it was temporally dried (80° C., 2 minutes), further, it was dried with the above-described wavelength controlled IR under the output condition of the substrate temperature of less than 80° C. for 5 minutes.

Subsequently, after drying, the resin substrate was gradually cooled to 25° C. A reforming treatment was done to the coated surface by irradiating with vacuum ultra violet light in a vacuum UV applicator. As a light source for the vacuum UV applicator, it was employed a Xe excimer lamp having a double-tube structure and irradiating vacuum ultra violet light of 222 nm.
<Reforming Treatment Device>
Excimer applicator made by M.D.COM. Inc. (MODEL: MEIRH-M-1-200-222-H-KM-G, wavelength: 222 nm, gas sealed in the lamp: KrCl)
<Conditions on Reforming Treatment>
Intensity of excimer light: 2 J/cm$^2$ (222 nm)
Heating temperature of the stage: 60° C.
Oxygen level in the applicator: Atmosphere
The curing reaction was promoted under the above-described conditions to obtain a light scattering layer having a thickness of 0.3 μm. The elastic modulus of the light scattering layer was 7.5 GPa.
(2.2) Formation of Smoothing Layer Next, a preparation liquid for a smoothing layer was made as follows. A nano $TiO_2$ particle dispersion having an average particle size of 0.02 μm and a refractive index of 2.4 (HDT-760T, made by Tayca Co.) was used, and a resin solution was used (ED 230A: organic-inorganic hybrid resin, made by APM Co.) with a solid content ratio to the resin solution of 45 volume %/55 volume %, by using propylene glycol monomethyl ether and toluene with a solvent ratio of 50 mass %/50 mass %, and the solid content density being made to be 15 mass %. It was formulated a preparation liquid in an amount of 10 ml.

Specifically, the nano $TiO_2$ particle dispersion liquid and the solvent were mixed. While stirring the mixture at 100 rpm, the resin was added by bits. After completing the addition, the stirring rate was raised to 500 rpm, and mixed for 10 minute to obtain a smoothing layer coating liquid.

Afterward, the mixture was filtered with a hydrophobic PVDF filter (0.45 μm) (made by Whatman Co.) to obtain a targeted smoothing layer coating liquid.

The prepared coating liquid was applied on a rotated light scattering layer with a spin coating method (500 rpm, 30 seconds). Then, it was temporally dried (80° C., 2 minutes), further, it was dried with the above-described wavelength controlled IR (infrared ray) under the output condition of the substrate temperature of less than 80° C. for 5 minutes.

After drying, the resin substrate was gradually cooled to 25° C. A reforming treatment was done to the coated surface by irradiating with vacuum ultra violet light in a vacuum UV applicator. As a light source for the vacuum UV applicator, it was employed a Xe excimer lamp having a double-tube structure and irradiating vacuum ultra violet light of 222 nm.
<Reforming Treatment Device>
Excimer applicator made by M.D.COM. Inc. (MODEL: MEIRH-M-1-200-222-H-KM-G, wavelength: 222 nm, gas sealed in the lamp: KrCl)
<Conditions on Reforming Treatment>
Intensity of excimer light: 2 J/cm$^2$ (222 nm)
Heating temperature of the stage: 60° C.
Oxygen level in the applicator: Atmosphere
The curing reaction was promoted under the above-described conditions to obtain a smoothing layer having a thickness of 0.7 μm. Thus an internal light extracting layer was produced.

A refractive index of the sole smoothing layer was 1.85.

The above-prepared internal light extracting layer had a transmittance T of 67%, and a haze value (Hz) of 50%.

A refractive index of the internal light extracting layer at a wavelength of 550 nm was measured by using Elipsometer made by Sopra Co. based on D542. It was 1.85.

Production of Organic Light-Emitting Element No. 5

Inventive Example

The internal light extracting layer as described in the following item (2) was formed on a PET substrate formed with a gas barrier layer used for the organic light-emitting element No. 1. In the same manner as preparation of the organic light-emitting element No. 1, there were formed a transparent electrode, an organic light-emitting layer, and an opposite electrode on the formed internal light extracting layer. Then, it was sealed to prepare an organic light-emitting element No. 5 (Inventive example).
(2) Formation of Internal Light Extracting Layer (Light Scattering Layer and Smoothing Layer)
(2.1) Formation of Light Scattering Layer A light scattering layer was formed in the same manner as preparation of the organic light-emitting element No. 4.
(2.2) Formation of Smoothing Layer As a smoothing layer, it was changed to a four laminated body produced by coating the following coating liquid. On a light scattering layer formed with a film of 600 nm, it was applied a coating solution containing an inorganic precursor compound described below with a depressurized extrusion coater such that the thickness of the dried layer was 150 nm. A first smoothing layer was thus formed.

The coating solution containing an inorganic precursor compound was prepared with a mixture of a solution of 20 mass % catalyst-free perhydropolysilazane (AQUAMICA NN120-20 made by AZ Electronic Materials plc) in dibutyl ether and a 20 mass % perhydropolysilazane (AQUAMICA NAX120-20 made by AZ Electronic Materials plc) containing 5 mass % (solid content) amine catalyst in dibutyl ether. The mixture was adjusted such that the content of the amine catalyst was 1 mass % of the solid content. Then, a nano $TiO_2$ particle dispersion having an average particle size of 0.02 μm (HDT-760T, made by Tayca Co.) in toluene (50%) and polysilazane were mixed with a volume ratio of 2:1, and the mixture was diluted with a mixed solvent of toluene and dibutyl ether to obtain a 5 mass % coating liquid.

After coating, it was dried with the wavelength controlled IR under the conditions of: substrate temperature of 80° C., drying time of 5 minutes and dew point of 5° C. in a dry atmosphere.

After drying, the resin substrate was gradually cooled to 25° C. A reforming treatment was done to the coated surface by irradiating with vacuum ultra violet light in a vacuum UV applicator. As a light source for the vacuum UV applicator, it was employed a Xe excimer lamp having a double-tube structure and irradiating vacuum ultra violet light of 172 nm.
<Reforming Treatment Device>
Excimer applicator made by M.D.COM. Inc. (MODEL: MECL-M-1-200, wavelength: 172 nm, gas sealed in the lamp: Xe)
<Conditions on Reforming Treatment>
Intensity of excimer light: 3 J/cm$^2$ (172 nm)
Heating temperature of the stage: 100° C.
Oxygen level in the applicator: 1,000 ppm
After the reforming treatment, the second, the third, and the fourth layers were laminated in the same manner. The laminated layers were dried at 80° C. dry condition left for 1 month to advance the polysilazane forming reaction.

Production of Organic Light-Emitting Element No. 6

Inventive Example

After reforming treatment of the organic light-emitting element No. 5, it was further left at 80° C. dry atmosphere for 1 day.

Production of Organic Light-Emitting Element No. 7

Comparative Example

After reforming treatment of the organic light-emitting element No. 5, it was further left at 80° C. dry atmosphere for 1 month, and the reaction of polysilazane was promoted.

Production of Organic Light-Emitting Element No. 8

Comparative Example

An organic light-emitting element No. 8 was produced in the same manner as production of the organic light-emitting element No. 2, except that the electrode of was changed to the following ITO electrode and the smoothing layer was not placed.
(3) Preparation of Transparent Electrode (ITO Electrode)

On the above-formed internal light extracting layer was vapor deposited to form an ITO (Indium tin oxide) film having a thickness of 150 nm with a commercially available sputtering apparatus under a reduced pressure of $4 \times 10^{-4}$ Pa in the vacuum chamber with DC-500 W for 130 seconds.

Production of Organic Light-Emitting Element No. 9

Inventive Example

An organic light-emitting element No. 9 was produced in the same manner as production of the organic light-emitting element No. 4, except that the electrode was changed to the above-described ITO electrode.

Production of Organic Light-Emitting Element No. 10

Inventive Example

An organic light-emitting element No. 10 was produced in the same manner as production of the organic light-emitting element No. 4, except that the PET substrate support was changed to a polyethylene naphthalate film (Neptex PEN Q83 (extremely low thermal contraction type) made by Teijin-Dupont Film Co.).

Production of Organic Light-Emitting Element No. 11

Inventive Example

An organic light-emitting element No. 11 was produced in the same manner as production of the organic light-emitting element No. 5, except that the PET substrate support was changed to a polyethylene naphthalate film (Neptex PEN Q83 (extremely low thermal contraction type) made by Teijin-Dupont Film Co.).

Production of Organic Light-Emitting Element No. 12

Comparative Example

An organic light-emitting element No. 12 was produced in the same manner as production of the organic light-emitting element No. 4, except that the support was changed to a PET film substrate without forming a gas barrier layer.

Production of Organic Light-Emitting Element No. 13

Inventive Example

An organic light-emitting element No. 13 was produced in the same manner as production of the organic light-emitting element No. 4, except that the light scattering layer was changed to the following light scattering layer.
(2) Formation of Internal Light Extracting Layer (Light Scattering Layer)
(2.1) Formation of Light Scattering Layer A coating solution containing an inorganic precursor compound described below was applied with a depressurized extrusion coater such that the thickness of the dried layer was 150 nm. A first light scattering layer was thus formed.

The coating solution containing an inorganic precursor compound was prepared with a mixture of a solution of 20 mass % catalyst-free perhydropolysilazane (AQUAMICA NN120-20 made by AZ Electronic Materials plc) in dibutyl ether and a 20 mass % perhydropolysilazane (AQUAMICA NAX120-20 made by AZ Electronic Materials plc) containing 5 mass % (solid content) amine catalyst in dibutyl ether. The mixture was adjusted such that the content of the amine catalyst was 1 mass % of the solid content. Then, $TiO_2$ particles having an average particle size of 0.25 µm and a refractive index of 2.4 (JR600A, made by Tayca Co.) were added to achieve a solid content of 50 volume %/50 volume %, and the mixture was diluted with a mixed solvent of toluene and dibutyl ether to obtain a 5 mass % coating liquid. It was formulated a coating solution in an amount of 10 ml.

Specifically, the $TiO_2$ particles and the solvent were mixed. While cooling the mixture to the normal temperature, it was prepared a $TiO_2$ dispersion liquid by using an ultrasonic dispersion apparatus (UH-50, made by SMT Co.) with a standard condition of using a micro tip step (MS-3, 3 mmΦ, made by SMT Co.) for 10 minutes Subsequently, while stirring the $TiO_2$ dispersion liquid at 100 rpm, the resin was added by bits. After completing the addition, the stirring rate was raised to 500 rpm, and mixed for 10 minute to obtain a light scattering layer coating liquid.

Afterward, the mixture was filtered with a hydrophobic PVDF filter (0.45 µm) (made by Whatman Co.) to obtain a targeted light scattering layer coating liquid.

The prepared coating liquid was applied with a depressurized extrusion method to obtain a first light scatting layer so that is has a thickness of 150 nm. Then, it was temporally dried (80° C., 2 minutes), further, it was dried with the following wavelength controlled IR (infrared ray) under the output condition of the substrate temperature of less than 80° C. for 5 minutes.

Subsequently, after drying, the resin substrate was gradually cooled to 25° C. A reforming treatment was done to the coated surface by irradiating with vacuum ultra violet light in a vacuum UV applicator. As a light source for the vacuum UV applicator, it was employed a Xe excimer lamp having a double-tube structure.

<Reforming Treatment Device>
Excimer applicator made by M.D.COM. Inc. (MODEL: MECL-M-1-200, wavelength: 172 nm, gas sealed in the lamp: Xe)
<Conditions on Reforming Treatment>
Intensity of excimer light: 3 J/cm$^2$ (172 nm)
Heating temperature of the stage: 100° C.
Oxygen level in the applicator: 1,000 ppm
After the reforming treatment, a light scattering layer was further laminated as a second layer. The light scattering layer had an elastic modulus of 20 GPa.
<<Measurement of Surface Elastic Modulus of Transparent Substrate and Internal Light Extracting Layer>>
The surface elastic modulus of the transparent substrate formed with gas barrier film as described above and the surface elastic modulus the internal light extracting layer were respectively measured using the aforesaid TriboScope (made by HYSITRON Co.) under the measuring conditions of nano-indentation method.
Here, a "surface" indicates a gas barrier side in case of a transparent substrate formed with gas barrier film, and it indicates a light scattering side or a smoothing side in case of an internal light extracting layer.
<Evaluation of Organic Light-Emitting Element Sample>
(1) Measurement of Emission Efficiency
The respective samples were lighted at room temperature (within the range of about 23 to 25° C.) at a constant current density of 2.5 mA/cm$^2$. The luminance of the sample was measured with a spectral radiance meter CS-2000 (made by KONICA MINOLTA Inc.) to determine the emission efficiency (outcoupling efficiency) at the current value.

In addition, the emission efficiency was expressed as a relative value to the emission efficiency of Sample 1 of the organic light-emitting element being 100 (reference: an organic light-emitting element without an internal light extracting layer).
(2) Flexible Property
The respective sample was wound around a roll of 150 mmΦ under the condition that the PET sealing surface with deposited aluminum was kept outside, then the wound sample was rewound to be flat. This operation was repeated 100 times.
After repeating 100 times of the above-described operation, the organic light-emitting element was observed with visual inspection. The sample observed no abnormality was confirmed its emission efficiency under the same conditions used for the measurement of emission efficiency. The evaluation was done by the following criteria.
◯: No degradation was detected by visual inspection, the emission efficiency was not degraded, and the emission efficiency remained with a variation within ±10%.
Δ: No degradation was detected by visual inspection, however, the emission efficiency was degraded, and the emission efficiency was varied with a variation of more than ±10%.
X: A partial degradation was detected by visual inspection, the emission efficiency was remarkably degraded, and there was observed non-light emitting portion in 50% or more area.
XX: Distinct degradation was detected by visual inspection.
The obtained evaluation results are shown in Table 1.

TABLE 1

| Organic light-emitting element No. | Transparent substrate (Gas barrier film) | Internal light extracting layer | Drying/Curing | Tranceparent electrode | Elastic modulus | | | | Evaluation | | |
|---|---|---|---|---|---|---|---|---|---|---|---|
| | | | | | $EM_I$ (GPa) | *1 (GPa) | $EM_s$ (GPa) | D(%) = $(EM_I/EM_s)$ × 100(%) | Emission efficiency (relative value) | Flexibility | Remarks |
| 1 | PET | Not present | — | Ag | — | — | 34 | — | 100 | ◯ | Comparative example |
| 2 | PET | Present | IR | Ag | 5 | 0.5 | 34 | 15 | 130 | x | Comparative example |
| 3 | PET | Present | IR/Excimer UV | Ag | 60 | 0.5 | 34 | 176 | 110 | x | Comparative example |
| 4 | PET | Present | IR/Excimer UV | Ag | 28 | 7.5 | 34 | 82 | 130 | ◯ | Inventive example |
| 5 | PET | Present | IR/Excimer UV | Ag | 32 | 7.5 | 34 | 94 | 130 | ◯ | Inventive example |
| 6 | PET | Present | IR/Excimer UV | Ag | 43 | 7.5 | 34 | 126 | 130 | ◯ | Inventive example |
| 7 | PET | Present | IR/Excimer UV | Ag | 60 | 7.5 | 34 | 176 | 130 | x | Comparative example |
| 8 | PET | Only light scattering layer | IR/Excimer UV | ITO | 2 | 7.5 | 34 | 5 | 130 | x x | Comparative example |
| 9 | PET | Present | IR/Excimer UV | ITO | 25 | 7.5 | 34 | 73 | 140 | Δ | Inventive example |
| 10 | PEN | Present | IR/Excimer UV | Ag | 28 | 7.5 | 30 | 93 | 130 | ◯ | Inventive example |
| 11 | PEN | Present | IR/Excimer UV | Ag | 32 | 7.5 | 30 | 107 | 130 | ◯ | Inventive example |
| 12 | PET (without gas barrier layer) | Present | IR/Excimer UV | Ag | 28 | 7.5 | 3 | 933 | 110 | x x | Comparative example |
| 13 | PET | Present | IR/Excimer UV | Ag | 28 | 20.0 | 34 | 82 | 130 | Δ | Inventive example |

*1: Elastic modulus of light scattering layer

From the results in Table 1, it was found that the inventive samples of the organic light-emitting element Nos. 4, 5, 9 to 11 and 13 each had a surface elastic modulus ratio D of the flexible transparent substrate and the internal light extracting layer in the range of 100±30%. And, these samples showed high emission efficiency and no breakage, float or peeling-off the transparent electrode, and it was found that they were a flexible organic light-emitting element. Further, the sample Nos. 4 and 5 using silver (Ag) as a transparent electrode, exhibited better flexible property compared with the sample No. 9 using ITO.

INDUSTRIAL APPLICATIONS

An organic electroluminescent element of the present invention has an internal light extracting layer on an organic light-emitting element containing a flexible transparent substrate. It exhibits high light-emitting efficiency by light extraction and prevents breakage, partial or complete separation (floating or peeling off) of the electrode when the organic light-emitting element is repeatedly bent. It is appropriately used for a flexible display device and illuminating device

DESCRIPTION OF SYMBOLS

N1: Initial surface of sample when an indenter does not contact thereto
N2: Profile of sample surface when weight is added via an indenter
N3: Profile of sample surface after removal of an indenter
W: Weight
1: Transparent metal electrode
1a: Undercoat layer
1b: Electrode layer
2: Internal light extracting layer
2a: Light scattering layer
2b: Smoothing layer
3: Organic light-emitting layer
3a: Hole injection layer
3b: Hole transport layer
3c: Light-emitting layer
3d: Electron transport layer
3e: Electron injection layer
5a: Opposite electrode
10: Organic light-emitting element
13: Transparent substrate
13a: Outcoupling surface
15: Auxiliary electrode
16: Extraction electrode
17: Sealing material
19: Adhesive
20: Wavelength controlled infrared heater
22: Filament
24: Protective tube
26 and 28: Quartz filter
30: Hollow portion
32: Reflective plate
40: Cooling mechanism
50: Controller
h: Emitted light
100: Organic light-emitting element
101: Metal electrode
102: Organic light-emitting layer
103: Transparent electrode
104: Transparent substrate
110a to 110e: Light
200: Manufacturing Apparatus
202: Feed roll
204: Take-up roll
210: Transfer unit
212: Transfer roller
220: Inkjet coating unit
222: Transfer roller
224: Platen
226: Inkjet head
230: IR drying unit
232: Transfer roller
240: Photo-curing unit
242: Transfer roller
244: UV applicator
250: Inkjet coating unit
252: Transfer roller
254: Platen
256: Inkjet head
260: IR drying unit
262: Transfer roller
264: Wavelength controlled infrared heater
270: Photo-curing unit
272: Transfer roller
274: UV applicator
280: Transfer unit
282: Transfer roller

The invention claimed is:

1. An organic light-emitting element comprising a flexible transparent substrate having thereon an internal light extracting layer, a transparent electrode, and an organic light-emitting layer in that order,
wherein the flexible transparent substrate contains a film substrate and at least one gas barrier layer in that order, and
wherein a ratio D of an elastic modulus ($EM_f$) of a surface of the internal light extracting layer to an elastic modulus ($EM_s$) of a surface of the transparent electrode side of the flexible transparent substrate is in the range of 100±30%,
the ratio D being defined by Scheme 1, $$D\ (\%) = (EM_f/EM_s) \times 100\ (\%). \qquad \text{Scheme 1:}$$

2. The organic light-emitting element of claim 1,
wherein the internal light extracting layer has:
a refractive index in the range of 1.7 to 2.5 when measured at a wavelength of 550 nm;
an average transmittance of 50% or more in the wavelength range of 450 nm to 700 nm; and
a haze value of 30% or more.

3. The organic light-emitting element of claim 1, wherein the at least one gas barrier layer contains an inorganic precursor compound.

4. An organic light-emitting element comprising a flexible transparent substrate having thereon an internal light extracting layer, a transparent electrode, and an organic light-emitting layer in that order,
wherein the flexible transparent substrate contains a film substrate and at least one gas barrier layer in that order, and the internal light extracting layer contains a light scattering layer and a smoothing layer, and
wherein a ratio D of an elastic modulus ($EM_f$) of a surface of the internal light extracting layer to an elastic modulus ($EM_s$) of a surface of the transparent electrode side of the flexible transparent substrate is in the range of 100±30%,
the ratio D being defined by Scheme 1, $$D\ (\%) = (EM_f/EM_s) \times 100\ (\%). \qquad \text{Scheme 1:}$$

5. The organic light-emitting element of claim 4,
wherein the light scattering layer contains light scattering particles;
an average particle size of the light scattering particles is in the range of 0.2 to 1 μm; and
the light scattering layer has a refractive index in the range of 1.7 to 3.0 when measured at a wavelength of 550 nm.

6. The organic light-emitting element of claim 4,
wherein the internal light extracting layer has:
a refractive index in the range of 1.7 to 2.5 when measured at a wavelength of 550 nm;
an average transmittance of 50% or more in the wavelength range of 450 nm to 700 nm; and
a haze value of 30% or more.

7. The organic light-emitting element of claim 4, wherein the at least one gas barrier layer contains an inorganic precursor compound.

8. The organic light-emitting element of claim 7, wherein the inorganic precursor compound is at least one of polysiloxane, polysilazane, or polysiloxazane.

9. The organic light-emitting element of claim 4, wherein the smoothing layer includes a high-refractive index layer with a refractive index of 1.7 to 2.5 measured at a wavelength of 550 nm.

10. The organic light-emitting element of claim 9, wherein the smoothing layer has an average surface roughness Ra of less than 100 nm.

11. The organic light-emitting element of claim 9, wherein the inorganic precursor compound is at least one of polysiloxane, polysilazane, or polysiloxazane.

\* \* \* \* \*